United States Patent [19]

Welch

[11] Patent Number: 4,558,302
[45] Date of Patent: Dec. 10, 1985

[54] HIGH SPEED DATA COMPRESSION AND DECOMPRESSION APPARATUS AND METHOD

[75] Inventor: Terry A. Welch, Concord, Mass.

[73] Assignee: Sperry Corporation, New York, N.Y.

[21] Appl. No.: 505,638

[22] Filed: Jun. 20, 1983

[51] Int. Cl.[4] ................................................ G06F 5/00
[52] U.S. Cl. ................................ 340/347 DD; 235/310
[58] Field of Search ................ 340/347 DD; 235/310, 235/311; 364/200, 900

[56] References Cited

U.S. PATENT DOCUMENTS 4,464,650  8/1984  Eastman ...................... 340/347 DD

OTHER PUBLICATIONS

Ziv, "IEEE Transactions on Information Theory", IT-24-5, Sep. 1977, pp. 530-537.
Ziv, "IEEE Transactions on Information Theory", IT-23-3, May 1977, pp. 337-343.

Primary Examiner—Charles D. Miller
Attorney, Agent, or Firm—Howard P. Terry; Albert B. Cooper

[57] ABSTRACT

A data compressor compresses an input stream of data character signals by storing in a string table strings of data character signals encountered in the input stream. The compressor searches the input stream to determine the longest match to a stored string. Each stored string comprises a prefix string and an extension character where the extension character is the last character in the string and the prefix string comprises all but the extension character. Each string has a code signal associated therewith and a string is stored in the string table by, at least implicitly, storing the code signal for the string, the code signal for the string prefix and the extension character. When the longest match between the input data character stream and the stored strings is determined, the code signal for the longest match is transmitted as the compressed code signal for the encountered string of characters and an extension string is stored in the string table. The prefix of the extended string is the longest match and the extension character of the extended string is the next input data character signal following the longest match. Searching through the string table and entering extended strings therein is effected by a limited search hashing procedure. Decompression is effected by a decompressor that receives the compressed code signals and generates a string table similar to that constructed by the compressor to effect lookup of received code signals so as to recover the data character signals comprising a stored string. The decompressor string table is updated by storing a string having a prefix in accordance with a prior received code signal and an extension character in accordance with the first character of the currently recovered string.

181 Claims, 9 Drawing Figures

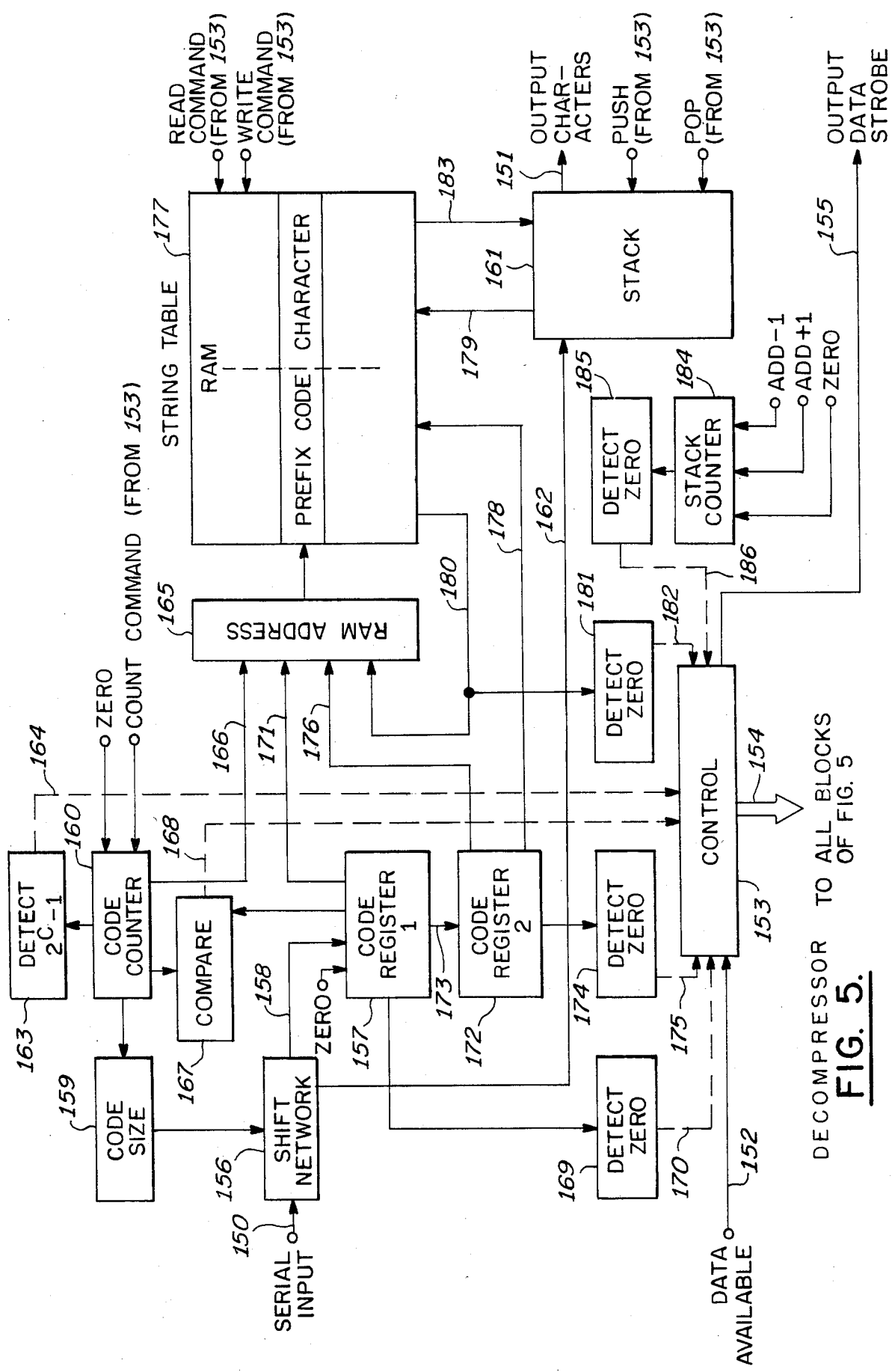

```
 1.         SUBROUTINE COMP (IBUFA, NA, IBUFB, NB)
 2.     C
 3.     C PURPOSE
 4.     C       CONVERT CONSECUTIVE 9 BIT STRINGS TO CONSECUTIVE 12 BIT STRINGS
 5.     C USAGE
 6.     C       CALL COMP (IBUFA, NA, IBUFB, NB)
 7.     C                                    INPUT
 8.     C       IBUFA  = INPUT BUFFER CONTAINING CONSECUTIVE 9 BIT STRINGS.
 9.     C       NA     = NO. OF CONSECUTIVE 9 BIT STRINGS STARTING AT IBUFA.
10.     C                                    OUTPUT
11.     C       IBUFB  = OUTPUT BUFFER CONTAINING CONSECUTIVE 12 BIT STRINGS.
12.     C       NB     = NO. OF CONSECUTIVE 12 BIT STRINGS STARTING AT IBUFB.
13.     C
14.         DIMENSION IBUFA(1), ITABLE(4096), IBUFB(1)
15.         DATA IFILL /512/
16.         NCHA=1                      @ INPUT CHARACTER COUNT
17.         NB=1                        @ OUTPUT INDEX
18.         DO 10 I=1, 4096
19.      10 ITABLE(I)=IFILL
20.         NODENO=IBITSG (IBUFA(1), 9, 1)
21.     100 NCHA=NCHA+1
22.         IF (NCHA .GT. NA) GO TO 400
23.         NOWCHR=IBITSG (IBUFA(1), 9, NCHA)
24.         LOC=XOR((511-NOWCHR)*8, NODENO)+1
25.         N=1
26.     120 IF (LOC .LE. 513) GO TO 180
27.         IF (ITABLE(LOC) .NE. NODENO) GO TO 130
28.         NODENO=LOC-1
29.         GO TO 100
30.     130 IF (ITABLE(LOC) .EQ. IFILL) GO TO 200
31.     180 N=N+1
32.         IF (N .GT. 7) GO TO 300
33.         LOC=MOD(XOR(2*NODENO, 1365)+LOC-1, 4096)+1
34.         GO TO 120
35.     200 ITABLE(LOC)=NODENO
36.     300 CALL IBITSP (IBUFB(1), 12, NB, NODENO)
37.         NODENO=NOWCHR
38.         NB=NB+1
39.         GO TO 100
40.     400 CALL IBITSP (IBUFB(1), 12, NB, NODENO)
41.         RETURN
42.         END
```

FIG.6.

```
1.          SUBROUTINE DECOMP (IBUFB, NB, IBUFA, NA)
2.    C
3.    C        CONVERT CONSECUTIVE 12 BIT STRINGS TO OUTPUT BIT STRINGS
4.    C        IBUFB  = INPUT BUFFER CONTAINING CONSECUTIVE 12 BIT STRINGS.
5.    C        NB     = NO. OF CONSECUTIVE 12 BIT STRINGS STARTING AT IBUFB.
6.    C        IBUFA  = OUTPUT BUFFER CONTAINING CONSECUTIVE NBITSA BIT
7.    C                 STRINGS.
8.    C        NA     = NO. OF CONSECUTIVE NBITSA BIT STRINGS STARTING AT
9.    C                 IBUFA.
10.         DIMENSION IBUFB(1), ITABLE(4096), IBUFA(1)
11.         DATA NBITSA /9/
12.         NCHB=1
13.         NA=1
14.         DO 10 I=1, 4096
15.     10  ITABLE(I)=0
16.         NOCODE=IBITSG(IBUFB(1), 12, NCHB)
17.         ICHAR=NOCODE
18.         CALL IBITSP (IBUFA, NBITSA, NA, ICHAR)
19.         NODOLD=NOCODE
20.         LEVOLD=1
21.    100  NCHB=NCHB+1
22.         IF (NCHB .GT. NB) GO TO 510
23.         NODENO=IBITSG(IBUFB(1), 12, NCHB)
24.         NOCODE=NODENO
25.         IF (NODENO .GF. 512) GO TO 120
26.         LEVEL=0
27.         GO TO 210
28.    120  IF (ITABLE(NODENO+1) .NE. 0) GO TO 130
29.         LEVEL=LEVOLD
30.         CALL IBITSP (IBUFA, NBITSA, NA+LEVEL+1, ICHAR)
31.         NODENO=NODOLD
32.         GO TO 200
33.    130  LEVEL=BITS(ITABLE(NODENO+1), 13, 12)
34.    200  IF (NODENO .LE. 512) GO TO 210
35.         INDEX=BITS(ITABLE(NODENO+1), 13, 12)
36.         ICHAR=BITS(ITABLE(NODENO+1), 25, NBITSA)
37.         CALL IBITSP (IBUFA, NBITSA, INDEX+NA+1, ICHAR)
38.         NODENO=BITS(ITABLE(NODENO+1), 1, 12)
39.         GO TO 200
40.    210  ICHAR=NODENO
41.         CALL IBITSP (IBUFA, NBITSA, NA+1, ICHAR)
42.         N=1
43.         LOC=XOR((511-ICHAR)*8, NODOLD)+1
44.    215  IF (LOC .LE. 513) GO TO 218
45.         IF (ITABLE(LOC) .EQ. 0) GO TO 220
46.    218  N=N+1
47.         IF (N .GT. 7) GO TO 225
48.         LOC=MOD(XOR(2*NODOLD, 1365)+LOC-1, 4096)+1
49.         GO TO 215
50.    220  BITS(ITABLE(LOC), 1, 12)=NODOLD
51.         BITS(ITABLE(LOC), 25, NBITSA)=ICHAR
52.         BITS(ITABLE(LOC), 13, 12)=LEVOLD
53.    225  NODOLD=NOCODE
54.         LEVOLD=LEVEL+1
55.         NA=NA+LEVEL+1
56.         GO TO 100
57.    510  RETURN
58.         END
```

FIG. 7.

```
1              FUNCTION IBITSG (IBUF, NPERBY, NTHBY)
2       C
3       C PURPOSE
4       C       RETRIEVE A BYTE FROM A SEQUENCE OF BYTES OF THE SAME LENGTH
5       C USAGE
6       C          IBYTE = IBITSG (IBUF, NPERBY, NTHBY)
7       C                                INPUT
8       C          IBUF    = BUFFER CONTAINING CONSECUTIVE BYTES OF NPERBY BITS
9       C                    EACH.
10      C          NPERBY  = NO. OF BITS PER BYTE (1-36).
11      C          NTHBY   = INDEX OF BYTE POSITION WHERE BYTE IS TO BE RETRIEVED
12      C                    FROM.  THE FIRST BYTE POSITION IS 1.
13      C                                OUTPUT
14      C          IBYTE   = WORD CONTAINING THE BYTE RETRIEVED IN THE LOW-ORDER
15      C                    NPERBY BITS.
16      C REMARKS
17      C       USE SUBROUTINE IBITSP FOR STORAGE.
18      C METHOD
19      C       SEE CODE.
20      C
21              DIMENSION IBUF(1)
22              DATA NPERWD /36/
23              NBIT1=(NTHBY-1)*NPERBY+1
24              NWBASE=(NBIT1-1)/NPERWD
25              NBITA=NBIT1-NWBASE*NPERWD
26              NBITB=NBITA+NPERBY-1
27              IF (NBITB .GT. NPERWD) GO TO 10
28              IBYTE=BITS(IBUF(NWBASE+1), NBITA, NPERBY)
29              GO TO 20
30           10 NMOVE2=NBITB-NPERWD
31              IBYTE=BITS(IBUF(NWBASE+2), 1, NMOVE2)
32              NMOVE1=NPERBY-NMOVE2
33              BITS (IBYTE, NPERWD+1-NPERBY, NMOVE1) =
34             *  BITS (IBUF(NWBASE+1), NBITA, NMOVE1)
35           20 IBITSG=IBYTE
36              RETURN
37              END
```

FIG.8.

```
1           SUBROUTINE IBITSP (IBUF, NPERBY, NTHBY, IBYTE)
2      C
3      C PURPOSE
4      C       STORE A BYTE IN A SEQUENCE OF BYTES OF THE SAME LENGTH
5      C USAGE
6      C       CALL IBITSP (IBUF, NPERBY, NTHBY, IBYTE)
7      C                                 INPUT
8      C       IBUF    = BUFFER CONTAINING CONSECUTIVE BYTES OF NPERBY BITS
9      C                 EACH.
10     C       NPERBY  = NO. OF BITS PER BYTE (1-36).
11     C       NTHBY   = INDEX OF BYTE POSITION IN IBUF WHERE BYTE IS TO BE
12     C                 STORED.  THE FIRST BYTE POSITION IS 1.
13     C       IBYTE   = WORD CONTAINING THE BYTE TO BE STORED IN THE LOW-ORDER
14     C                 NPERBY BITS.
15     C                                 OUTPUT
16     C       IBUF    = UPDATED BUFFER WITH THE LOW-ORDER NPERBY BITS OF IBYTE
17     C                 STORED IN THE NTHBY BYTE POSITION.
18     C REMARKS
19     C       USE FUNCTION IBITSG FOR RETRIEVAL.
20     C METHOD
21     C       SEE CODE.
22     C
23           DIMENSION IBUF(1)
24           DATA NPERWD /36/
25           NBIT1=(NTHBY-1)*NPERBY+1
26           NWBASE=(NBIT1-1)/NPERWD
27           NBITA=NBIT1-NWBASE*NPERWD
28           NBITB=NBITA+NPERBY-1
29           IF (NBITB .GT. NPERWD) GO TO 10
30           BITS(IBUF(NWBASE+1), NBITA, NPERBY)=IBYTE
31           RETURN
32       10  NMOVE2=NBITB-NPERWD
33           BITS(IBUF(NWBASE+2), 1, NMOVE2)=BITS(IBYTE, NPERWD+1-NMOVE2,
34          * NMOVE2)
35           NMOVE1=NPERBY-NMOVE2
36           BITS(IBUF(NWBASE+1), NBITA, NMOVE1) =
37          * BITS (IBYTE, NPERWD+1-NPERBY, NMOVE1)
38           RETURN
39           END
```

FIG.9.

HIGH SPEED DATA COMPRESSION AND DECOMPRESSION APPARATUS AND METHOD

BACKGROUND OF THE INVENTION

1. Field of the Invention

The invention relates to the field of data compression and decompression (recovery) of the compressed data.

2. Description of the Prior Art

Data compression systems are known in the prior art that encode a stream of digital data signals into compressed digital data signals and decode the compressed digital data signals back into the original data signals. Data compression refers to any process that converts data in a given format into an alternative format having fewer bits than the original. The objective of data compression systems is to effect a savings in the amount of storage required to hold or the amount of time required to transmit a given body of digital information. The compression ratio is defined as the ratio of the length of the encoded output data to the length of the original input data. The smaller the compression ratio, the greater will be the savings in storage or time. By decreasing the required memory for data storage or the required time for data transmission, compression results in a monetary savings. If physical devices such as magnetic disks or magnetic tape are utilized to store the data files, then a smaller space is required on the device for storing the compressed data thereby utilizing fewer disks or tapes. If telephone lines or satellite links are utilized for transitting digital information, then lower costs result when the data is compressed before transmission. Data compression devices are particularly effective if the original data contains redundancy such as having symbols or strings of symbols appear with high frequency. A data compression device transforms an input block of data into a more concise form and thereafter translates or decompresses the concise form back into the original data in its original format.

For example, it may be desired to transmit the contents of a daily newspaper via satellite link to a remote location for printing thereat. Appropriate sensors may convert the contents of the newspaper into a data stream of serially occurring characters for transmission via the communication link. If the millions of symbols comprising the contents of the newspaper were compressed before transmission and reconstituted at the receiver, a significant amount of transmission time would be saved.

As a further example, when an extensive data base such as an airline reservation data base or a banking system data base is stored for archival purposes, a significant amount of storage space would be saved if the totality of characters comprising the data base were compressed prior to storage and reexpanded from the stored compressed files for later use.

To be of practical and general utility, a digital data compression system should satisfy certain criteria. The system should provide high performance with respect to the data rates provided by and accepted by the equipment with which the data compression and decompression systems are interfacing. The rate at which data can be compressed is determined by the input data processing rate into the compression system, typically in millions of bytes per second (megabytes/sec). High performance is necessary to maintain the data rates achieved in present day disk, tape and communication systems which rates typically exceed one megabyte/sec. Thus, the data compression and decompression systems must have data bandwidths matching the bandwidths achieved in modern devices. The performance of prior art data compression and decompression systems is typically limited by the speed of the random access memories (RAM), and the like, utilized to store statistical data and guide the compression and decompression processes. High performance for a compression device is characterized by the number of ram cycles (read and write operations) required per input character into the compressor. The fewer the number of memory cycles, the higher the performance. A high performance design can be utilized with economical, slow RAMS for low speed applications such as telephone communications, or with very fast RAMS for magnetic disk transfers.

Another important criterion in the design of a data compression and decompression system is compression effectiveness. Compression effectiveness is characterized by the compression ratio of the system. The compression ratio is the ratio of data storage size in compressed form divided by the size in uncompressed form. In order for data to be compressible, the data must contain redundancy. Compression effectiveness is determined by how effectively the compression procedure matches the forms of redundancy in the input data. In typical computer stored data, e.g. arrays of integers, text or programs and the like, redundancy occurs both in the nonuniform usage of individual symbology, e.g. digits, bytes, or characters, and in frequent recurrence of symbol sequences, such as common words, blank record fields, and the like. An effective data compression system should respond to both types of redundancy.

A further criterion important in the design of data compression and decompression systems is that of adaptability. Many prior art data compression procedures require prior knowledge, or the statistics, of the data being compressed. Some prior art procedures adapt to the statistics of the data as it is received. Adaptability in the prior art processes has required an inordinate degree of complexity. An adaptive compression and decompression system may be utilized over a wide range of information types, which is typically the requirement in general purpose computer facilities. It is desirable that the compression system achieves good compression ratios without prior knowledge of the data statistics. Data compression and decompression procedures currently available are generally not adaptable and so cannot be utilized for general purpose usage.

Another important criteria in the design of data compression and decompression systems is that of reversibility. In order for a data compression system to possess the property of reversibility, it must be possible to reexpand or decompress the compressed data back into its original form without any alteration or loss of information. The decompressed and the original data must be identical and indistinguishable with respect to each other.

General purpose data compression procedures are known in the prior art that either are or may be rendered adaptive, two relevent procedures being the Huffman method and the Tunstall method. The Huffman method is widely known and used, reference thereto being had in an article by D. A. Huffman entitled "A Method for the Construction of Minimum Redundancy Codes", Proceedings IRE, 40, 10, pages 1098-1100 (September, 1952). Further reference to the Huffman procedure may be had in an article by R. Gallagher entitled "Variations on a Theme by Huffman, IEEE Information Theory Transactions, IT-24, No. 6 (November, 1978). Adaptive Huffman coding maps fixed length sequences of symbols into variable length binary words. Adaptive Huffman coding suffers from the limitation that it is not efficacious when redundancy exists in input symbol sequences which are longer than the fixed sequence length the procedure can interpret. In practical implementations of the Huffman procedure, the input sequence lengths rarely exceed 12 bits due to RAM costs and, therefore, the procedure generally does not achieve good compression ratios. Additionally, the adaptive Huffman procedure is complex and often requires an inordinately large number of memory cycles for each input symbol. Thus, the adaptive Huffman procedure tends to be undesirably cumbersome, costly, and slow thereby rendering the process unsuitable for most practical present day installations.

Reference to the Tunstall procedure may be had in the doctoral thesis of B. T. Tunstall, entitled "Synthesis of Noiseless Compression Codes", Georgia Institute of Technology, (September, 1967). The Tunstall procedure maps variable length input system sequences into fixed length binary output words. Although no adaptive version of the Tunstall procedure is described in the prior art, an adaptive version could be derived which, however, would be complex and unsuitable for high performance implementations. Neither the Huffman nor the Tunstall procedure has the ability to encode increasingly longer combinations of source symbols.

A further adaptive data compression and decompression system that overcomes many of the disadvantages of the prior art is that disclosed in co-pending U.S. patent application Ser. No. 291,870 filed Aug. 10, 1981 now U.S. Pat. No. 4,464,650 entitled "Apparatus and Method for Compressing Data and Restoring the Compressed Data" by M. Cohen, W. Eastman, A. Lempel and J. Ziv. The procedure of said Ser. No. 291,870 parses the stream of input data symbols into adaptively growing sequences of symbols. The procedure of said Ser. No. 291,870 suffers from the disadvantages of requiring numerous RAM cycles per input character and utilizing time consuming and complex mathematical procedures such as multiplication and division to effect compression and decompression. These disadvantages tend to render the procedure of said Ser. No. 291,870 unsuitable for numerous economical high performance implementations.

It is appreciated from the foregoing that neither the prior art nor the procedure of said Ser. No. 291,870 provides an adaptive, efficient, compression and decompression system suitable for high performance applications. No known prior design approach is directly suitable for such a device.

SUMMARY OF THE INVENTION

The present invention overcomes the disadvantages of the above described systems by providing an economical, high performance, adaptable and reversible data compression and decompression system and method that achieves good compression ratios. The present invention compresses a stream of data character signals into a compressed stream of code signals by storing strings of data character signals parsed from the input data stream and searching the stream of data character signals by comparing the stream to the stored strings to determine the longest match therewith. The compression apparatus also stores an extended string comprising the longest match from the stream of data character signals extended by the next data character signal following the longest match. When the longest match is extended and stored, a code signal corresponding to the stored extended string is assigned thereto. The compressed stream of code signals is provided from the code signals corresponding to the stored longest matches. A stored string of data characters is comprised of a prefix string and the extension character. A string is stored in terms of the code signal corresponding to its prefix string.

The compressed stream of code signals is decompressed by constructing and storing character strings comprising prefix code signals and extension character signals. The decompression system stores a string in accordance with a received code signal and the extension character which is received as the first character of the next following string.

The strings of data character signals are entered into storage by means of a limited search hashing technique that provides a limited number of hash addresses for each search iteration.

BRIEF DESCRIPTION OF THE DRAWINGS

FIG. 5 is a schematic block diagram of data decompressor in accordance with the invention implemented to decompress the compressed stream of code signals from the compressor of FIG. 4.

FIG. 5 is a listing of a Fortran subroutine for implementing in software a data compressor similar to that of FIG. 2.

FIG. 7 is a listing of a Fortran subroutine for implementing in software a data decompressor similar to that of FIG. 3.

FIG. 8 is a listing in Fortran of a subroutine utilized in the programs of FIGS. 6 and 7.

DESCRIPTION OF THE PREFERRED EMBODIMENTS

Figure 1:
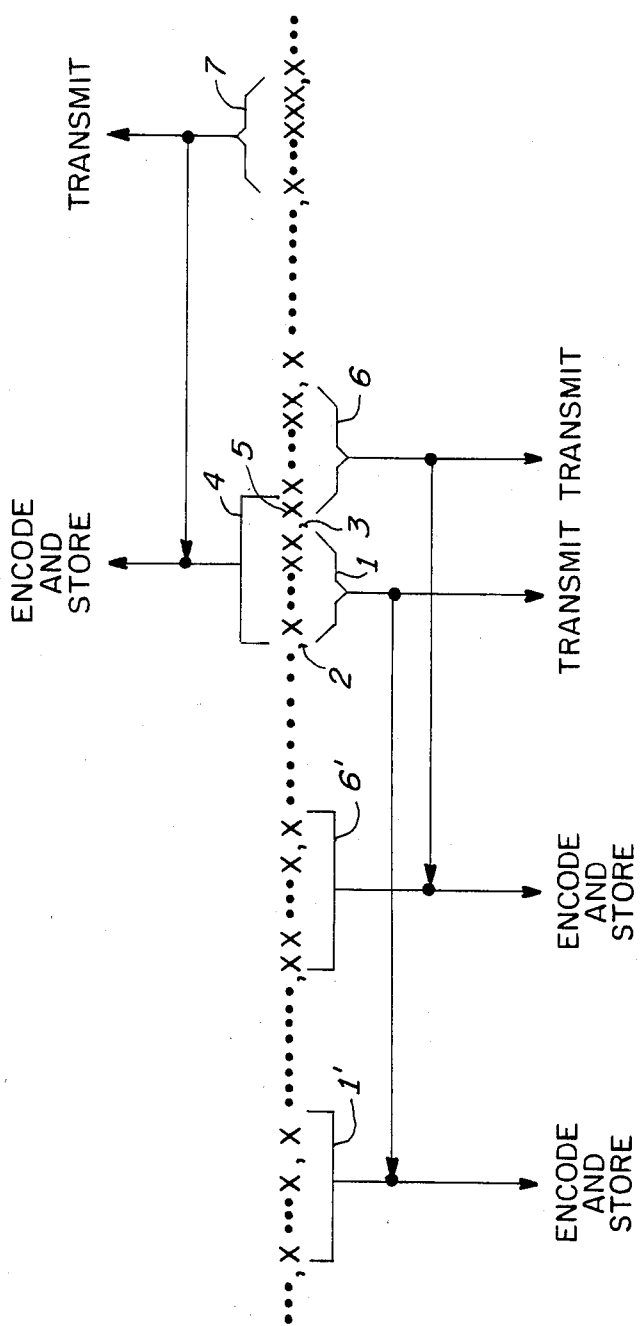
FIG. 1 is a schematic representation of a parsed portion of a stream of data character signals.

The present invention comprises a data compressor for compressing a stream or sequence of digital data character signals and providing a corresponding stream of compressed digital code signals. The invention further includes a decompressor for receiving the compressed code signals and restoring the original digital data. The data to be compressed may comprise, for example, English language textual material, stored computer records and the like. It is appreciated in present day data processing and communication systems that the characters of the alphabets over which compression is to be effected are processed and conveyed as bytes of binary digits in a convenient code such as the ASCII format. For example, input characters may be received in the form of eight-bit bytes over an alphabet of 256 characters. The compressed code signals from the compressor may either be stored in electronic storage files for, for example, archival purposes or may be transmitted to remote locations for decoding thereat. Additionally, an electronic storage file, such as a disk store, may include a compressor in its input electronics and a decompressor in its output electronics whereby all data entering the file is compressed for storage and all data retrieved from the file is decompressed before transmission to the utilization equipment. The prior art compression and decompression systems discussed above do not provide the performance or adaptability to accommodate such usage of compression and decompression. The high performance adaptive systems implemented in accordance with the present invention may be so utilized.

A number of design options are usable in embodiments of the present invention in various combinations in accordance with the data to be compressed and the desired characteristics of the system. Three embodiments of the invention will be described; one embodiment combining the options to provide the highest performance, the second embodiment combining the options to provide the highest compression, and the third embodiment providing a programmed computer version of the highest performance embodiment.

The compressor of the present invention parses the input stream of data characters into strings or segments and transmits a code signal identifying each string. Except for data characters that are encountered for the first time by the compressor, each parsed string comprises the longest match to a previously recognized string. The compressor transmits the code signal corresponding to the recognized string. When a string of characters is parsed from the input data stream, the parsed string is extended by the next occuring character in the input stream to form an extended string which is encoded and stored in the compressor to be utilized for later encodings. Thus the character sequences which are recognized are constantly growing in average length as statistical information is gathered in the course of compressing a block of data. The extension character is utilized as the first character in the next parsing iteration. The parsing is achieved in a single pass through the data, starting from the begining character and separating off one character at a time. Each string therefore, except for single character strings, is stored as a prefix string, which matches a previously stored string and the extension character. Each such string is conveniently stored in terms of the code signal representation of the prefix with an actual or implied representation of the extension character. Parsing may be conceptualized as inserting virtual commas between the characters of the data stream thereby setting off the parsed strings or segments. Therefore, in the present invention the search into the unprocessed data stream for a match involves searching from a comma to one character beyond the next ensuing comma to find the longest match with a previously observed string.

Referring to FIG. 1, a schematic representation of a portion of a stream data characters is illustrated where the "X's" represent arbitrary characters of the alphabet. Commas are illustrated in the data stream only to depict the parsing. A string 1 of the data stream is parsed by virtual commas 2 and 3. The string 1 matches the previous string 1' and the string 1' is the longest extended string preceeding the comma 2 that matches the input data stream following the comma 2. The string 1' had been previously encoded and the code therefore is transmitted by the compressor when encountering the string 1. The compressor then encodes and stores an extended string 4 comprising the prefix string 1 and an extension character 5. The extension character is the next character in the data stream following the prefix 1 irrespective of what character it is. In other words, the extension character 5 may be a character that has been seen previously in the data stream or it may be a character of the alphabet that is encountered for the first time.

The compressor starts the next parsing iteration at the virtual comma 3 starting with the extension character 5 until another longest match is achieved. Thus a string 6 is parsed that matches a previously extended string 6'. Again, as in the previous iteration, the code signal for the string 6' is transmitted and the string 6 extended by the next following character and the extended string encoded and stored. In a subsequent parsing iteration, a string 7 is parsed which matches the encoded and stored string 4. The code signal transmitted in this parsing iteration is that assigned to the extended string 4.

As discussed above, the code signals provided by the compressor may be stored or transmitted for subsequent decompression. The decompressor stores the data in terms of encoded prefix strings and extension characters. Thus, the decompressor constructs an entry in its storage comprising a received code signal and an extension character. For example, with continued reference to FIG. 1, when the decompressor receives the code signal associated with the string 1, the characters comprising the string are reconstructed, in a manner to be described in detail hereinbelow, by reason of the decompressor having previously constructed and stored the string 1'. In the next following iteration, when the decompressor receives the code signal associated with the string 6, the characters comprising the string are retrieved. At this point, the decompressor has received the code signal from the string 1 and has retrieved the extension character 5 and can thus construct and store the string 4 in a manner to be described in detail hereinbelow.

In the present invention, sequences of input bytes are compressed into code signals which may be of fixed or variable length depending upon the embodiment. As discussed above, input byte sequences are assigned code identifiers and whenever a sequence is reencountered in the input data stream, the same identifier is again transmitted. One-byte sequences are assigned codes and whenever a sequence is reencountered, it is extended by one byte and a new code assigned to the extended sequence. Conceptually, the compressor begins each data block with only the null string in the stored set. The compressor enters one-character strings in the set each time a new character is encountered and then utilizes these stored one-character strings to build longer strings. As each string is added to the set, it is assigned a code signal. Each time a character string from the input is found in the set, the next input character is appended to that string and the set searched to determine if the extended string is in the set. If the extended string is not already there, it is entered. Optionally, the string set can be initialized to include all single character strings. This may yield a higher performance implementation, but may lose some compression efficiency. The output code signals from the compressor may be considered as citations pointing to the previous occurance of an identical character sequence.

In the data compression and decompression system of said Ser. No. 291,870 an extension character is appended to each recognized sequence and the extended sequence encoded. The encoded representation of the extended sequence was transmitted by the compressor as its compressed code. The compressor of the present invention, instead, stores the extended sequence and transmits the code for the recognized sequence. The recognized sequence is the prefix of the extended sequence. The stored extended sequence is then utilized for later encoding. This alteration of the procedure of said Ser. No. 291,870 effects a substantial simplification of the data compression and decompression system by eliminating the time consuming and cumbersome mathematical manipulations utilized in said Ser. No. 291,870 and the concomitant hardware such as multiplication and division devices. The alteration, as well as effecting a substantial increase in device performance, also effects an increase in compression efficiency with typically encountered data. This is because in the system of said Ser. No. 291,870, the extension character that is transmitted as part of the compressed code signal contains a number of bits commenserate with all symbols of the alphabet being equally likely. In the present invention, the extension character is transmitted as part of the following compressed string code and, therefore, requires a smaller number of bits in accordance with the compression effected on the strings of characters.

The present invention utilizes a limited search length, calculated address hashing system to enter springs into the string table and to search for strings in the string table. The hashing function utilizes a hash key comprised of a prior code signal and an extension character to provide a set of N hash table addresses where N is typically 1 to 4. The N RAM locations are sequentially searched and if the item is not in the N locations, it is considered not to be in the table. In compression, if a new key to be inserted in the table cannot be accepted in the N assigned locations, it is omitted from the table. This limited search hashing procedure slightly reduces compression efficiency but substantially increases implementation simplicity. Alternative embodiments may be utilized wherein the N hash addresses are searched in parallel in replicated RAMS.

The present invention may be implemented utilizing fixed or variable length compressed code signals. A fixed length code signal embodiment results in implementation simplification with a slight loss in compression efficiency. A fixed length code embodiment tends to reduce RAM space requirements and the code shifting mechanism complexities necessitated by a variable code length implementation. The fixed length code implementation, however, is desirable when effecting a very high performance implementation.

Generally, the present invention effects compression by mapping variable strings of input character signals into output code symbol signals. The compressor stores, in a string table (RAM) a list of strings it recognizes and for each string a corresponding output code signal. The set of strings so stored is constructed so that any sequence of input characters can be parsed into a stored string and hence can be mapped into an output code. Parsing is achieved at any iteration by consuming all consecutive input characters which match the longest string in the string table and transmitting the corresponding output code. The longest match is extended by the next input character, stored in the string table, and assigned a corresponding code.

Thus, the composition of the set of strings in the string table adapts to and is a statement of the current data block statistics. Specifically, each string added to the set is a one-character extension of a string already in the set. A string is added to the set only after it is actually observed in the input data. Therefore, a long string can occur in the set only if it has been often encountered and thus can be expected to recur frequently. The string set is stored as a table, preferably, in a random access memory (RAM). The strings are stored in what might be considered a linked-tree structure. Each string is stored, at least impliedly, with its code symbol, the last character of the string and the code symbol of the string prefix which contains all the string characters but the last. The decompressor in decoding a string utilizes multiple RAM accesses as each character is obtained individually and each prefix code is accessed in sequence.

The data signals are stored in the string table in a manner to facilitate locating the longest match for an input character sequence. As each input character is read, it is appended to a string already recognized (starting with the null string at the beginning of a new sequence), and the new string is tested to determine if it is in the table. If it is located in the table, its code is retrieved and the process is repeated with a new character and the new code. To so access the strings, they are conveniently identified by the tuple "Prefix code, extension character". A limited search hasing system is utilized to effect the search through the string table.

A hashing system usable in implementing the present invention comprises a function hash (code, character)→address 1, address 2, . . .

which generates for a code, character combination a sequence of memory addresses. When inserting a string in the table, the generated RAM addresses are accessed in sequence until an empty site is found, and the item is inserted at that point. When retrieving an item, the same address sequence is accessed until the item is found or an empty site is found, in which case, the item is defined as not existing in the table. At each occupied site, the identifying code, character tuple for that string may be compared to determine if the site occupant is the desired item. For reasons to be described, it is actually only necessary in the present embodiments to compare the identifying code.

In the hash function employed in the present invention, the number of addresses derived and utilized is limited to a small fixed value N, where N is typically where one to four. If an item cannot be inserted in the string table in N accesses, the item is not utilized. If an item to be retrieved from the table is not located in N accesses, it is defined as not being in the table. This limited search aspect results in a small loss of compression efficiency, but a substantial increase in performance. The present invention will be described as effecting compression over an alphabet of B bit bytes. The hash function utilized in implementing the present invention is designed so that the set of addresses associated with any one code, all N addresses for all $2^B$ extension characters, does not contain any address twice. Thus, when an address is accessed for a particular code, character tuple, comparison of the code is sufficient to establish the identity of the occupant of that location. It is not necessary to store the character value in the RAM. RAM space is thus conversed by reason of this aspect of the hash function. Additionally, the hash function is designed so that abnormally heavy usage of consecutive values of codes or characters does not result in overuse of any particular set of addresses. This is achieved by assuring, when possible, that any two code, character tuples having the same first address value will not have the same second address value. It will be appreciated that the several addresses generated by the hash function may be provided in parallel so that duplicate copies of the RAM may be searched concurrently to further enhance performance of the system. Many hash functions that satisfy the above described criteria will perform satisfactorily in embodying the present invention and a particular, suitable hash function will be described hereinbelow. It is appreciated that other hash functions satisfying the above criteria may be routinely derived.

In the embodiments of the invention to be hereinbelow described, the output code signal from the compressor will have a nominal word length of C bits where $2^C$ is less than or equal to the size of the string table. However, when the string table is first being constructed, fewer than C bits are required to select each string from those available during an iteration. Highest compression is achieved if progressively larger output codes are transmitted up to the limit of C bits. This approach utilizes additional output hardware to align the variable codes into fixed byte orientation. The output word length may also vary in accordance with the recognition of new input characters. In one of the embodiments described below, whenever an input character is first encountered, the nullstring code is provided followed by the bit pattern of the character itself. These outputs are therefore somewhat longer than the normal string code. In a manner to be described, this variation in output length is avoided by initializing the string table to contain all single character strings before input data is processed. This approach simplifies the implementation complexity in that it eliminates any bit shifting hardware otherwise required but may reduce compression. Reduction in compression occurs because the codes assigned to unused single characters cannot be profitably utilized, but expand the number of bits required to distinguish all assigned codes. This reduction in compression only occurs during compression of initial strings utilizing variable length codes.

In the embodiments of the invention to be described hereinbelow, the decompression process is implemented with logically the same string table as the compression process but stored somewhat differently. When each code signal is received by the decompressor, it is looked up directly in the string table where it is translated into a prefix string code and an extension character. The prefix code is then looked up and translated, and the process is repeated until the empty string is encountered. This process, however, produces data characters in the reverse order from the sequential order with which that character string was received by the compressor. Two techniques are described hereinbelow for reversing the intra-string character sequence. A LIFO stack (last-in-first-out) is utilized to temporarily hold the characters and as each character is produced by the decompressor, it is pushed onto the stack. At the end of the iteration, the characters are read from the stack in correct order. Alternatively, a string length count is maintained for each code in the string table so that when a character is read out, it can be placed directly in the appropriate position in a random-access output buffer.

Figure 2:
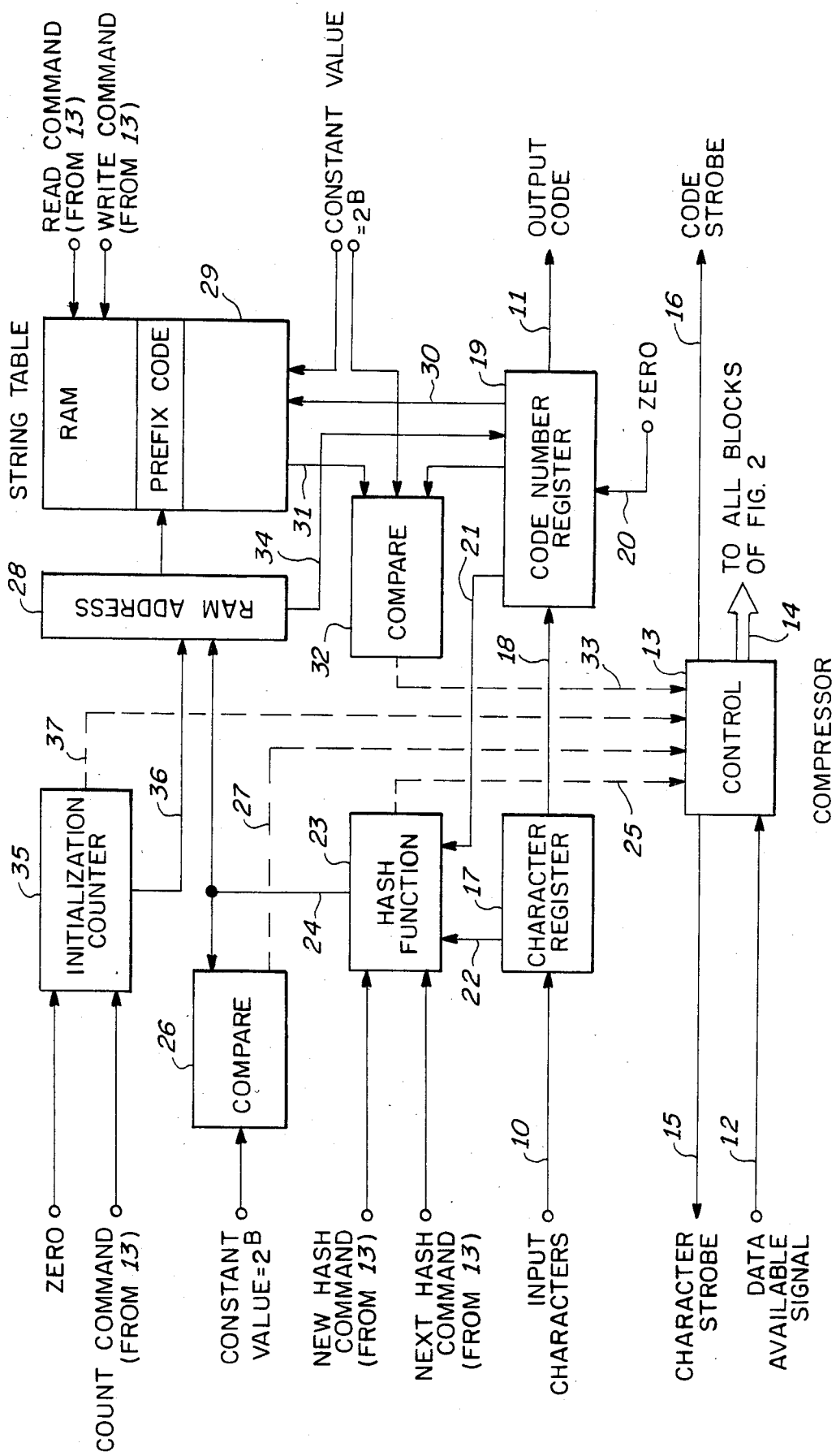
FIG. 2 is a schematic block diagram of a data compressor in accordance with the invention implemented to provide highest performance.
Figure 3:
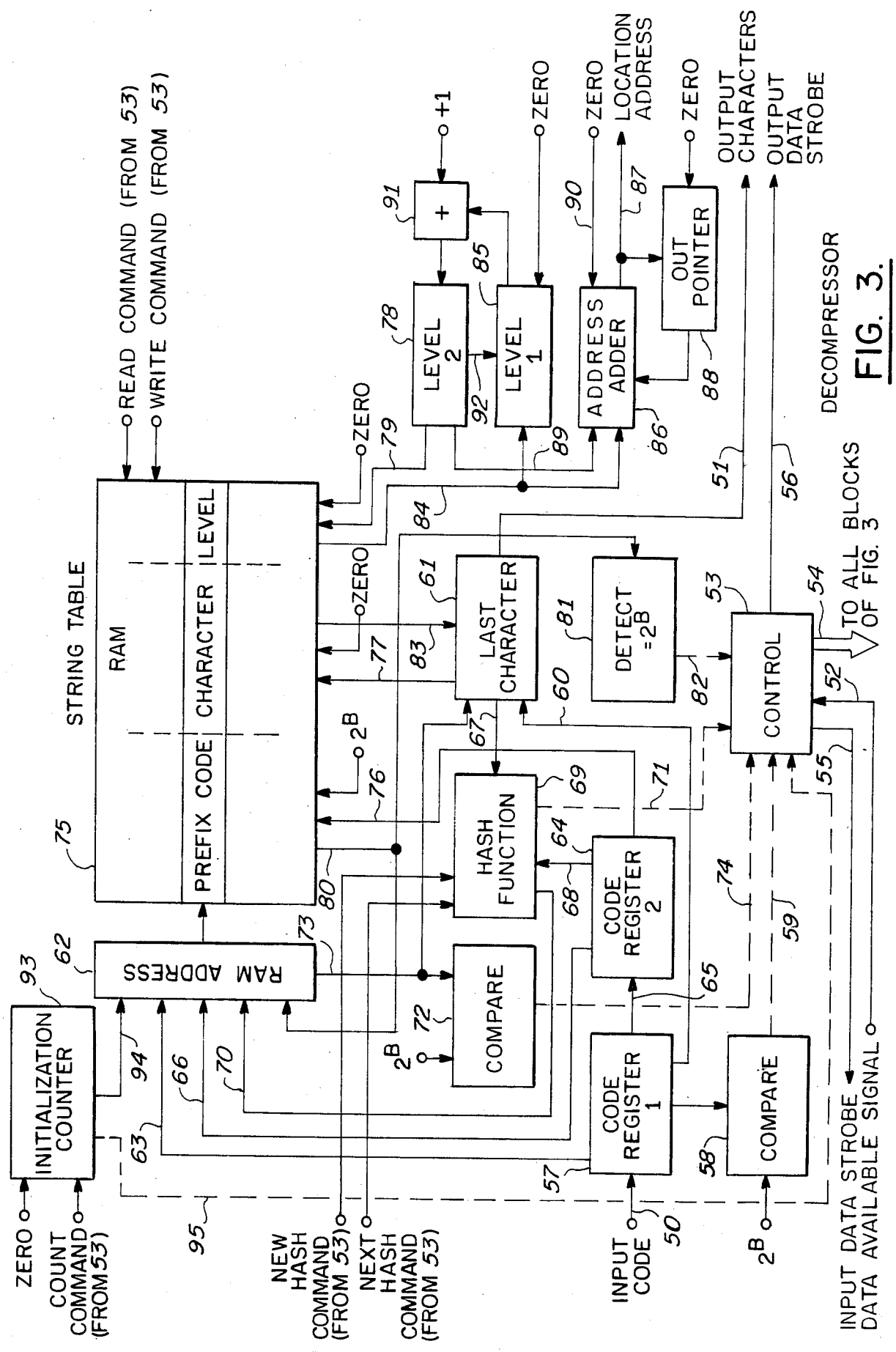
FIG. 3 is a schematic block diagram of a data decompressor in accordance with the invention implemented to provide highest performance and adapted to decompress the compressed stream of code signals from the compressor of FIG. 2.

FIGS. 2 and 3 illustrate a compressor and decompressor, respectively, for implementing a highest performance embodiment of the present invention. This embodiment provides an economical and fast compression process. A character size of B bits and a compressor code size of C bits is utilized. The string table contains $2^C$ locations. Typically, B is 8 bits and C is 12 bits with other character and code sizes being utilizable in practicing the invention. This embodiment utilizes a fixed length code symbol signal of C bits which is utilized as the address of the string entry in the hashed string table. The first $2^B$ locations are initialized to contain the single character strings. The compressor utilizes a string table which contains in each entry only the C-bit prefix string code. The decompression table contains this same code and in addition, the B-bit extension character appended to the prefix string to compose the current string.

The addresses into the string table, which are utilized as the output code symbol signals from the compressor are derived utilizing a hash function that will be described in detail subsequent to the description of the embodiments of FIGS. 2 and 3. The hash function generates N C-bit addresses in sequence. The embodiments of FIGS. 2 and 3, as well as those of FIGS. 4 and 5 utilize a controller to control the numerous functions described herein below. For example, the hash function device notifies the controller upon the occurance of the $N^{TH}$ address. The hardware embodiments of the invention are implemented and described as sequential state machines. The controllers of the compressor and decompressor receive signals from the various blocks thereof and provide signals thereto to control the components of the compressor and decompressor in accordance with the extant state of the machine. Any standard control logic system may be utilized to control the described sequences. For example, one flip-flop per state may be activated to distinguish the operative connections and functions to be performed during each state with the flip-flop controlling the state being activated during that state.

Referring now to FIG. 2, the compressor of the highest performance embodiment of the present invention is illustrated. The compressor receives input character signals on a bus 10 and provides compressed output code signals on a bus 11. The input characters are provided on the bus 10 from external equipment. The external equipment also provides a data availale signal on a line 12 whenever an input character signal is available from the external equipment and applied on the bus 10. The data available signal on the line 12 is applied to a compressor controller 13. The compressor controller 13 provides control signals to all of the blocks of the compressor of FIG. 2 via leads 14. The compressor controller 13 sequences the compressor of FIG. 2 through the control states in a manner to be described in detail hereinbelow. The controller 13 also provides a character strobe signal to the external equipment on a line 15 to call for additional input characters. When an output code signal is available on the bus 11, the controller 13 provides a code strobe signal to the external equipment on a lead 16.

The input characters on the bus 10 are entered into a B-bit character register 17. In order to create single character string codes, the B-bit character byte from the character register 17 is inserted via a bus 18 into the B least significant bits of a C-bit code number register 19.

The high order C-B bits of the code number register 19 may be set to zero by means of a control signal on a lead 20.

The code symbol signal from the register 19 and the character signal from the register 17 are applied via busses 21 and 22 respectively to a hash function circuit 23. The hash function circuit 23 combines the C-bit code signal on the bus 21 with the B-bit character on the bus 22 to provide N C-bit addresses sequentially on a bus 24. The hash function circuit 23 signals the controller 13 via a lead 25 if the hash address provided on the bus 24 is the $N^{TH}$ address in the sequence.

The hash function circuit 23 also receives a New Hash command and a Next Hash command from the controller 13. The controller 13 commands the hash function circuit 23 to provide the first of the N hash addresses in response to the New Hash command and the subsequent hash addresses in response to subsequent occurrances of the Next Hash command. As described, when the hash function circuit 23 has provided the $N^{TH}$ hash address, a signal is returned to the controller 13 via the lead 25.

The hash addresses on the bus 24 are applied to a comparator 26 which also receives a constant value signal equal to $2^B$. The comparator 26 compares the hash address on the bus 24 with the value $2^B$ and provides a signal to the controller 13 via a lead 27 indicating whether the hash address on the bus 24 is greater than $2^B$ or is less than or equal to $2^B$.

The hash address on the bus 24 is also applied to a C-bit RAM address register 28. An address loaded into the RAM address register 28 accesses a RAM 29 utilized to store the compressor string table. The RAM 29 contains $2^C$ C-bit locations. Each string is stored in the RAM 29 by storing its prefix code at a location addressed by the code assigned to the string. The code assigned to the string is derived by hashing the prefix code with the string extension character in a manner to be described.

The RAM 29 receives a READ command and a WRITE command from the controller 13 to control the READ and WRITE functions of the RAM 29. The RAM 29 is controlled by the controller 13 to receive either a C-bit value equal to $2^B$ or the C-bit code number signal from the register 19 via a bus 30. In accordance with the application of the WRITE command to the RAM 29, either the constant value $2^B$ or the code number on the bus 30 is written into the location accessed by the RAM address in the register 28 in accordance with control signals from the controller 13. The RAM 29 also provides in response to the READ command, the C-bit contents of the accessed location on a bus 31. The RAM output on the bus 31 and the output of the code register 19 are applied as inputs to a comparator 32. The comparator 32 also receives a constant value signal equal to $2^B$. The comparator 32 compares the output of the RAM 29 with the output of the code number register 19 and with $2^B$. The results of the comparison are provided to the controller 13 via a lead 33. The comparison signal on the lead 33 indicates to the controller 13 whether the RAM output on the bus 31 is equal to the code number from the register 19 or to $2^B$ or to neither. For reasons to be later described, the controller 13 controls the RAM address register 28 to transfer its contents to the code number register 10 via a bus 34.

The compressor of FIG. 2 also includes an initialization counter 35 that provides a C-bit signal to the RAM address register 28 via a bus 36. The counter 35 may be set to zero via a zero valued signal applied thereto. The controller 13 controls the counter 35 via a count command to add one to the contents of the counter for each application of the count command. The counter 35 signals the controller 13 when it has attained the count $2^C$ via a carry-out or overflow signal on a lead 37. The initialization counter 35 is utilized to initialize the RAM 29 to empty by sequentially accessing all of the locations thereof and writing in the constant value $2^B$ selected to indicate the empty condition.

The basic operation of the compressor of FIG. 2 is capsulized as follows:
1. Initialize RAM to empty, for each data block
2. On first character of each byte string:
   character→code register, as first code number
3. On successive characters:
   hash (code, character)→sequence of N RAM addresses; for each location in sequence
   If RAM output=code: RAM address→code register; reenter this step with another character.
   If RAM location is empty: write code register→ RAM: transmit code value as output; go to step 2 else, after all hash address:transmit code value as output; go to step 2.

With continued reference to FIG. 2, the following is a state machine description of the compressor of FIG. 2.

State 0: Wait state, at beginning of each data block
  Set initialization counter to zero.
  Wait for data available signal: go to State 1

State 1: Initialize RAM
  initialization counter→RAM address
  $2^B$→RAM data input
  write RAM
  add +1 to initialization counter
  If initialization counter $>2^C$ repeat State 1 else go to State 2.

State 2: Read first character of block for starting code
  Input character→code register (low-order B bits)
  Zeros→code register (high order C-B bits) go to State 3.

State 3: Process next character in this string
  Read next character
  If no new input characters available: transmit code register→output; go to State 0
  hash (code register, next character)→RAM address
  If RAM address $\leq 2^B$: go to State 4
  Read RAM
  If (RAM output)=(code register): RAM address→code register; go to State 3
  If (RAM location)=$2^B$: go to State 5
  Else: go to State 4

State 4: Continue Search
  next hash (code, character)→RAM address
  If RAM address $\leq 2^B$: If last hash value: go to State 6
    Else: repeat State 4
  Read RAM
  If (RAM output)=(code register): RAM address→code register; go to State 3
  If (RAM output)=$2^B$: go to State 5
  Else: If last hash iteration: go to State 6 else repeat State 4

State 5: Create new string
  Write (code register)→RAM go to State 6

State 6: End of String
  Transmit (code register)→output
  Character register→code register (low-order B bits)

Zeros=code register (high-order C-B bits) go to State 3

A more detailed description of the operation of the compressor of FIG. 2 with respect to the state machine description given above is now provided:

[0]. Wait State. While waiting for a block of input characters, the compressor of FIG. 2 resides in this state. During the Wait State, the controller 13 resets the initialization counter 35 to zero. The data available signal on the lead 12 from the external source which supplies the input data is utilized to indicate when input data is available. When data becomes available, the data available signal on the lead 12 signals the controller 13 to enter the Initialization State.

[1]. Initialization State. The contents of the Random Access Memory, RAM, 29, are initialized to be empty. The empty symbol is arbitrarily chosen as $2^B$ for implementation convenience. Thus, in the Initialization State, the value $2^B$ is written into each location of the memory 29. The empty symbol should never be assigned to a string code. The locations zero through $2^B$ are initialized to empty for implementation convenience although they will never be accessed. Conceptually, the locations zero through $2^B-1$ are initialized to contain the $2^B$ single character string which are preassigned code values equal to the characters they represent. Thus, the $2^B$ single character strings are preassigned code values zero through $2^B-1$. The initialization is achieved in repeated memory cycles, by gating the value in the C bit initialization counter 35 via the bus 36 to the RAM 30 address register 28. The input to the RAM 29 is selected from the C bit constant input value $2^B$. The RAM 29 has $2^C$ locations each C bits wide. The RAM 29 is controlled to write the selected input data into the location designated by the RAM address register 28. The initialization counter 35 is commanded to count up by adding 1 to its present contents. This sequence of events is repeated $2^C$ times, once for each memory location. After $2^C$ such counts, the initialization counter 35 provides an overflow or carry-out signal to the controller 13 via the lead 37 signalling that the $2^C$ counts have occurred. This causes the compression unit of FIG. 2 to advance to the First Character State.

[2]. First Character State. After the initialization, the compressor of FIG. 2 reads the first input character residing on the bus 10 gating the B bits thereof into the B bit character register 17. A signal is then provided by the controller 13 on the character strobe line 15 to cause the next input character signal to be provided on the input bus 10 by the external equipment. The B character bits in the character register 17 are then gated via bus 18 into the least significant (right-hand) B bits of the C bit code number register 19 and the most significant C-B bits of the register 19 are set to zero. This procedure converts the first input character into the preassigned code value for that single character string. In the embodiment of FIG. 2, the $2^B$ preassigned code values are equal to the characters of the alphabet respectively, that they represent. Having initiated the first string the Next Character State is entered which is the main cycle of the iterations of the compressor of FIG. 2.

[3]. Next Character State. Upon entering this state, a valid character string has been parsed from the input and its code value resides in the code number register 19. The next character is now read from the bus 10 into the character register 17 and the character strobe signal on the line 15 is returned to the external data source. In the event that the data available signal on the line 12 indicates that no such character was available on the bus 10, then the compressor has attained the end of the data block. In that situation, the code value for the last data string, residing in the code register 19 is transmitted as output code on bus 11 and the code strobe signal on the line 16 is sent to the external equipment indicating that a new compressed code signal is being provided. The controller 13 then returns the compressor to the Wait State.

If, however, the end of the data block has not been attained and a new character was available and entered into the character register 17, this B bit character via the bus 22 is combined, in the hash function circuit 23, with the C bit code number in the register 19 provided on the bus 21. Under control of the new hash command from the controller 13, the hash function circuit 23 provides the first RAM address for this code, character combination. This hash address on the bus 24 is compared to the value $2^B$ by the comparator 26. If the hash address on the bus 24 is less than or equal to $2^B$, then this location is inaccessible and the next hash address is selected by going to the Next Hash State. Address values less than or equal to $2^B$ are not permitted as new code values because the values less than $2^B$ are preassigned to be the code values for the single character strings and the value $2^B$ was preassigned to identify an empty memory location (an unused code value).

If the hash address is greater than $2^B$, the normal case, then the hash address on the bus 24 is gated into the RAM address register 28 and the RAM 29 is controlled to read the contents of that address. The C bit result on the bus 31 is compared in comparator 32 to both the code value from the register 19 and to the value $2^B$. If the output of the RAM 29 on the bus 31 is equal to the code number from the register 19, then the extended string has been previously encountered and already assigned a code value; viz, the RAM address value of the location just read. The new code number is gated from the RAM address register 28 via the bus 34 to the code number register 19 and this Next Character State is reentered to repeat the procedure on a new character.

Alternatively, if the RAM output on the bus 31 is equal to $2^B$ then this location is empty, signifying that the extended string is not in the table and so cannot be utilized to parse the input data. This terminates the building of the current string and the New String State is now entered.

In the event, however, that the RAM output on the bus 31 equals neither $2^B$ nor the code number from the register 19 other locations in the RAM 20 must be searched, which is performed in the Next Hash State.

[4]. Next Hash State. In this state, a further RAM address is generated by the hash function circuit 23 for the current code, character combination under control of the Next Hash command from the controller 13. The procedures of the previous state are then essentially duplicated. The new address is compared by the comparator 26 to $2^B$ and if the address is not greater than $2^B$ it is not utilized. In this event, this Next Hash State is reentered to obtain another address. If all N hash addresses have been examined, as indicated by a signal from the hash function circuit 23 on the lead 25, then the current string is considered as not existing in the string table and there is no space to enter it. The String End State is then entered.

If, however, the hash address is greater than $2^B$, the address on the bus 24 is gated to the RAM address register 28 and the RAM 29 is controlled to read the contents at that location. The result provided on the RAM output bus 31 is compared in the comparator 32 to the code number in the register 19 and to $2^B$. If the RAM output equals the code number, then the new code number from the RAM address register 28 is gated via the bus 34 to the register 19 and the Next Character State is entered. Alternatively, if the RAM output on the bus 31 equals the value $2^B$, then the New String State is entered. If the RAM output on the bus 31 equals neither $2^B$ nor the code value, then this process is repeated up to N times by reentering this Next Hash State for a new address value. When N locations have been tried, as indicated by a signal from the hash function circuit 23 on the lead 25, the string is terminated and the String End State is entered.

[5]. New String State. The encountering of an empty location in the string table indicates that the searched for extended string has not been found in the table and that it should be entered therein. This is accomplished by writing the prefix code number of the extended string into the RAM 29 thus reserving the assigned address as the code value for the extended string. Accordingly, the address in the RAM address register 28 is maintained at its former value and the RAM 29 is controlled to write the contents of the code number register 19 via the bus 30 into the addressed location. The String End State is then entered.

[6]. String End State. When entering this state, it had been determined that the extended string was not in the string table and so the existing string code should be transmitted as output and a new string begun. Accordingly, the output code signal from the code number register 19 is transmitted on the output bus 11 and the Code Strobe Signal is sent via the lead 16 to notify the external apparatus that a new compressed code signal is present on the bus 11. The precise form of this interface will vary according to the specific requirements of the external apparatus that receives the compressed data signals. The new string is initiated utilizing the existing character in the character register 17 which is translated into its preassigned single character string code by gating it into the least significant B-bits of the code number register 19 via the bus 18 and placing zeros in the higher C-B bit positions of the register 19. The Next Character State is reentered to construct the new string.

Referring now to FIG. 3, a decompressor for recovering the data character sequences corresponding to the compressed code signals from the compressor of FIG. 2 is illustrated. The decompressor of FIG. 3 is implemented so that the output thereof may be placed directly into an external random access buffer, which arrangement provides rapid reversal of the output character strings. This decompressor embodiment utilizes explicit management of output location addresses. Each entry in the string table contains a "level" value which indicates the number of characters in the prefix string. This level value is utilized to achieve proper positioning of each character in the output buffer. The external equipment which receives the decompressed character strings from the decompressor is assumed to utilize a random access memory to store the data. When utilizing an external random access buffer, the decompressor provides an address with each output data character, which address defines the location of that character in the output string. The initial location corresponds to an address of zero. The external equipment may manipulate the location addresses to match its particular memory addressing requirements.

The decompressor of FIG. 3 provides output characters in a different order than they were received by the compressor of FIG. 2, but by providing a location value with each character, the final assembled data stream will be in the correct sequence. If a random access memory is not utilized in the external equipment, a stack mechanism approach to string reversal, such as that described below, with respect to FIG. 5 may be utilized.

The decompressor of FIG. 3 receives compressed code signals on a bus 50 and provides corresponding strings of recovered data character signals on a bus 51. The compressed code signals are provided on the bus 50 from external equipment. The external equipment also provides a data available signal on a line 52 whenever a compressed code signal is available from the external equipment and applied on the bus 50. The data available signal on the line 52 is applied to a decompressor controller 53. The controller 53 provides control signals to all of the blocks of the decompressor of FIG. 3 via leads 54. The decompressor controller 53 sequences the decompressor of FIG. 3 through the control states thereof in a manner to be described in detail hereinbelow. The controller 53 also provides an input data strobe signal to the external equipment on a line 55 to call for additional input code signals. When an output character is available on the bus 51, the controller 53 provides an output data strobe signal to be external equipment on a lead 56.

The compressed code signals on the bus 50 are entered into a C-bit code register 57. In order to distinguish between codes representative of single character strings and codes representative of multiple character strings, the output of the code register 57 is compared to a constant value signal of $2^B$ in a comparator 58. Accordingly, the comparator 58 provides a signal to the controller 53 via a lead 59 indicative of whether the code signal in the register 57 is greater or less the $2^B$. When the code value in the register 57 is less than $2^B$, and therefore representative of a single character string, the low order B-bits of the register 57 are transferred via a bus 60 to a B-bit last character register 61. Since as discussed above, the code value for a single character string is the same as the character, the single character string transferred to the last character register 61 via the bus 60 is output directly on the bus 51.

When the compressed code signal in the register 57 is greater than $2^B$, as determined by the comparator 58, the code value in the register 57 is transferred to a RAM address register 62 via a bus 63. At certain times during the decompression of compressed code signals, the compressed code in register 57 is transferred to a C-bit code register 64 via a bus 65 to save the value for later processing. Under certain conditions, to be later described, the code value in the register 64 may be transferred to the RAM address register 62 via a bus 66.

In order to provide appropriate addresses for the storage of character strings in the decompressor, the character signal stored in the last character register 61 and the code signal stored in the code register 64 are applied via busses 67 and 68, respectively, to a hash function circuit 69. The hash function circuit 69 is identical to the hash function circuit 23 described above with respect to FIG. 2. The hash function circuit 69 combines the C-bit code signal on the bus 68 with the B-bit character signal on the bus 67 to provide N C-bit addresses sequentially to the RAM address register 62 via a bus 70. The hash function circuit 69 signals the controller 53 via a lead 71 if the hash address provided on the bus 70 is the $N^{TH}$ address in the sequence.

The hash function circuit 69 also receives a New Hash command and a Next Hash command from the controller 53. The controller 53 commands the hash function circuit 69 to provide the first of the N hash addresses in response to the New Hash command and the subsequent hash addresses in response to subsequent occurrences of the Next Hash command. As described when the hash function circuit 60 has provided the $N^{TH}$ hash address, a signal is returned to the controller 53 via the lead 71.

The RAM address from the RAM address register 62 is applied to a comparator 72 and to the last character register 61 via a bus 73. The comparator 72 also receives a constant value signal equal to $2^B$. The comparator 72 compares the RAM address on the bus 73 with the value $2^B$ and provides a signal to the controller 53 via a lead 74 indicating whether the address on the bus 73 is greater than or less than $2^B$. When it is less than $2^B$, the value in the RAM address register 62 is applied to the last character register 61 to recover the first character in a character string in a manner to be described.

An address loaded into the RAM address register 62 accesses a RAM 75 utilized to store the decompressor string table. The RAM 75 contains $2^C$ locations each being C+B+L bits wide. Each string is stored in the RAM by storing its C bit prefix code, its B bit extension character and an L bit level value. The value in the level field is equal to the number of bits in the prefix of the string. Each string is stored in the RAM 75 at a location addressed by the code assigned to the string. The code assigned to the string is derived by hashing the prefix code with the string extension character in a manner to be described.

The RAM 75 receives a READ command and a WRITE command from the controller 53 to control the READ and WRITE functions of the RAM 75. For initialization purposes in a manner to be explained, the RAM 75 receives constant value signals $2^B$, zero and zero for writing into the prefix code, character and level fields of the RAM location addressed by the RAM address register 62. These values are applied under control of the controller 53 and are entered upon application of the WRITE command. The RAM 75 is also controlled by the controller 53 to selectively receive the code value from the code register 64 via a bus 76, the character value from the last character register 61 via a bus 77 and a level value from a level register 78 via a bus 79 for entry into the prefix, character and level fields respectively of the RAM location addressed by the RAM address register 62. These values are written into the respective fields in response to the WRITE command from the controller 53.

The controller 53 also controls the RAM 75 in response to the READ command to provide on a bus 80 the prefix code value stored in the prefix code field of the RAM location addressed by the RAM address register 62. This code value on the bus 80 is applied to the RAM address register 62 as well as to a detector 81. The detector 81 determines whether or not the prefix code on the RAM output 80 is equal to $2^B$ and provides a signal to the controller 53 via a lead 82 accordingly.

The controller 53 also controls the RAM 75 to selectively provide the character value from the character field via a bus 83 to the last character register 61. The character value is provide on the bus 83 fron the character field of the RAM location addressed by the RAM address register 62 in response to the READ command. In a similar manner, the controller 53 controls the RAM 75 to provide the level value via a bus 84 either to a level register 85 or to an address adder 86. The level value is applied to the bus 84 from the level field of the RAM location accessed by the RAM address register 62. The selective routing of the level value on the bus 84 to the level register 85 and the address adder 86 is controlled by the controller 53 in accordance with the extant state of the decompressor.

The decompressor of FIG. 3 includes apparatus for assigning addresses to the output character signals for proper alignment in an external random access memory. Accordingly, the address adder 86 provides such location address to the external equipment on a bus 87. The address adder 86 receives inputs from an outpointer register 88, the level value from the RAM 75 on the bus 84 and the level value from the level register 78 on a bus 89. The address adder 86 also receives a zero value signal on a bus 90. The controller 53 controls the address adder 86 to add either the level value on the bus 84, the level value on the bus 89, or the level value on the bus 90 to the value in the outpointer register 88 in accordance with the extant state of the decompressor and logical conditions existing during the state in a manner to be described. The result of the addition provides the location address on the bus 87.

The output of the address adder 86 is also applied as an input to the outpointer register 88. The controller 53 controls the outpointer register 88 to replace the extant outpointer value with the result of an addition in the adder 86 or merely to provide a base address to the adder 86 for generating location addresses on the bus 87. The controller 53 also controls the level registers 78 and 85 to transfer the level value from the level register 85 to the level register 78 increasing the value by one via an adder 91 in the transfer path. Additionally, the controller 53 controls the level registers 78 and 85 to transfer the contents of the level register 78 to the level register 85 via a bus 92. The apparatus also includes inputs to the level register 85 and the outpointer register 88 to zero these registers under conditions to be described.

The decompressor of FIG. 3 also includes an initialization counter 93 that provides a C-bit signal to the RAM address register 62 via a bus 94. The counter 93 may be set to zero via a zero-valued signal applied thereto. The controller 53 controls the counter 93 via Count command to add one to the contents of the counter for each application of the Count command. The counter 93 signals the controller 53 when it has attained the count $2^C$ via a carry-out or overflow signal on a lead 95. The initialization counter 93 is utilized to initialize the RAM 75 to empty by sequentially accessing all of the locations thereof and writing in the constant values $2^B$, zero and zero into the prefix code, character and level fields respectively.

The basic operation of the decompressor of FIG. 3 is capsulized as follows:
1. Initialize RAM to empty, for each data block
2. For each input code, read code→code register; save certain data from prior code for string table update.
3. Code register→RAM address Read RAM producing prefix code, extension character, string length
   If prefix code$\geq 2^B$, characater→output at location determined by string length; prefix code→code register; repeat step 3

If prefix code $<2^B$; code value→output as character; go to step 4
4. At end of character string update string table:
Write prior received code and last output character into first empty location from sequence produced by hash (prior code, last character); go to step 2.

With continued reference to FIG. 3, the following is a state machine description of the decompressor of FIG. 3.

State 0: Wait State, at beginning of each data block
  initialization counter = zero
  outpointer = zero
  wait for data available signal; go to State 1
State 1: Initialize RAM
  initialization counter→RAM address
  $2^B$, zero, zero→RAM input
  write RAM
  add +1 to initialization counter
  If initialization counter $<2^C$ repeat State 1; else go to State 2
State 2. Process initial input code
  Input code symbol→code register 1
  Input data strobe
  Code value (low order B bits)→last character register.
  Location Address = outpointer; output data strobe
  Level Register 1 = zero
  go to State 3
State 3: Next input code
  Code register 1→code register 2
  (Level reg. 1)+1→level register 2
  (Level reg. 2)+(outpointer)→outpointer
  If no new input available; go to State 0
  Read input code value →code reg. 1
  Input data strobe
  If code reg. $1 \geq 2^B$:
    Level Reg. 1 = 0
    code register 1→RAM address
    go to State 4
  If code reg. $1 < 2^B$:
    Code value (low order B bits of code reg. 1)→last character reg.
    Location Address = outpointer; output data strobe
    go to State 5
State 4: First character cycle
  Read RAM
  If code (RAM$\neq 2^B$ [normal case]
    level (RAM)→level reg. 1
    code (RAM)→RAM address
    char (RAM)→last char. reg.
    Location address = outpointer + level (RAM); output data strobe
  If code (RAM) = $2^B$ [an abnormal case]
    level reg. 2→level reg. 1
    code reg. 2→RAM address
    Location address = outpointer + level reg. 2; output data strobe
    go to State 5
State 5: Later character cycles
  If RAM address $\geq 2^B$: Read RAM
    code (RAM)→RAM address
    char (RAM)→last char. reg.
    Location address = outpointer + level (RAM); output data strobe
    go to State 5
  If RAM address $<2^B$:
    RAM address (low B bits)→last char. reg.
    Location address = outpointer: output data strobe
    go to State 6
State 6: Update string table
  Hash (code register 2, last char. reg.)→RAM address
  Read RAM
  If code (RAM) = $2^B$ and if RAM address $>2^B$:
    go to State 7
  Else: Repeat State 6 with new hash value If this was last hash, go to State 3
State 7: Write Cycle
  with RAM address unchanged
  code reg. 2→code (RAM)
  last char. reg.→char (RAM)
  level reg. 2→level (RAM)
  Write RAM
  go to State 3

A more detailed description of the operation of the decompressor of FIG. 3 with respect to the state machine description given above is now provided.

[0.] Wait State. While waiting for a block of compressed input code signals, the decompressor of FIG. 3 resides in this state. During the Wait State, the controller 53 resets the initialization counter 93 to zero. The controller 53 also resets the outpointer register 88 to zero so that subsequent transfers of output character signals to the external output memory begins at the lowest available address. The data available signal on the lead 52 from the external source which supplies the input code, is utilized to indicate when input code is available. When input code becomes available, the data available signal on the lead 52 signals the controller 53 to enter the Initialization State.

[1.] Initialization State. The contents of the random access memory, RAM, 75 are initialized to be empty. The RAM 75 contains three distinct data fields in each of its $2^C$ locations; viz. a prefix code value of C bits, an extension character of B bits, and a level value of L bits. Each location corresponds to a string of characters where the address of the location is the code value of the string and the contents of the location provide the composition of the string in terms of its prefix string and extension character. The level field provides the number of characters in the prefix string and is utilized in locating output characters in the appropriate positions in the output sequence. L bits are provided for the level value under the assumption that no string length will exceed $2^L$ characters where L is less than or equal to C. All of the locations of the RAM 75 are initialized by entering the empty symbol, $2^B$, into the prefix code fields thereof. The character value and level value fields are initialized to zero although these fields do not require initialization and can be left with extant values if desired for simplification. The first $2^B + 1$ locations are initialized for implementation convenience although these locations are never otherwise accessed during operation of the decompressor.

The initialization is achieved in repeated memory cycles by gating the value in the C-bit initialization counter 93 via the bus 94 to the RAM address register 62. The RAM inputs are selected to be the constant values $2^B$, zero and zero. The RAM 75 is controlled to write the selected input data into the location designated by the RAM address register 62. The initialization counter 93 is commanded to count up by adding one to its present contents. This sequence of events is repeated $2^C$ times, once for each memory location. After $2^C$ such counts, the initialization counter 93 provides an overflow or carry-out signal to the controller 53 via the lead 95 signalling that the $2^C$ counts have occurred. This causes the decompression unit of FIG. 3 to advance to the First Code State.

[2.] First Code State. After the initialization, the decompressor of FIG. 3 reads the first input code signal residing on the bus 50 taking the C bits thereof into the C-bit code register 57. A signal is then provided by the controller 53 on the input data strobe line 55 to cause the next input code signal to be provided on the input bus 50 by the external equipment. For the reasons discussed above with respect to the compressor of FIG. 2, the initial code signal now residing in the register 57 is known to be one of the preassigned single character string codes. Therefore the low order B bits of this code are known to be the first character of the data message, and this character is transmitted as the first output from the decompressor. This is achieved by transferring the low order B bits of the code register 57 via the bus 60 to the last character register 61 from which it is directly provided on the output character bus 51. Since this first character is to be placed in the first output location of the external memory, a location address of zero is generated by passing the value in the outpointer register 88 through the address adder 86 and adding in the constant zero. The address on the location address bus 87, therefore, is zero as required. A signal on the output data strobe line 56 indicating that the output bus 51 and the address bus 87 contain valid new information is transmitted to the external equipment.

In preparation for the decompressor cycles to follow, the level register 85 is set to zero since this is known to be the length of the prefix string in the received string. The main processing cycle of the Next Input State is then entered.

[3.] Next Input State. Each new input code is read in from the external equipment and processing thereof is initiated according to the following logic. The present code value, which is the code just processed, from the code register 57 is transferred to the code register 64 via the bus 65 to save it for a later update cycle. Similarly, the value in the level register 85 is transferred to the level register 78 with its value increased by one by means of the adder 91 in the transfer path. This incrementation is effected because the new string to be created will have a prefix string one character longer than the prefix of the string just processed. The outpointer value in the outpointer register 88 is now updated to contain the location address where characters from the new string will be placed in the external memory. This location address is the length of the string just processed added to the prior base address. This is achieved by adding the level value in the level register 78, as just updated, to the outpointer value in the outpointer register 88 by means of the address adder 86 with the result being placed back in the outpointer register 88.

The new input code signal is then read, if one is available. If the data available signal on the line 52 indicates that new input code is unavailable, then the message has been fully processed and the Wait State is reentered to await the next message. In the normal situation, a new input code signal is available and it is gated from the input bus 50 into the code register 57. The input data strobe signal on the line 55 is issued to the external equipment to cause it to provide the next code signal on the input bus 50.

The new code signal in the register 57 is compared to the value $2^B$ utilizing the comparator 58. If the new code value in the code register 57 is greater than $2^B$, this is a normal code which is translated by string table look-ups in the RAM 75. Thus, this code value in the register 57 is transferred via the bus 63 to the RAM address register 62 and the controller 53 controls the decompressor to enter the First Character State.

Under proper operation of the data compression and decompression system of FIGS. 2 and 3, the code register 57 cannot obtain the value $2^B$ because that code is not properly provided by the compressor of FIG. 2. If the code register 57 in fact contains the value $2^B$, any convenient error procedures may be implemented.

If the value in the code register 57 is less than $2^B$, then this code value defines a single character string and accesses to the RAM 75 are not required to process it. In this situation, the level register 85 is set to zero because there are no characters in the prefix string of a single character predefined string. The character value, being the low-order B bit of code register 57, is transferred via the bus 60 to the last character register 61 to be transferred to the external equipment on the output bus 51. In this situation, the outpointer register 88 contains the proper external address and so zero is added to the value in the outpointer register 88 as it passes through the address adder 86 to provide the location address on the bus 87. The output data strobe signal on the line 56 is then issued to indicate, to the external equipment, that valid data is available on the output character and address lines. After completing processing of the one-character string, the Update State is entered.

[4.] First Character State. In this state, the first character from a string is extracted and other specialized functions which occur only at the beginning of a string are performed. The RAM 75 is controlled to read the contents of the string location indicated by the code in the RAM address register 62 as it was loaded in the previous state. The RAM 75 provides three outputs for the selected string; viz. the prefix string code on the bus 80, the extension character on the bus 83, and the level value on the bus 84 which level value is the length of the prefix string. The prefix string code on the bus 80 is compared to the value $2^B$ by the comparator 81.

If the prefix code on the bus 80 is not equal to $2^B$, which is the normal case, then it is a legitimate prefix string code to be further processed to obtain further characters. The extension character on the bus 83 is transferred to the last character register 61. The level value on the bus 84 indicates the position of this character in the string and this position value is added via the address adder 86 to the value in the outpointer register 88 to provide the output location address for the character on the bus 87. The output data strobe signal on the line 56 is then issued to indicate to the external equipment that valid data is available. Additionally, the level value on the bus 84 is stored in the level register 85 for use in a later update.

If the prefix string code value on the bus 80 is equal to $2^B$, this indicates that the addressed RAM location is empty, and the received string code does not correspond to an entry in the string table. This situation can only occur in the unusual case that the next pending table update would have created that string entry. That is, the code just received denotes a string whose prefix string is the string just processed (code in code register 64 and level value in level register 78). The first decoded character of the current string is the extension character of the prior string; which is the same character as the last decoded character to be found in the current string; which has the same value as the last decoded character of the prior string because they have the same prefix string; which is the character now residing in the last character register 61. Thus to implement this unusual case, the value in the code register 64 is transferred via the bus 66 to the RAM address register 62 as the prefix string code. The value in the last character register 61 is utilized unchanged to drive the output character bus 51 while the value in the level register 78 is added to the value in the outpointer register 88 via the address adder 86 to create the proper output location address on the bus 87. The controller 53 then issues the output data strobe on the line 56 to indicate valid outputs to the external equipment. The value in the level register 78 is transferred to the level register 85 via the bus 92 to provide length information for a later update.

Having output one character from this string, the remaining characters are generated by entering the Later Character State.

[5.] Later Character State. Each prefix string is separated into an extension character and a smaller prefix string, and this is performed repeatedly until a predefined single character string is attained. The prefix string code, in the RAM address register 62 from the previous state, is compared to $2^B$ in the comparator 72. If this prefix string code is greater than $2^B$, the contents of the RAM 75 are read out and utilized as follows. The prefix code is gated via the bus 80 into the RAM address register 62 for utilization in the next state. The extension character on the bus 83 is gated into the last character register 61 for outputting on the output character bus 51. The level value on the bus 84 is added via the address adder 86 to the value in the outpointer register 88 to create the appropriate output location address on the bus 87. The output data strobe signal on the line 56 is issued and this Later Character State is re-entered to repeat the process.

If the comparator 72 indicates that the code value in the RAM address register 62 is less than $2^B$, then the end of the string has been located. Since this predefined code value contains the last character, the low-order B bits of the RAM address register 62 are transferred via the bus 73 to the last character register 61. Zero is added to the value in the outpointer register 88 via the address adder 86 to generate the appropriate output location address on the bus 87. The output data strobe signal on the line 56 is then provided. The processing on the current string having been completed, the Update State is entered to add an entry to the string table.

[6.] Update State. After a string has been completely processed, the string table is updated utilizing the last character of this string with the code and level of the prior string. To assign the correct new code number to the new string, the same hashing function circuitry is utilized as discussed above with respect to the compressor of FIG. 2. The hash function generates a sequence of N addresses which are sequentially searched until an empty table location is encountered. Accordingly, the prior code value stored in the code register 64 is transmitted via the bus 68 to the hash function circuit 69 along with the value from the last character register 61 via the bus 67. The hash value generated by the hash function circuit 69 is gated via the bus 70 into the RAM address register 62. If the address in the RAM address register 62 is greater than $2^B$, as indicated by the comparator 72, the RAM 75 is controlled to read the contents of that location. If the comparator 72 indicates that the address in the RAM address register 62 is not greater than $2^B$, then that address is not utilized and the hash function circuit 69 is controlled to generate a new value. The new value is gated via the bus 70 into the RAM address register 62 and the test is repeated. When the hash function circuit, 69 provides a valid address greater than $2^B$, the RAM 75 is read at that location. The prefix code on the bus 80 read out of that location is compared to $2^B$ in the comparator 81. If the read value is equal to $2^B$, then that location is empty and the Write State is entered to insert the string. If the Prefix code on the bus 80 is not equal to $2^B$, then this location is already occupied and cannot be utilized. This Update State is then reentered with a new hash value to try again, unless this was the $N^{TH}$ access in which case the new string is not added to the string table and the Next Input State is entered to begin processing the next string.

[7.] Write State. When an empty RAM location has been located for the new string, the address for that location is assigned as the code of the new string and the string information is inserted. The controller 53 gates the output of the code register 64 via the bus 76 as the input into the prefix code field of the RAM 75. The output of the last character register 61 via the bus 77 is gated into the character field of the RAM 75 and the level register 78 value is gated into the level field of the RAM 75 via the bus 79. With the RAM address register 62 maintained at its previous value, the RAM 75 is controlled to write this data at the accessed location. Having thus finished processing this string, the Next Input State is entered.

The hash function circuit described above may be implemented as follows. For a B-bit character and a C-bit code, the N hash values are generated in the following manner:

first hash (code, character) = code $\oplus$ char' where char' is the input character, bit reversed left to right, complemented, shifted left C-B bits to the left-hand positions of the code.

That is, for bit positions numbered from C (on left) to 1 (least significant digit) in the code and B to 1 in the character, the hash output H is numbered C to 1;

$H(C) = code(C) \oplus char(1) \oplus 1$ $H(C-1) = code(C-1) \oplus char(2) \oplus 1$ $H(C-2) = code(C-2) \oplus char(3) \oplus 1$ $H(C-B-1) = code\ (C-B1) \oplus char\ (B) \oplus 1$ $H(C-B-2) = code\ (C-B-2)$ $H(1) = Code\ (1)$ Remaining hashes are created by adding a constant value to each prior value, ignoring carries above C bits.

Next hash = prior hash + [(2* code + 1) $\oplus$ 0101 ... 0100$_2$] (modulo2$^C$)

It is appreciated that this hashing function may be implemented in any system of logic gates and is only one example of a hashing function usable in the present invention. Other hashing functions satisfying the criteria discussed above may be readily derived by those skilled in the art.

Figure 4:
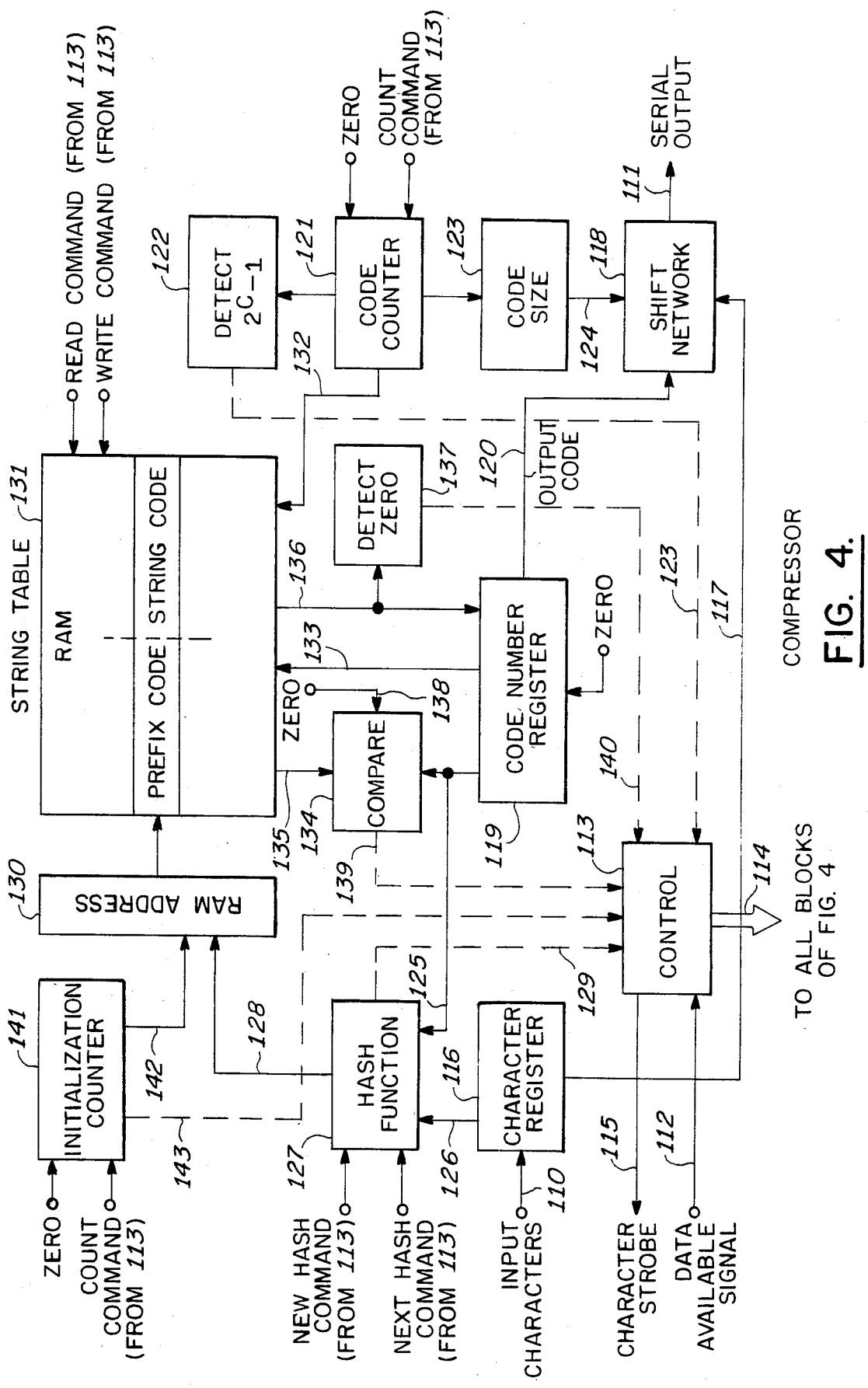
FIG. 4 is a schematic block diagram of a data compressor in accordance with the invention implemented to provide highest compression.

FIGS. 4 and 5 illustrate a compressor and decompressor, respectively, for implementing a highest compression embodiment of the present invention. The embodiment of FIGS. 4 and 5 provides a higher average compression effectiveness, but is slightly more expensive and slightly slower in operation than the high performance embodiment of FIGS. 2 and 3. This embodiment utilizes substantially the same adaptive compression procedures as the high performance embodiment, but, unlike the high performance embodiment, the compressor generates variable length compressed output code signals. In a manner similar to that described above with respect to the high performance embodiment, the high compression embodiment of FIGS. 4 and 5 utilizes B-bit byte input character signals and a sting table of $2^C$ locations. The compressed code symbols increase in size as the string table fills up reaching a maximum length of C bits. On occasion, the code symbol is extended by B bits when a new character is encountered.

Each string in the table is assigned a C-bit identifier and these identifiers are assigned in numerical order starting with one. Only the low-order D bits of these codes are transmitted as compressed data signals when $2^D$ or fewer codes have been assigned. Each location in the string table contains a C-bit prefix string identifier and the new C-bit code assigned to the string in that location. Thus each of the $2^C$ locations of the string table are 2 C bits wide. The hash function utilized in the compressor of this high compression embodiment is identical to that utilized in the previously described high performance embodiment. In this high compression embodiment, however, the hash function circuit is only utilized in the compressor.

In the decompressor of this high compression embodiment, logically the same string table is stored as in the compressor, but each location is comprised of the assigned identifier code for the prefix and the extension character. Each string is stored at a location addressed by the compressed code identifier assigned to the string. In this high compression embodiment, the intra-string character reversal procedure is effected by a push-down stack which reverses the order of the characters in the strings. Thus, the decompressor of the high compression embodiment provides the output characters of each string in their correct order.

Referring now to FIG. 1, the compressor of the highest compression embodiment of the present invention is illustrated. The compressor receives input character signals on a bus 110 and provides compressed output code symbol signals in bit serial format on a line 111. The input characters are provided on the bus 110 from external equipment. The external equipment also provides a data available signal on a line 112 whenever an input character signal is available from the external equipment and applied on the bus 110. The data available signal on the line 112 is applied to a compressor controller 113. The compressor controller 113 provides control signals to all of the blocks of the compressor of FIG. 4 via leads 114. The compressor controller 113 sequences the compressor of FIG. 4 through the control states thereof in a manner to be described in detail hereinbelow. The controller 113 also provides a character strobe signal to the external equipment on a line 115 request for additional input characters.

The input characters on the bus 110 are entered into a B-bit character register 116. When a single character is to be transferred to the output line 111, the character register 116 is controlled by the controller 113 to gate the B bits thereof via a bus 117 to a shift network 118. The shift network 118 provides the bit serial output on the line 111, and is controlled by the controller 113 to accept the B bits on the bus 117 and to serially provide these bits on the line 111.

The compressor of FIG. 4 further includes a C-bit code number register 119 for holding compressed string code signals and providing output string codes to the shift network 118 via a bus 120. The code number register 119 may be initialized to zero by a zero-valued signal applied thereto.

The compressor of FIG. 4 further includes a C-bit code counter 121 which assigns string code symbol signals in ascending numerical order to the parsed strings of the input data stream applied to the input bus 110. Under control of the controller 113, the code counter 121 may be reset to zero via a zero-valued signal applied thereto and may have its extant count increased by unity via a Count command signal. The counter 121 provides an output to a detector 122 that signals the controller 113 via a line 123 when the count in the code counter 121 has attained the value $2^C-1$. This value is attained by the C-bit counter 121 when the counter achieves the all ones condition. The output of the code counter 121 is also applied to a code size circuit 123 which provides a signal to the shift network 118 via a bus 124 to determine the number of bits to be shifted out by the shift network 118. As discussed above, D bits are shifted out where D is less than or equal to C.

The code size circuit 123 may be implemented by a standard C-bit priority encoder circuit such as an SN 74148 priority network. The code counter 121 is coupled to the priority encoder with the bits of the counter 121 in ascending significance coupled to the priority inputs of the priority encoder in ascending priority order respectively. The priority encoder then provides a binary number signal which is the value for D. The number D may be utilized in the shift network 118 to gate a packet of D shift clock pulses so as to cause the shift network 118 to serially provided D bits, on the line 111, of the output code signal provided on the bus 120. Numerous alternatives to the use of a priority encoder for the code size circuit 123 will be readily apparant to normally skilled logic designers.

The shift network 118 may, for example, be implemented utilizing a shift register for accepting the output code on the bus 120 and shifting out D bits thereof in response to the shift clock pulses controlled by the code size circuit 123. In response to a packet of D clock pulses, as controlled by the code size circuit 123, the shift register contained within the shift network 118 will be clocked D items. Shift register configurations are well known in the art, the exact details thereof varying according to the interface of the external apparatus receiving the data. As discussed above, the shift network 118 also includes conventional clock control circuitry for controlling the transmission to the B character bits from the bus 117 to the line 111 by the shift network 118.

The code symbol signal from the register 119 and the character signal from the register 116 are applied via busses 125 and 126 respectively, to a hash function circuit 127. The hash function circuit 127 is identical to the hash function circuits uitilized with respect to the high performance embodiment of the present invention described above. The hash function circuit 127 combines the C-bit code signal on the bus 125 with the B-bit character signal on the bus 126 to provide N C-bit addresses sequentially on a bus 128. The hash function circuit 127 signals the controller 113 via a lead 129 if the hash address provided on the bus 128 is the $N^{TH}$ address in the sequence.

The hash function circuit 127 also receives a New Hash command and a Next Hash command from the controller 113. The controller 113 commands the hash function circuit 127 to provide the first of the N hash addresses in response to the New Hash command and the subsequent hash addresses in response to subsequent occurrances of the Next Hash command. As described, when the hash function circuit 127 has provided the $N^{TH}$ hash address, a signal is returned to the controller 113 via the lead 129.

The hash addresses on the bus 128 are applied to a C-bit RAM address register 130. An address loaded into the RAM address register 130 accesses a RAM 131 utilized to store the compressor string table. The RAM 131 is organized into $2^C$ locations each 2 C bits wide. A character string is stored at a location by entering the code number for that string, as assigned by the code counter 121, and its prefix code; viz, the code number of the string containing all the characters but the last character of the string. The RAM 131 is initialized to contain all zeros in the string code fields indicating that all locations are initially empty. The string with code zero, being the string with no characters, has no entry in the RAM 131.

The RAM 131 receives a READ command and a WRITE command from the controller 113 to control the READ and WRITE functions of the RAM 131. When the controller 113 commands the RAM 131 to perform the WRITE function, the string code field of the location accessed by the RAM address register 130 receives the C-bit output of the code counter 121 via a bus 132 and the prefix code field of the accessed location receives its input from the code number register 119 via a bus 133. When the controller 113 controls the RAM 131 to read the contents of the location accessed by the RAM address register 130, the prefix code of the accessed location is applied to a comparator 134 via a bus 135 and the string code of the accessed location is applied to the code number register 119 via a bus 136 as well as to a zero detector 137. The comparator 134 also receives a zero-valued signal on a bus 138. Depending on the extant state of the compressor of FIG. 4, the controller 113 controls the comparator 134 either to test the equality or non-equality of the prefix code on the bus 135 and the code stored in the register 119 or to test whether the code signal in the register 119 is or is not equal to zero. The results of these tests are provided to the controller 113 via a lead 139. In accordance with the extant state of the compressor of FIG. 4, the controller 113 activates the zero detector 137 to determine if the string code on the bus 136 is or is not equal to zero. The result of the determination is provided to the controller 113 via a lead 140.

The compressor of FIG. 4 also includes an initialization counter 141 that provides a C-bit signal to the RAM address register 130 via a bus 142. The counter 141 may be set to zero via a zero-valued signal applied thereto. The controller 113 controls the counter 141 via a count command to increment the contents of the counter by unity for each application of the count command. The counter 141 signals the controller 113 when it has attained the count $2^C$ via a carryout or overflow signal on a lead 143. The initialization counter 141 is utilized to initialize the RAM 131 to empty by sequentially accessing all of the locations thereof and writing into the string code fields the value zero obtained from the bus 132. Although it is not necessary, the prefix code fields may be initialized, for implementation convenience, by writing in the value zero obtained from the bus 133.

Generally, with respect to the compressor of FIG. 4, each output code signal provided on the line 111 has a length of D bits determined by the value extant in the code counter 121. The highest non-zero bit in the code counter is the $D^{TH}$ bit, so consequentially the size of the compressor output code is equal to the size of the value in the code counter. The first code symbol signal to be transmitted by the compressor is zero bits wide but has a B-bit character symbol signal appended thereto. The second code symbol signal is one bit long and the next two code symbol signals comprise two bits each. The next four code symbol signals comprise three bits each, etc. Some of these code symbols also have a B-bit character value appended thereto. The value D reaches a maximum at C bits.

The basic operation of the compressor of FIG. 4 is capsulized as follows:
1. Initialize RAM to empty, for each data block
2. Start code register with zero code Read first input character
3. hash (code register,character)→sequence of N RAM addresses
   If RAM location empty:
      write code register,code counter→RAM
      transmit D bits of code register as output;
      increment code counter; zero→code register;
   If prefix code (RAM)=code register:
      new code (RAM)→code register
      read new input character
   If code value not found:
      transmit D bits of code register as output;
      increment code counter; zero→code register;
   Repeat step 3 until inputs exhausted.

With continued reference to FIG. 4, the following is a State machine description of the compressor of FIG. 4.

State 0: Wait State, at beginning of each data block
   zero→initialization counter
   zero→code register
   zero→code counter
   wait for data avilable signal; go to State 1
State 1: Initialize RAM
   initialization counter→RAM address
   write zero→RAM
   add +1 to initialization counter
   If initialization counter $<2^C$: repeat State 1 else go to State 2
State 2: Read Input Character
   If no data available:
      If code register=zero:
         transmit D bits of code register as output;
         Exit to State 0
      If data available:
         Read next character→character register go to State 3
State 3: First table search
   First hash (code register,character)→RAM address
   Read RAM
   If string code (RAM)=zero: (empty site)
      go to State 5
   If prefix code (RAM)=code register (string found)
      string code (RAM)→code register
      go to State 2
   Else go to State 4

State 4: Repeat table search
  Next hash(code register,character)→RAM address
  Read RAM
  If string code (RAM)=zero: go to State 5
  If prefix code (RAM)=code register:
    string code (RAM)→code register, go to State 2
  If last hash:
    go to State 6
  Else repeat State 4
State 5: New string entry
  Transmit D bits of code register as output
  If code counter $<2^C-1$:
    add +1 to code counter
    write (code register,code counter)→RAM
  If code register=zero:
    transmit B-bit character as output
    go to State 2
  If code register≠zero:
    zero→code register
    go to State 3
State 6: End of String
  Transmit D bits of code register as output
  If code counter $<2^C-1$:
    add +1 to code counter
  If code register=zero:
    transmit B-bit character as output go to State 2
  If code register≠zero:
    zero→code register
    go to State 3

A more detailed description of the operation of the compressor of FIG. 4 with respect to the state machine description given above is now provided.

[0.] Wait State. While waiting for a block of input characters, the compressor of FIG. 4 resides in this state. During the Wait State, the controller 113 resets the initialization counter 141, the code number regiser 119 and the code counter 121 to zero. The data available signal on the lead 112 from the external source which supplies the input data is utilized to indicate when input data is available. When data becomes available, the data available signal on the lead 112 signals the controller 113 to enter the Initialization State.

[1.] Initialization State. The contents of the random access memory, RAM, 131 are initialized to be empty. The empty symbol in this embodiment is selected as zero. Thus, initialization of the RAM 131 is achieved by inserting zeros into all locations. It is appreciated that only the string code entries must be zero but the prefix code values are set to zero at the same time for implementation convenience. The initialization is achieved in repeated memory cycles by gating the value in the C-bit initialization counter 141 via the bus 142 to the RAM address register 130. The input to the RAM 131 is provided from the code number register 119 via the bus 133 and the code counter 121 via the bus 132. Both the register 119 and the counter 121 contain zeros during this Initialization State. The RAM 131 is controlled to write the zero input data into the location designated by the RAM address register 130. The initialization counter 141 is commanded to count up by incrementing its present contents by unity. This sequence of events is repeated $2^C$ times, once for each memory location. After $2^C$ such counts, the initialization counter 141 provides an overflow or carry-out signal to the controller 113 via the lead 143 signalling that the $2^C$ counts have occurred. The controller 113 then advances the compressor of FIG. 4 to the Read Input Character State.

[2.] Read Input Character State. Whenever the compressor of FIG. 4 is ready for a new character, this state is entered. The value resident in the code number register 119 identifies the characters already encountered in the present string. A value of zero in the register 119 indicates the beginning of a new string. Before a character signal is entered from the input character bus 110 into the character register 116, the data available signal on the lead 112 is examined. If the data available signal indicates that no data is available, then the end of an input data block has been attained. In that situation any non-zero values in the code number register 119 must be transmitted by the compressor to complete the compressed data block. Accordingly, the contents of the code number register 119 are compared to zero in the comparator 134. If the contents of the register 119 are not zero, the comparator 134 signals the controller 113 via the lead 139 and the controller 113 gates the contents of the code number register 119 to the shift network 118 via the bus 120. The code size circuit 123 determines a value for D from the code counter 121 and controls the shift network 118 to shift out D bits of the code value. When this data has been output, the controller 113 controls the compressor of FIG. 4 to return to the Wait State to await further input data.

If, according to the data available signal on the lead 112, further input data is available, a character is read from the bus 110 into the character register 116 and a character strobe signal is provided on the lead 115 to the external equipment to provide notification of the receipt of the character. The controller 113 then controls the compressor of FIG. 4 to enter the First Table Search State.

[3.] First Table Search State. The potential string comprised of the string identified by the value in the code number register 119 extended by the character in the character register 116 is now searched to determine if it appears in the string table. The code signal from the register 119 and the character signal from the register 116 are gated via busses 125 and 126 respectively to the hash function circuit 127 which generates a hash address for that combination. The C-bit address is gated via the bus 128 to the RAM addresss register 130 which in turn accesses the RAM 131 at the addressed location. The RAM 131 is controlled to read the contents of the accessed location yielding a prefix code value on the bus 135 and a string code value on the bus 136.

If the resulting string code value on the bus 136 is determined to be zero by the zero detector 137, then that location is empty, which signifies that the extended string is not in the string table. In that situation, processing of the current string is terminated and the compressor is controlled to enter the New String Entry State to update the table and generate an output.

If, however, the string code value on the bus 136 is not zero, the prefix code value on the bus 135 is compared to the code value in the register 119 by the comparator 134. If the values are equal, the extended string exists in the table and the extended string becomes the new base string. This is effected by loading the string code of the current string which appears on bus 136 into the code number register 119. The next character is then fetched by entering the Read Input Character State.

If the prefix code on the bus 135 does not match the value in the code register 119 and the string code value on the bus 136 is not zero, the table search is continued. The continued table search is effected by controlling the compressor to enter the Repeat Table Search State.

[4.] Repeat Table Search State. When, in the First Table Search State, neither the proper occupant nor an empty location is found at the first hash address provided by the hash function circuit 127, subsequent hash addresses are provided to address the RAM 131. Thus each subsequent string table search is executed by transferring the next hash value from the hash function circuit 127 via the bus 128 to the RAM address register 130 to address the RAM 131 at an alternative search site. The RAM 131 is controlled to read the contents at the addressed site providing the string code and prefix code stored at the location on the busses 136 and 135 respectively. Essentially, the same tests are performed as in the First Table Search State to determine if the searched for string has been found or if an empty location has been encountered. If the string code on the bus 136 is detected by the detector 137 to be zero, the location is empty and the New String Entry State is entered. If the string code on the bus 136 is not zero and the prefix code on the bus 135 matches the present code value from the register 119, as determined by the comparator 134, then the string has been found and the new string code value on the bus 136 is entered into the code number register 119. The Read Input Character State is then reentered to continue the parsing iteration into the input data stream. If neither of the above conditions occur, then the search for the current string is continued by reentering this Repeat Table Search State. If however, all N hash addresses have been utilized, as signified by a signal from the hash function circuit 127 on the lead 129, then the string is defined as not being in the string table with no space in the table to insert it. When the N hash addresses have been attempted without success, the End of String State is entered.

[5.] New String Entry State. Processing of a string is terminated when an extension to the string is not found in the string table but an empty location has been encountered. When this occurs, the previously recognized string code signal is transmitted as the compressed code output signal and the extended string is entered into the string table for potential later encodings. Accordingly, the previously recognized string code signal in the register 119 is transferred to the output shift network 118 via the bus 120. The shift network 118 serially provides D bits of the output code on the output lead 111 where D is determined by the code size circuit 123 in accordance with the value in the code counter 121.

After the output is dispatched on the lead 111, the detector 122 tests the code counter 121 for the value $2^C - 1$ which is indicated by the all ones condition of the counter 121. If the counter 121 does not contain all ones, the value in the counter 121 is incremented by unity under control of the Count command signal from the controller 113. Additionally, if the detector 122 does not detect the all ones condition of the code counter 121, a new string is entered in the string table at the address just determined to be empty in the previous state. This is accomplished by maintaining the address in the RAM address register 130 unchanged at its previous value and controlling the RAM 131 to write the prefix code on the bus 133 from the code register 119 and the string code on the bus 132 just assigned by the code counter 121 into the prefix code and string code fields respectively of the addressed location in the RAM 131.

Thereafter, the comparator 134 tests the code number register 119 to determine if the last transmitted code was zero. If the last transmitted code was zero, then this designated a one-character string for which the character value was not in the string table. Thus the character value must be transmitted as compressor output. Accordingly, the B-bit value from the character register 116 is transferred via the bus 117 to the shift network 118 which is now controlled to serially transmit all B bits as output. The Read Input Character State is then entered to initiate a new string.

If, however, the code number register 119 contained a non-zero value, then the present character in the character register 116 is not transmitted but is utilized as the first character of the next string. Thus, the code register 119 is cleared to zero to indicate a new string and the First Table Search State is entered.

[6.] End of String State. This state is identical to the New String Entry State except that no entry is effected in the string table because no empty location was encountered. All of the previously described actions of the New String Entry State are, however, performed except for the WRITE operation into the RAM 131. When the code counter 121 is incremented, a string number is assigned to the new extended string although this string is not entered into the table. The entry does not occur because space was not found for the string and therefore the encoded string cannot be utilized for later encodings. This omission from the table may reduce the compression effectiveness of the system but does not cause incorrect operation.

Referring now to FIG. 5, a decompressor for recovering the data character sequences corresponding to the compressed code signals from the compressor of FIG. 4 is illustrated. In the decompressor of FIG. 5, a stack mechanism is utilized to reverse the order of the byte strings recovered by the decompressor. The stack is a conventional mechanism comprising a set of registers each B-bits wide. Access to the stack is through the top register only for which a read and write capability is provided. The stack has a PUSH capability whereby each register in the stack is copied into the next register down. The stack also has a POP capability whereby each register in the stack is copied into the next register up. For clarity of explanation, the decompressor embodiment of FIG. 5 is illustrated utilizing a separate stack counter which records the number of valid entries in the stack. In standard implementations of a stack, the stack counter is often integrated into the stack mechanism.

In the decompressor of FIG. 5, the string table contains $2^C$ locations, each location containing C+B bits. The location corresponding to each string code contains the code for the prefix string and the extension character for that string. The location is addressed by the string code assigned to that string. The string table of the decompressor of FIG. 5 is not initialized since no location thereof is accessed before it is written.

The decompressor of FIG. 5 receives, on a lead 150, the bit serial compressed code signals generated by the compressor of FIG. 4 and provides corresponding strings of recovered data character signals on a bus 151. The bit serial compressed code signals are provided on the lead 150 from external equipment. The external equipment also provides a data available signal on a lead 152 whenever a compressed code signal is available from the external equipment for application on the lead 150. The data available signal on the lead 152 is applied to a decompressor controller 153. The controller 153 provides control signals to all of the blocks of the decompressor of FIG. 5 via leads 154. The decompressor controller 153 sequences the decompressor of FIG. 5 through the control states thereof in a manner to be described in detail hereinbelow. When an output character is available on the bus 151, the controller 153 provides an output data strobe signal to the external equipment on a lead 155.

The decompressor of FIG. 5 includes a shift network 156 for receiving the bit serial compressed code signals on the lead 150 and providing these signals to a C-bit code register 157 via a bus 158. The shift network 156 is controlled by a code size circuit 159 to provide D-bits to the register 157 via the bus 158 where D is less than or equal to C. The size of the code controlled by the code size circuit 159 is determined by a C-bit code counter 160. The shift network 156, the code size circuit 159 and the code counter 160 are configured in a similar manner to the comparable components of the compressor of FIG. 4 to perform similar functions to those described above with respect to the compressor of FIG. 4. The shift network 156 places the D-bit compressed code signal provided on the lead 150 into the D least significant bits of the register 157. In accordance with the extant state and logical conditions existing within the decompressor of FIG. 5, the controller 153 also controls the shift network 156 to provide B-bits to the top of a stack 161 via a bus 162 to process single characters provided by the compressor of FIG. 4. The control of the shift network 156 for processing single characters may be effected in a manner similar to that described above with respect to FIG. 4.

Prior to processing a compressed code signal, the code counter 160 is set to zero via a zero valued signal applied thereto. The counter 160 may also be controlled by a count command signal from the controller 153 to increment the extant count therein by unity. The code counter 160 also provides an output to a detector 163 that signals the controller 153 via a line 164 when the count in the code counter 160 has attained the value $2^C - 1$. This value is attained by the C-bit counter 160 when the counter achieves the all-ones condition. The code counter 160 assigns string code symbol signals in ascending numerical order in a manner similar to that described with respect to the code counter 121 of the compressor of FIG. 4. These string code signals are applied to a RAM address register 165 via a bus 166.

The code register 157 may be reset to zero under control of the controller 153 via a zero valued signal applied thereto in accordance with the extant state of the decompressor of FIG. 5 and logical conditions existing therein. The output of the code counter 160 and the output of the code register 157 are applied as inputs to a comparator 167. For reasons to be explained, the comparator 167 signals the controller 153 via a lead 168 when the output of the code counter 160 is less than the output of the code register 157 and when the code counter output is greater than or equal to the code register output. Under conditions to be discussed, the contents of the code register 157 are tested for zero by a zero detector 169 which signals the controller 153 via a lead 170 when the contents of the code register 157 are zero. Under conditions to be described the code register 157 may be controlled to apply its contents to the RAM address register 165 via a bus 171 and may also be controlled to transfer its contents to a second code register 172 via a bus 173 for saving code signals for later string table updates.

The decompressor of FIG. 5 further includes a zero detector 174 for signaling the controller 153 via a lead 175 when, under conditions to be described, the contents of the code register 172 are zero. The controller 153 also controls the code register 172 to provide its contents to the RAM address register 165 via a bus 176.

An address loaded into the RAM address register 165 accesses a RAM 177 utilized to store the decompressor string table. The RAM 177 contains $2^C$ locations, each being C+B bits wide. Each string is stored in the RAM 177 by storing its C-bit prefix code and its B-bit extension character at a location addressed by the code assigned to the string. Code values are assigned to the strings entered into the decompressor string table in ascending numerical order by the code counter 160.

The RAM 177 receives a READ command and a WRITE command from the controller 153 to control the READ and WRITE functions of the RAM 177. The RAM 177 is controlled by the controller 153 to receive the code value from the code register 172 via a bus 178 and the character value from the top of the stack 161 via a bus 179 for entry into the prefix and character fields respectively of the RAM location addressed by the RAM address register 165. These values are written into the respective fields in response to the WRITE command from the controller 153.

The controller 153 also controls the RAM 177 to provide on a bus 180, in response to the READ command, the prefix code value stored in the prefix code field of the RAM location addressed by the RAM address register 165. This code value on the bus 180 is applied to the RAM address register 165 as well as to a zero detector 181. The detector 181 determines whether or not the prefix code on the RAM output 180 is equal to zero and provides a signal to the controller 153 via a lead 182 accordingly.

The controller 153 also controls the RAM 177 to provide the character value from the character field via a bus 183 to the top of the stack 161 for entry therein. The character value is provided on the bus 183 from the character field of the RAM location addressed by the RAM address register 165 in response to the READ command. The values on the RAM outputs 180 and 183 are selectively provided in accordance with the extant state and logical conditions of the decompressor of FIG. 5.

The stack 161 may be PUSHed or POPed under control of PUSH and POP signals from the controller 153. A stack counter 184 is included to maintain a count of the number of characters stored in the stack 161. The stack counter 184, under control of the controller 153, may be set to zero via a zero-valued signal applied thereto. The extant count in the counter 184 may be incremented or decremented by unity under control of the controller 153 by means of an ADD+1 and ADD−1 signal applied thereto, respectively. A zero detector 185 receives the output of the stack counter 184 and provides a signal via a lead 186 to the controller 153 when the value in the stack counter 184 attains zero.

The basic operation of the decompressor of FIG. 5 is capsulized as follows:

1. First symbol: read first B bits of compressed data, send to output; make initial string entry in location 1 of RAM
2. Read D bits of input→code register
   If zero, read B more input bits→output stack;
      go to step 4.
   Else go to step 3
3. Code register→RAM address; read RAM character (RAM)→output stack prefix code (RAM)→RAM address
if prefix code not zero, repeat step 3; else go to step 4
4. Code counter→RAM address;
   write previous code, last character→RAM take characters from output stack and put to output, LIFO: increment code counter; go to step 2.

With continued reference to FIG. 5, the following is a state machine description of the decompressor of FIG. 5.

State 0: Wait State
   wait for data available signal; go to State 1
State 1: First Code
   code counter=zero
   stack counter=zero
   code register 1=zero
   read B bits from input→top of stack; output data strobe
   go to State 2
State 2: Zero String Update
   code register 2=code register 1 add +1 to code counter
   code counter→RAM address reg.
   Write RAM=code register 2, top of stack
State 3: New Code
   code register 1→register 2
   If no data available: go to State 0
   Read D input bits→code register 1 (low order) D bits
   If code register 1=zero:
      Read B bits from input→top of stack; output data strobe
      If code counter=$2^C-1$: go to State 3
      If code counter<$2^C-1$: go to State 7
   If code register 1>code counter [abnormal case]:
      add 1 to stack count; PUSH stack [duplicating character already there]
      code register 2→RAM address
      go to State 4
   If code register 1≠0 and ≦code counter [normal case]:
      code register 1→RAM address
      go to State 4
State 4: Next Character
   Read RAM
   character (RAM)→output stack; PUSH, increment stack counter
   If prefix code (RAM)≠0: prefix code (RAM)→RAM address; repeat State 4
   If prefix code (RAM)=0: go to State 5
State 5: Update String Table
   If code register 2=0: go to State 6
   If code counter=$2^C-1$: go to State 6
   Else: add +1 to code counter
      code counter→RAM address
      write (code register 2, top of Stack)→RAM
      go to State 6
State 6: Produce Outputs
   POP; Output data strobe
   subtract 1 from stack counter
   If stack counter≠0: repeat State 6
   If stack counter=0: go to State 3
State 7: Single Character Update
   If code register 2≠0:
      add 1 to code counter
      code counter→RAM address
      Write (code register 2, top of stack)→RAM
      If code counter=$2^C-1$ go to State 3
   Go to State 2

A more detailed description of the operation of the decompressor of FIG. 5 with respect to the state machine description given above is now provided.

[0.] Wait State. While waiting for a block of compressed input code signals, the decompressor of FIG. 5 resides in this state. The data available signal on the lead 152 from the external source which supplies the compressed input code, is utilized to indicate when input code is available. When input code becomes available, the data available signal on the lead 152 signals the controller 153 to enter First Code State.

[1.] First Code State. Upon entering this state the decompressor of FIG. 5 reads in the first string code of the message. This is effected by the shift network 156 reading in bits from the input data line 150 which for the first code is zero bits. The code counter 160 is set to zero causing the code size circuit 159 to establish a code size D of zero bits. In accordance with the operation of the compressor of FIG. 4, the first compressed code signal of a data block is zero and is not transmitted explicitly. Accordingly, the code register 157 is set to zero reflecting the receipt of the first code.

This first code, as for every zero code, is followed by a B-bit character signal. Accordingly, the controller 153 controls the shift network 156 to read in the first B bits which are transmitted via the path 162 for storage at the top of the stack 161. The character at the top of the stack 161 is available on the output character bus 150. The controller 153 signals the availability of this output character by transmitting an output strobe signal on the line 155. Since this initial character is transmitted, it is not held in the stack 161 for later transmission. Accordingly, the stack counter 184 is initialized to contain a zero value. The initial code having been processed, the controller 153 controls the decompressor of FIG. 5 to enter the Zero String Update State to enter this first string into the string table.

[2.] Zero-String Update State. When the string code of zero is received, an entry for the one-character string that immediately follows the zero string code is placed in the string table under the next code number to be allocated. Accordingly, the code counter 160 is incremented by unity and the resulting value is transmitted to the RAM address register 165 via the bus 166. The value in the code register 157, which is always zero in this situation, is moved to the code register 172 via the bus 173. The RAM 177 is then controlled to WRITE the contents of the code register 172 via the bus 178 as the prefix code value of the new string. This value is written into the prefix code field at the address specified by the RAM address register 165. Additionally, the last character put out on the output character bus 151, which is available at the top of the stack 161 via the bus 179 is written into the character field of the addressed location of the RAM 177 as the extension character of the string. Thus, in this Zero-String Update State a prefix code of zero and an extension character of the last B bits received is written, creating the appropriate single-character string at the RAM location addressed by the code for that string. The New Code State is then entered to process the next input code signal.

[3.] New Code State. At the beginning of the processing to recover a parsed character string, a new compressed code signal of D bits is read in from the line 150. Initially, however, the prior code in the code register 157 is transferred to the code register 172 via the bus 173 to save it for the next string table update. The data available signal on the line 152 is tested to determine if a new code signal is available. If data is not available, then the end of the current data block has been attained and the decompressor is returned to the Wait State having completed its present task.

If data is available, the next D bits of input are read in from the input line 150 into the low-order D bits of code register 157 via the shift network 156 and the bus 158. The value of D is determined by the code size circuit 159 in accordance with the present value in the code counter 160.

The new code value is tested for zero to determine if it is the null code string with a new character appended. Accordingly, zero detector 169 signals the controller 153 via the lead 170 if the contents of the code register 157 are zero. If zero is detected, the following actions are performed. The next B bits of input data are read from input line 150 by the shift network 156. The B bits are transmitted to the top of the stack 161 via the bus 162 and the output strobe on the line 155 is activated to signal to the external equipment that a new valid character is available. The detector 163 then determines if the extant count in the code counter 160 is equal to $2^C-1$, which is the all-ones condition of the counter 160. If the code counter 160 contains all ones, the string table in the RAM 177 is full and no further updates are added thereto. Processing of the current input code is then complete and the decompressor is controlled to reenter this New Code State to process the next compressed code signal. If, however, the code counter 160 contains a value less than $2^C-1$, then the character just received is utilized to update the string table as an extension of the previously received code signal and also as a new single character string in its own right. The decompressor of FIG. 5 effects this update by entering the Single Character Update State.

If the code register 157 did not contain a zero value, then its contents are compared via the comparator 167 with the existing count in the code counter 160. If the code register 157 contains a larger value than the code counter 160, the comparator 167 signals the controller 153 via the lead 168 that the unusual special case has occured where the code just received is the extension of the previous code, which extension is not yet entered into the string table. In this situation, the final character of the new code string equals the extension character of the prior string, which is also the initial character of the new code string, which is the beginning character of the prior string, which is the character just decoded and residing on the top of the stack 161. Accordingly, a PUSH is executed on the stack 161 to retain this character for the new string and the stack counter 184 is incremented by unity. Thereafter, the code signal in the code register 172, which is the prefix code for the present string, is transferred to the RAM address register 165 via the bus 176 and the Next Character State is entered to effect normal processing of the remainder of this string.

If, however, the value in the code register 157 is neither zero nor greater than the existing count in the code counter 160, then the value in the code register 157 is a normal string code. This code is processed by transferring the code value from the code register 157 via the bus 171 into the RAM address register 165 and entering the Next Character State to begin processing the characters of the string.

[4.] Next Character State. Upon entering this state, the RAM address register 165 contains a string code to be decompressed into the corresponding string of characters. Accordingly, the string table RAM 177 is controlled to read the contents of the location addressed by the code value in the register 165 producing the prefix string code and extension character for the string on the buses 180 and 183 respectively. The extension character on the bus 183 is applied to the top of the stack 161 and PUSHed down and the stack counter 184 is incremented by unity.

The prefix code on the bus 180 is tested by the zero detector 181 to determine if it is zero. If the prefix code is zero, the addressed location in the string table contains the last byte in the current string and the Update String Table State is entered to complete processing the string data which now exists in the stack 161. If the prefix code is not zero, the prefix string contains one or more characters which are processed by transferring the prefix code on the bus 180 into the RAM address register 165 and reentering this Next Character State.

[5.] Update String Table State. After a string code has been decompressed into its sequence of characters, the last character generated is utilized as the extension character for updating the string table with the prior code value. This occurs, however, only in the absence of two conditions. If the zero detector 174 determines that the prior code value in the code register 172 is equal to zero, the update of this string has already occured and the Produce Outputs State is immediately entered. If the detector 163 determines that the value in the code counter 160 is equal to $2^C-1$, then the string table is full and no further updates are possible. In this case the Produce Outputs State is also immediately entered. If neither of these conditions occur, the update is effected as follows. The contents of the code counter 160 is incremented by unity and the incremented value transferred to the RAM address register 165 via the bus 166. The RAM 177 is controlled to write into the addressed location which is the site of the next assigned code value, the prefix code value from the code register 172 via the bus 178 and the extension character from the top of the stack 161 via the bus 179. Thereafter, the Produce Outputs State is entered.

[6.] Produce Outputs State. The characters of the present string are now resident in the stack 161 and will be transmitted LIFO on the bus 151 to provide the proper output character sequence. The stack 161 is POPed up whereby the next character to be transmitted is placed on the top of the stack 161 and is consequently available on the output bus 151 to the external equipment. The output strobe signal on the line 155 is issued by the controller 153 to signal that a valid character is available. The stack counter 184 is decremented by unity and the stack count is tested for zero by the zero detector 185. If the count in the stack counter 184 is not zero, then more data is in the stack and this Produce Outputs State is reentered to provide another character. If, however, the count in the stack counter 184 is zero, then the transmission of the characters of the current string is complete and the New Code State is entered to begin the next string.

[7.] Single Character Value. When a single character is received as an explicit extension on a code zero string, this character is utilized as the extension character to create a new string in the string table based on the prior code value. This string table update occurs only if the contents of the code register 172, containing the prior code value is detected as non-zero by the zero detector 174. If the zero detector 174 determines that the contents of the code register 172 is zero, this string table update is not performed. If the code register 172 contains a non-zero value, the update is effected by incrementing the code counter 160 by unity and transmitting the incremented value to the RAM address register 165 via bus 166. The RAM 177 is controlled to write the prefix string code from the code register 172 via the bus 178 and the extension character from the top of the stack 161 via the bus 179 into the prefix code and character fields respectively of the location addressed by the new code in the RAM address register 165.

The contents of the code counter 160 is then tested by the detector 163 to determine if the counter 160 has attained the value $2^C-1$. If this value has been attained, the string table is full and further updates are not performed. The Next Code State is then entered to begin processing of the next string. If, however, the contents of the counter 160 is less than $2^C-1$, then the Zero String Update State is entered to update the string table with the single-character string just received.

The above described embodiments of the present invention illustrated in FIGS. 2–5 are implemented in hardware utilizing, for example, discrete digital logic components. FIGS. 6–9 depict an embodiment of the invention implemented in software for loading into a stored program digital computer for performing data signal compression and decompression in accordance with the invention. Specifically, the programmed computer embodiment of the invention implements in software the highest performance embodiment of the invention described above with respect to FIGS. 2 and 3. The programmed computer embodiment of FIGS. 6–9 is implemented in FORTRAN and thus can run on any computer equipped with a compatable FORTRAN compiler. The compressor and decompressor are each implemented as a subroutine to be called in a main program that would manage the input and output data. The compressor and decompressor subroutines utilize character manipulation subprograms named IBITSG and IBITSP for performing get and put operations respectively on an array of arbitrary length, tightly packed symbols independent of the underlying computer word size. The IBITSG and IBITSP subprograms get and put respectively one symbol of a selected bit length in a specified position of a linear array of equal size symbols. IBITSG is implemented as a function subprogram for use in the compressor and decompressor subroutines and IBITSP is implemented as a subroutine subprogram to be called in the execution of the compressor and decompressor subroutines. FIGS. 8 and 9 illustrate IBITSG and IBITSP, respectively. These subprograms are provided by way of example, equivalent subprograms being readily created by normally skilled computer programmers.

The compressor and decompressor subroutines illustrated respectively in FIGS. 6 and 7 are named COMP and DECOMP respectively. The COMP subroutine compresses strings of 9-bit character signals into 12-bit code symbol signals and DECOMP decompresses 12-bit code symbol signals into strings of 9-bit character signals. The subroutines, as illustrated, utilize a computer having a 36-bit word length. The subroutines are readily converted to operate on 8-bit characters with a 32-bit computer. It is appreciated that although COMP and DECOMP are constructed as subroutines, they could equivalently be configured as separate programs in their own right. Although FORTRAN is utilized to implement these routines, other equivalent programming languages could be utilized to the same effect.

Referring now to FIG. 6, the COMP (IBUFA, NA, IBUFB, NB) subroutine is illustrated. The COMP subroutine performs data compression upon a block of NA 9-bit characters contained in an array IBUFA. COMP produces compressed code comprised of NB 12-bit symbols in an array IBUFB.

COMP utilizes internally a 4096-integer array ITABLE for storing the compressor string table. Statement 14, of FIG. 6, accordingly, dimensions the ITABLE array. Each location in ITABLE corresponds to an encountered character string whose compressed code equals the address in the table. In the present implementation, one is added to the code in creating the address because FORTRAN does not support zero-based arrays. Each table location storing a string contains the code of the prefix of the string. The string table is initialized to be empty. The empty condition of ITABLE is effected by filling the table with null symbols called IFILL having the value 512, which is an arbitrarily selected code value which will not be utilized for any string. Statement 15 of FIG. 6 defines the IFILL quantity. Thus, it is appreciated that IFILL has the value $2^B$ where B in this embodiment is 9. The embodiment of FIG. 6 utilizes an internal character counter NCHA established and initialized to contain unity by statement 16. The NCHA counter provides the index of the next input character to be read. The compressor of FIG. 6 also utilizes an internal output symbol counter NB which is defined and initialized to unity by FORTRAN statement 17. The symbol counter NB provides the index of the next output symbol to be generated. FORTRAN statments 18 and 19 initialize the string table to contain all null-values by inserting IFILL iin all 4096 locations. Since the first 513 locations of ITABLE are never accessed, these locations do not require initialization. Initialization of these locations may be omitted if it is desired to save the time so to do.

The first character is read in by FORTRAN statement 20 by means of the IBITSG function which retrieves from IBUFA nine bits from the first character position. This input character is, at statement 20, converted into its preassigned single-character string code value, equal to the character value, by storing the value in the variable NODENO. The variable NODENO is utilized to contain the code value for any partial input string of characters already read. Statements 16–20 of FIG. 6 complete initialization for processing a block of data and startup of the process.

Statement 21 of FIG. 6 provides the entrance to the main processing loop where each new input character is read. The statement 21 is provided with a label 100 to effect jumps thereto. The character index counter NCHA is incremented at statement 21. Statement 22 determines if NCHA is greater than the input parameter NA and if NCHA exceeds NA, then all input characters have been consumed and a jump is effected to statement 40 for the data block termination processing. Statement 40 is provided with a label 400 to effect the jump.

In the normal situation, when a new character is available, statement 23 utilizes the IBITSG function subprogram to read the NCHAth 9-bit character from the input buffer IBUFA into a variable named NOWCHR. Statement 24 utilizes the value in NOWCHR and the value in NODENO, the prior string code to calculate the hash address LOC of the string defined by the code in NODENO extended by the character in NOWCHR. The hash function delineated in statement 24 is identical to that discussed above with respect to FIGS. 2 and 3 except that the character value is not bit reversed. It is inconvenient to reverse a character value bit-wise in software although it is convenient so to do in the above described hardware embodiments. Additionally, the hash function of statement 24 differs from the hash function utilized in the hardware embodiments in that the value of LOC has one added thereto in creating the address because FORTRAN does not support zerobased arrays. After this first hash address is generated, a counter variable N is defined and initialized to one by statement 25 indicating that the value in LOC is the first of N possible search sites in the table. In the present embodiment, N is selected as 7.

The statement 26 of FIG. 6 provides the entrance to the table search loop which utilizes N as the count variable. Statement 26 is provided with a label 120 so that jumps may be effected thereto. Statement 26 determines if LOC contains a legal value. Accordingly, statement 26 determines if LOC is greater than 513. It is appreciated that symbol codes zero is 511 are preasigned to single character strings and 512 is reserved for the null symbol and all the codes are increased by one because of the FORTRAN convention discussed above. If LOC does not contain a legal new address, a jump is effected to statement 31 to generate another attempt. Statement 31 is provided with a label 130 to effect the jump. Normally, the value in LOC is a legal address and the contents of the string table at that location are checked against the existing character string code at statement 27. If the contents of the addressed string location are not equal to the existing string code, then the sought string has not been previously assigned this code value and a jump to statement 30 is effected to continue the search. Statement 30 is provided with a label 130 to effect the transfer. If, however, the code values tested at statement 27 are equal, the prior string extended by the current character is an accepted string already stored in the string table with code value equal to LOC−1. Statement 28 transforms this view string into the prior string by storing the code LOC−1 at the variable NODENO. Statement 29 then effects a transfer back to statement 21 to read another input character and repeat the string extension process.

If, at statement 27, the previous ITABLE access failed, a jump is effected to statement 30 via the label 130 assigned to statement 30. Statement 30 determines if the location LOC is empty by testing the equality of the contents thereof against the initial value IFILL. If the location is empty, the sought string is defined as not existing in the table and a jump is effected to statement 35 to update the table and terminate the current string. The jump to statement 35 is effected by the label 200 assigned to the statement. If, however, the tests performed by statements 27 and 30 both fail, another location must be checked unless the last location investigated constitutes the seventh attempt to find a string or an empty location. Accordingly, statement 31 increments the search count N by unity and statement 32 tests this next search count to determine if it exceeds seven. If N now exceeds seven, further searches are not attempted, the string is defined as not existing in the table and a transfer is effected to statement 36. The label 300 is assigned to the statement 36 to effect the jump. If N, however, is not yet equal to seven, then the search for the sought string is continued at a new hash address. Statement 33 calculates a new hash address from the prefix string node number which is added to the just tested node number. The addition is effected modulo 4096 to maintain the table length. This new node number is also increased by one to provide a FORTRAN-legal location LOC. With the new hash address calculated, statement 34 effects a transfer to statement 26, via the label 120, to effect the search procedure with respect to the new address.

Statement 35 demarcates the state in the program to which statement 30 effected a transfer when an empty location was encountered. The string table is now updated by entering, at the empty location, the extended string just observed but not yet in the table. Statement 35 effects the update by writing the prefix node number stored in NODENO into the empty location which effects the assignment of that location address as the compressed code symbol signal of the new string. Thereafter, end of string processing is effected by statements 36–38. Statement 36 calls IBITSP to put the present node number in NODENO into the output buffer IBUFB as a 12-bit code in the NBth 12-bit location in that buffer. Statement 37 then transforms the last received input character, which was not included in the string just transmitted, into a code number to provide the beginning of the next string search. The character signal becomes the code signal by transferring the value in NOWCHR into NODENO. Statement 38 then increments the output symbol count NB by unity to provide the output position for the string just started and statement 39 transfers back to statement 21 via the label 100 to fetch another input character signal and perform the main iteration loop.

Statement 40 demarcates the state in the program where all input characters in the current data block have been processed. Accordingly, statement 40 calls IBITSP to put the last 12-bit code value in NODENO, which reflects the last partial string, in the NBth position of the output buffer IBUFB. Statement 41 then returns control to the main program that called the subroutine COMP of FIG. 6 to compress the data block of NA character signals contained in the input buffer IBUFA.

Referring to FIG. 7, the decompression subroutine DECOMP (IBUFB, NB, IBUFA, NA) is illustrated that performs decompression upon a block of NB 12-bit compressed code symbol signals received in a buffer IBUFB, and packs the resultant recovered 9-bit character signals into output buffer IBUFA and returns a count NA of the number of resulting characters.

The decompressor DECOMP of FIG. 7 stores the string table thereof in a 4096-word array ITABLE dimensioned in statement 10. Statement 11 parameterizes the number of bits in the output character signals utilizing the data constant NBITSA set to 9 for the embodiment of FIG. 7. Statement 12 establishes an input compressed symbol count variable NCHB which indicates the next input symbol signal to be read. Statement 12 also initializes NCHB to one. Statement 13 establishes an output character count variable NA indicating the number of characters which have been put in the output buffer IBUFA. Statement 13 also initializes NA to one in anticipation of the first output character to be placed into the output buffer. This occurs at statement 18 in a manner to be described. Each string table location in ITABLE is organized with three integer valued fields. Each string table location stores an encountered string of characters via the contents of the location, via the prefixed string code at bits 1–12, the length of the prefix string at bits 13–24 and the string extension character at bits 25–36. The address of a location is the code number of the string stored thereat. In the present embodiment the address is the code signal plus one for the reasons discussed above with respect to FIG. 6.

Statements 14 and 15 initialize the string table ITABLE to indicate that all locations are empty. All zeros is arbitrarily selected to indicate the empty condition for programming convenience. All zeros is an illegal configuration that can never occur in storing a legitimate string. When a legitimate string has a prefix code of zero, it has a prefix string length of 1 and therefore the all zeros configuration can only be established in the string table during this initialization procedure.

Initial processing is begun at statement 16 by reading in the first input code symbol and storing this node code in a variable NOCODE which is utilized to contain the most recently read in code symbol. Statement 16 effects the reading in of the first input code symbol by utilizing the IBITSG function subprogram of FIG. 8 to input the NCHBth 12-bit item in IBUFB. Statement 17 defines the variable ICHAR which is utilized to contain the most recently generated character. Since the value just placed in NOCODE at statement 16 is known to be a single character code, it is immediately utilized to fill ICHAR at statement 17. Statement 18 places this character in the output buffer IBUFA at the NAth site of the NBITSA sized items. Statement 18 effects this character outputting operation by calling the IBITSP subroutine of FIG. 9. Thereafter, in preparation for a later update of the string table with an extension of this string, statement 19 saves the string code in NOCODE in a variable NODOLD and statement 20 saves the length of the string in LEVOLD with a known value of one for this first string. Having thus initialized the decompression process, the main iteration is entered at statement 21. Statement 21 is provided with a label of 100 to effect later transfer thereto.

At the commencement of the main loop, statement 21 increments the symbol count NCHB by unity and then statement 22 performs a test to determine if the input symbol count, NCHB, exceeds the number, NB, of symbols to be processed. If the extant symbol count NCHB is greater than the number of available symbols to be decompressed, the process is complete and DECOMP terminates by transferring to the subroutine return statement 57. Statement 57 is provided with a label 510 to effect the transfer. When, however, further input data to be decompressed is available, statement 23 reads in the next available symbol from the NCHBth 12-bit position of IBUFB. Statement 23 utilizes the IBITSG function subprogram of FIG. 8 to effect this operation. Statement 23 places the read in code symbol into NODENO which is a variable utilized to hold the code of the present partial string being processed. Statement 24 also places the input code symbol into NOCODE utilized to contain the most recent input code. Statement 25 tests the code value in NODENO to determine if it exceeds 512 and if so, the program transfers to statement 28 to begin the normal decomposition process. The value 512 is equal to $2^B$ for reasons discussed above with respect to FIGS. 2, 3 and 6. Statement 28 is assigned the label 120 to effect the transfer thereto. If, however, the test of statement 25 determines that the new symbol in NODENO has a value less than 512, the code represents a single character string of preassigned code value which is interpreted directly. This single character string has a prefix string length of zero. Accordingly, statement 26 establishes a working variable LEVEL to hold the prefix string length of a string being processed and in this instance is set to zero. Thereafter, statement 27 transfers the program to statement 40 whereat processing of all single character strings is achieved. Statement 40 is provided with a label 210 to effect the transfer thereto.

When statement 25 effects the transfer to statement 28 via the label 120, a new code value is resident in NODENO which is known to represent a multi-character string. The statement 28 tests for the unusual special situation where the present string is the extension of the immediately prior string which is not as yet entered in the string table. The test is effected by examining the contents of the string table location of the new code to determine if this string code value has been previously defined. Actually, the table is addressed at NODENO plus one to satisfy the FORTRAN requirements discussed above. If the table entry is not zero, then the string has been previously defined and a transfer is effected to statement 33 to continue normal processing. The label 130 is assigned to statement 33 to effect the transfer. If, however, the test of statement 28 determines that the table entry is empty, then the present code is known to be the extension of the immediately prior string. Thus, the prefix string length of the present string is equal to the prior string length. Accordingly, statement 29 places the prior string length in LEVOLD into the prefix string length variable LEVEL. In this special case, the first character to be provided is known to be the extension character of the immediately prior string which is the originating character of this present string, which character equals the originating character of the immediately prior string, which is the character resident in the variable ICHAR. Thus, statement 30 calls the IBITSP subroutine of FIG. 9 to place the existing value in ICHAR into the output buffer IBUFA at the location at the end of the new string. This location is determined from the NA count of all prior characters that have been provided by the decompressor plus the length value of the prefix string in LEVEL plus one. After outputting the first character of the new string, statement 31 transfers the prior string code in NODOLD into NODENO as the prefix string to be decoded and statement 32 effects a transfer to statement 34 to enter the main loop wherein a string is decoded. The label 200 is assigned to the statement 34 to effect transferring thereto.

When the test performed by statement 28 indicates that the current code represents a string already in the table, then the normal code interpretation path is followed to statement 33 via the label 130. Statement 33, using the FORTRAN BITS function, reads the length of the prefix of the accessed string from the 12 bits starting at bit 13 of the location of ITABLE addressed by the contents of NODENO plus one. This prefix string length is saved in LEVEL for the later update of the string table in which the extension of this string is entered.

Statement 34 is the entrance into the main loop for decomposing the partial string represented by the code in NODENO into its prefix string and extension character. Statement 34 examines the code of the partial string for value greater than 512 to determine if the partial string has a prefix string. If the code of the partial string is less than 512, it is a single character reserved value and transfer is effected to statement 40 to process and terminate this single character string. The label 210 assigned to statement 40 is utilized to effect the transfer. In the continuing case where NODENO provides a legitimate multi-character code, the contents of the table location thereof are accessed utilizing the bits function of FORTRAN. Accordingly, statement 35 saves the 12-bit prefix string length starting at bit 13 in a temporary variable INDEX. Statement 36 places the NBITSA bit extension character starting at bit 25 in ICHAR. Statement 37 then calls the IBITSP subroutine of FIG. 9 to place this character into the output buffer IBUFA at its character location at one position beyond the sum NA of all prior strings plus the length of the prefix string associated with this character as stored in INDEX. Statement 38 thereafter utilizes the BITS function to place the 12-bit prefix string code from the accessed location in ITABLE starting with bit 1 thereof and placing this code value into NODENO for further processing. This string decomposition procedure is then repeated by transferring, via statement 39, back to statement 34 utilizing the label 200.

Statement 40 demarcates the location in the program to which processing is transferred when the remaining partial string code in NODENO denotes a single character string. Transfer to the statement 40 is effected at the end of processing for each string. Since the code for the single character string is the character value, statement 40 transfers the contents of NODENO into ICHAR. Statement 41 then outputs the character by calling the subroutine IBITSP of FIG. 9 to place the character in output buffer IBUFA at the first character position past the sum NA of the prior strings. Thereafter, the table update phase of the program is entered at statement 42 to determine if the immediately prior string extended by this last character can be entered in the string table. The table update phase of the program utilizes the multi-search hashing procedures discussed above, with the searched count variable N initially set to 1 at statement 42. Statement 43 computes the first hash address at which an update will be attempted from the extension character value in ICHAR and the prior string code in NODOLD. The quantity 1 is added to the hash address to convert it to a FORTRAN legal table location for the reasons discussed above, and this location address is stored in LOC.

Statements 44 and 45 examine the search site to determine if it is suitable for storing the extended string. Statement 44 determines if the address of the search site is for one of the preassigned locations 1 through 513, corresponding to codes 0 through 512, which are unusable for extended string storage. If the address in LOC corresponds to one of the preassigned locations 1 through 513, a transfer is effected to statement 46 to generate further hash addresses. The transfer is effected by label 218 assigned to statement 46. If, however, the address is greater than 513, statement 45 tests the contents of the LOC location to determine if the location is empty. If the search site is empty, a transfer to statement 50 is effected, via the label 220, to update the string table. If, however, the search site is not empty, the program sequences to statement 46 to compute the hash address for another location. Statement 46 increments the search count N by 1 and statement 47 tests the incremented search count against the search length limit, set at 7 for this embodiment, to determine if further search sites should be attempted. If the search length limit has been exceeded, then no acceptible space remains in the table for the extended string and a transfer is effected to statement 53 to finish the string processing. A label 225 is assigned to the statement 53 to effect the transfer. If, however, another search is permitted, statement 48 calculates a new hash address value for LOC by a second hash function on NODOLD added to the just utilized code value, modulo 4096, plus 1 to satisfy FORTRAN requirements. Statement 49 then effects a reentry to statement 44, via the label 215, to renew the search.

When it had been determined, via the statement 45, that the search site having a legitimate address was empty, a transfer was effected to statement 50. The address of the located site is the same as that developed by the compression program of FIG. 6 for this extended string and consequently, this address is utilized as the code number for the string. This is accomplished by writing the descriptive data for the string at the accessed location. Accordingly, statement 50 utilizes the BITS FORTRAN function to write the prefix string code from NODOLD in the first 12 bits of the location. Statement 52, utilizing the BITS FORTRAN function, writes the prefix string length from LEVOLD into the next 12 bits of the location and statement 51 writes the extension character from ICHAR into the remaining bits of the location. Thereafter, at statements 53–55, end of string bookkeeping is effected. Statement 53 transfers the contents of NOCODE into NODOLD thereby transforming the most recently read code symbol in NOCODE into the prior code NODOLD. Statement 54 increments the prefix string length in LEVEL of this prior code by unity to provide the string length of the prior string when it is entered as a prefix string on the next table update. This prefix string length quantity is stored in LEVOLD. Statement 55 increases the count NA of output characters by the content of LEVEL plus one which is the length of the last string just processed. After this end of string bookkeeping is performed, statement 56 effects a reentry to statement 21, via the label 100 to process the next input compressed code symbol signal.

Statement 57 demarcates the end of data block processing. In the program of FIG. 7, cleanup processing is not require and consequently control is returned to the main program that called the subroutine DECOMP of FIG. 7 to decompress the block of compressed code symbol signals stored in the input buffer IBUFB.

Although the embodiment of the invention described with respect to FIGS. 6–9 was exemplified as compression and decompression subroutines provided in the FORTRAN programing language, the compression and decompression routines could be formated as main programs in their own right. The programs may be utilized as software in, for example, a main-frame computer or microprocessor, or may be configured as firmware in ROM chips for use, for example, in the input and output electronic circuitry of a magnetic disc or tape controller. Additionally, programming languages other than FORTRAN may be employed or other program codings in the same or other languages may be utilized in performing the functions described herein to practice the data signal compression and decompression procedures of the present invention.

It is appreciated that a programmed version of a microprocessor or other type computer provides an embodiment of the capabilities and techniques described herein which is indistinguishable from a digital logic version as described herein except in choice of primitive data operations and of state sequencing control implementation. The economy of producing standardized data manipulation operations in a general purpose computer together with the readily altered form of control logic, as stored in a rewriteable memory rather than in wires and logic gates, provides embodiments which can be economically produced and quickly altered in minor ways for specific applications, at the relative loss of some execution speed.

The hash function described above with respect to the hardware embodiment of the invention maps code, character tuples comprising 20-bit items (12 code bits and 8 character bits) into a 12-bit address space. The hash function, utilized with respect to the software embodiment maps 21-bit items (12 code bits and 9 character bits) into a 12-bit address space. Such a hash function may be utilized since not all 20-bit values and 21 bit values occur. The hash function described above has been designed to satisfy the criteria set forth above. Additionally, the hash function is designed to minimize conflicts arising from the assumptions that; firstly, some individual input characters are more heavily utilized than others and low numbered characters are more likely to be heavily used; and secondly, some codes are more heavily utilized than others and early occuring codes will be most heavily utilized. An alternative hash function to that described above may be implemented by generating the first hash address by rotating the code left 5 bits and exclusive-oring the character bits into the high order bits of the rotated code. Three succeeding addresses are generated by adding, modulo 4096, to the previous 12-bit hash address, a new 12-bitnumber comprising the code number reversed end-to-end and rotated left three bits with the least significant bit of the resulting number forced to one.

The embodiments of the invention described with respect to FIGS. 2–5 utilize a variety of optional techniques that may be combined in combinations different from those disclosed above to provide alternative embodiments of the invention. The compressor-decompressor system of FIGS. 2 and 3 initializes the string table with all of the single character strings whereas the compressor-decompressor system of FIGS. 4 and 5 initializes the string table only with the null string. With respect to FIGS. 2 and 3, the single character string initialization is effected by utilizing the single characters themselves as the code numbers of these strings and permitting access to the string table only for addresses greater than $2^B$. Since all of the characters to be compressed are B-bit bytes, all characters have values less than $2^B$. Thus, a single character string, having a code value less than $2^B$, is transmitted by the compressor of FIG. 2 without string table access and is recognized at the decompressor of FIG. 3 as a single character string and may be transmitted thereby directly. The compressor-decompressor system of FIGS. 4 and 5, which effects table initialization with only the null string, accesses the string tables thereof with all addresses from zero to $2^C-1$. Thus, in the compressor embodiment of FIG. 4, a single character string is entered into the string table by hashing the received character with the code number zero and entering the string prefix code of zero at the resulting hash address. The decompressor of FIG. 5 also stores the single character strings by entering the prefix code zero at the appropriate string table locations.

As a further option, the compressor-decompressor system of FIGS. 2 and 3 assigns the hash table address of a string as the string code symbol signal thereof, whereas the compressor-decompressor system of FIGS. 4 and 5 sequentially assigns string code symbol signals to the strings as the new string entries are created.

As a still further option, the compressor-decompressor system of FIGS. 2 and 3 assigns fixed length code values to the strings, whereas the compressor-decompressor system of FIGS. 4 and 5 assigns varying length code symbols to the strings. In the embodiment of FIGS. 2 and 3, the fixed length is the full address length of C bits whereas in the embodiment of FIGS. 4 and 5 the length of the compressed code symbols increases during the processing of the data block until a length of C bits is obtained.

As a further option, the decompressor of FIG. 3 utilizes a string length indexing mechanism to effect decompression string reversal, whereas the decompressor of FIG. 5 utilizes a push-down stack for this purpose.

As discussed above, each of the options is implemented in the embodiments disclosed in FIGS. 2–5. These options may be recombined by the routineer in the art to form additional embodiments within the purview of the invention. Since each of the above four options has two possibilities, sixteen separate embodiments can be constructed. For example, with respect to the compressor of FIG. 4, the sequentially assigned string codes may be transmitted as fixed length outputs of C-bits. In that case, the code size circuit 123 would be eliminated. In such an embodiment, the decompressor of FIG. 5 would then also eliminate the code size circuit 159. If in such a compressor-decompressor system the option of initializing the string tables with the null-string only is incorporated (as in FIGS. 4 and 5 as described) the shift network 118 of the compressor of FIG. 4 may then be utilized to transmit the fixed length C-bit compressed code signals as well as the B-bit bytes following transmission of the all zeros null code. In a similar manner, the decompressor of FIG. 5 would utilize the shift network 156 for accepting the fixed length C-bit code signals as well as for accepting the B-bit byte signals following receipt of the all zeros null code. If, however, the compressor-decompressor system of FIGS. 4 and 5 was modified, as described, to include the fixed length code option and further modified to utilize string table initialization with all of the single character strings, the shift network 118 of the compressor of FIG. 4 would then be eliminated with the output provided from the code number register 119 on the bus 120. In such an embodiment, the decompressor of FIG. 5 would then eliminate the shift network 156 with the input code being applied directly to the code register 157 via the bus 158. Futhermore, the code counter 121 of FIG. 4 would be set to $2^B$ after the string table initialization is effected and the code counter 160 of FIG. 5 would be initialized to $2^B$ instead of zero. Additionally, the bus 117 of FIG. 4 from the character register 116 would be applied to the code number register 119 in order to insert a B-bit character in the B least significant positions of the register 119. The C-B most significant positions of the register 119 would be set to zero. The described modifications to the compressor-decompressor system of FIGS. 4 and 5 would improve performance at the expense of compression efficiency.

It is appreciated from the foregoing, that the relationship between the registers 116 and 119 of the altered FIG. 4 and the operations thereof are identical to the relationship between and the operations of the registers 17 and 19 of FIG. 2. Additionally, in the altered embodiment utilizing table initialization with all of the single character strings, the zero valued input to the comparator 134 of FIG. 4 is not utilized. Single character strings, including single character strings of characters encountered for the first time, are transmitted in a manner identical to that described above with respect to FIG. 2 rather than transmitting, for newly encountered characters, the all zeros null code signal followed by the new character.

Additionally, in the modified compressor-decompressor embodiment of FIGS. 4 and 5, utilizing table initialization with all single character strings and fixed length compressed code signals, the decompressor of FIG. 5 is altered by comparing the contents of code register 157 to $2^B$ rather than to zero to determine if a multi-character string or a single-character string has been received. The bus 162 is provided from the code register 157 for transmitting single character strings directly to the stack 161. The code on the bus 180 is compared to $2^B$ rather than to zero to determine when the first character in a string has been encountered in a backward trace through the string table of RAM 177. A bus from the RAM address register 165 to the top of the stack 161 is provided to transfer the last character of a traced string to the stack 161 in a manner similar to that described above with respect to the decompressor of FIG. 3. The zero detector 174 of FIG. 5 will no longer be required in this modified embodiment. The zero valued input into the register 157 will also not be required.

If it is desired to effect a compressor-decompressor embodiment that initializes the string table with all of the single character strings, sequentially assigns string code symbols as new string entries are created and transmits varying length compressed code signals; the system of FIGS. 4 and 5 may be accordingly altered. The compressor of FIG. 4 may be modified by setting the code counter 121 to $2^B$ after the string table initialization is effected and initializing the counter 160 of FIG. 5 to $2^B$ instead of zero. Additionally, the bus 117 of FIG. 4 from the character register 116 is applied to the code number register 119 in the manner described above. Similarly, the decompressor of FIG. 5 is altered by comparing the contents of the code register 157 to $2^B$ rather than to zero to determine if a multi-character string or a single-character string has been received. Additionally, the code on the bus 180 is compared to $2^B$ rather than to zero to determine when the first character in a string has been encountered in a backward trace through the string table of RAM 177. In this embodiment, the zero detector 174 of FIG. 5 as well as the zero valued input into the register 57 will not be required.

If it is desired to modify the compressor-decompressor embodiment of FIGS. 2 and 3 to initialize the string tables with only the null string, the comparator 26 is modified to discard hash function addresses equal to the null code and to the empty code. Additionally, the comparator 32 is modified to compare the value in the code number register 19 with zero to determine if the B-bit character in the character register 17 should be transmitted after transmission of the null code. The B-bit character may be transmitted as a zero filled C-bit character or alternatively a shift network mechanism may be utilized similar to that described above. In a similar manner, the decompressor of FIG. 3 may be modified by utilizing the comparator 58 to detect zero rather than $2^B$ and to control the code register 57 to transmit single characters following null codes directly.

It will be appreciated from the foregoing that the embodiment of FIGS. 2 and 3 provides highest performance at the expense of compression efficiency. Furthermore, the embodiment of FIGS. 4 and 5 provides highest compression at the expense of performance. The above described modification which combines the options: table initialization with all single character strings; string code symbols sequentially assigned as new strings are created; transmitting fixed length code values; and string reversal utilizing a push-down stack——is a compromise between highest performance and highest compression that may provide a preferred embodiment depending on the application. It is further appreciated that the stack mechanization of FIG. 5 for string reversal is readily interchangeable with the string length indexing mechanism of FIG. 3. When string length indexing is utilized, the level field is appended to the RAM locations and the indexing mechanism components 61, 78, 85, 86, 88, and 91 of FIG. 3 are utilized. When the stack mechanism is utilized, the level field of the RAM is not required and the components 161, 184 and 185 of FIG. 5 are employed.

As described above, FIGS. 6–9 illustrate a programmed computer embodiment of the invention utilizing the options of the highest performance hardware embodiment of FIGS. 2 and 3. It is appreciated that various software embodiments of the invention may be provided utilizing various combinations of the options described above with program coding therefor routinely provided by normally skilled computer programmers.

In summary, the invention utilizes a string table for storing strings of characters observed in the input data except, perhaps, for strings such as single-character strings with which the table may be initialized at the beginning of a data block to be compressed. The strings are entered into the table dynamically as they are observed in the input data character stream so that the stored set of strings adapts to the statistics of the data being processed. Each string of X characters comprises a prefix string of $X-1$ characters and one extension character where the prefix string is also a member of the table. Each string is assigned a code symbol and when a stored string is encountered in the input data character stream, the encountered string is expressed in the compressed data by its code symbol. Each string is stored either explicitly or implicitly in terms of the code symbol of the string, the code symbol of the string prefix and the string extension character. The stream of data character signals is processed by parsing the stream into strings of characters, each string having been located in the string table. The parsing is achieved in a single pass into the data character stream starting from a beginning character and separating off one character at a time. Each character is utilized to extend the previous string if the extended string matches one located in the string table. Otherwise, the character is utilized to start a new string. Basically, the compression process may be considered as a recurring step applied to each character in sequence as it is encountered in the input data stream as follows.

A string S, from the input data stream, has been located in the string table. For the next following character c, in the input data stream, the table is searched to determine if the extended string Sc exists therein. If the string Sc exists in the table, the next following character is examined and the procedure is reapplied. If the extended string does not exist in the table, the code symbol for the string S is transmitted as the compressed output and the string Sc is entered in the table. The character c is then utilized as the first character of the next string and the procedure is reapplied utilizing the next following input character.

The search for the string Sc is performed by combining the character c with the code for the string S to provide a string table address. If the extended string Sc is already stored at the location, the string Sc exists in the table. If the location is empty, the string does not exist in the table. In that instance, the code symbol for the string S is transmitted and the string Sc is entered at the empty location. Preferably, the combination of the character c with the code for the string S is performed by the limited-search hash procedure discussed above. During compression, the hash table mechanization is utilized to store the non-preassigned strings because the number of possible strings defined at a point in the compression procedure will exceed the actual number of strings and the size of an economical memory by a substantial factor. Generally a hash table is one in which each memory location thereof may contain an assigned set of possible items allocated by a selected mathematical function. In the limited search hash table process described hereinabove, each possible address appears only in a small group of a limited number of memory addresses. This criterion limits the amount of searching required to locate a possible entry or to define that it is not in the table.

During compression, a string is retrieved utilizing at least its prefix code to identify it. During decompression, a string is identified by its code symbol directly. The string table of the decompressor stores, the string prefix code and the extension character at each string location, which string location is addressable by the code for the string. Thus, an input code symbol is looked up in the table which provides the prefix string and the extension character. The prefix string is then looked up in the table providing a new prefix string and a new extension character. The process is repeated until the initial single character string is encountered.

In the above described embodiments of the invention, hash addresses or numerically increasing values are utilized as the compressed code symbol signals for the strings. It is appreciated that constisant modifications or isomorphisms of these values may also be utilized as the compressed code symbol signals for the strings.

Several variations of the above described embodiments of the invention may be effected as follows utilizing readily apparent design modifications.

If the compressor of the present invention is providing compressed data to a synchronous channel such as a disc or tape system, it may be desirable to increase or decrease the speed of the compressor so that its output rate matches the input rate of the channel so as to minimize buffering. The output rate of the compressor is governed by the compression ratio achieved, and the compression ratio varies in accordance with the type of data encountered. If the compressor encounters poorly compressible data so that it produces output symbols at too high a rate, the compressor can be slowed down by waiting between input characters. If the compressor encounters very compressible data so that it produces output symbols too slowly, the compressor can be speeded up by reducing compressor efficiency. This may be effected by aborting character string extension whenever an output code symbol is required. Thus, strings of less than the longest match may be selected whenever the compressor falls behind the required output rate. Additionally, since the compression effectiveness tends to be low when processing the early part of the data block and increases as the processing of the block continues, it may be desirable to begin compression prior to initiating transfer of the compressed code stream to compensate for compression rate variations. It is appreciated that this latency loss occurs only on writing compressed data into the external equipment from the compressor. In reading compressed data from the external equipment, decompression can be initiated as soon as the compressed data is available from the external source.

A further modification may involve utilizing a counter as part of the compressor to limit parsed string lengths to be less than a selected value. This feature would reduce the variation in instantaneous compression ratios so that the output rate of compressed data would be more predictable. Additionally, such a counter would reduce the cost of the equipment in the decompressor that is sensitive to maximum string length. Such equipment includes the push-down stack 161 of FIG. 5 as well as the level registers 78 and 85, the address adder 86, the outpointer register 88 and the level field of the RAM 75 of FIG. 3.

A further modification of the invention may be to utilize the same set of hardware apparatus for both compression and decompression although not concurrently. There is sufficient similarity between the compression and decompression requirements, especially the RAM, that substantial cost savings can be obtained by this modification when the loss of concurrency is acceptible. Additionally, a content-addressable or associative memory might be utilized instead of the RAM in the compression implementations. Such a modification would eliminate the requirement for hashing and reduce control complexity.

The present invention achieves adaptive reversible data compression and decompression on a wide variety of data types without any prior knowledge of the data statistics or the form of data redundancy. Good compression ratios are achieved with high performance operation suitable for use with the fastest present day magnetic tape and magnetic disc data storage systems as well as with the fastest present day commercial communication links.

While the invention has been described in its preferred embodiments, it is to be understood that the words which have been used are words of description rather than of limitation and that changes may be made within the purview of the appended claims without departing from the true scope and spirit of the invention in its broader aspects.

I claim:

1. In a data compression and data decompression system, compression apparatus for compressing a stream of data character signals into a compressed stream of code signals, said compression apparatus comprising storage means for storing strings of data character signals encountered in said stream of data character signals, said stored strings having code signals associated therewith, respectively, means for searching said stream of data character signals by comparing said stream to said stored strings to determine the longest match therewith, means for inserting into said storage means, for storage therein, an extended string comprising said longest match with said stream of data character signals extended by the next data character signal following said longest match, means for assigning a code signal corresponding to said stored extended string, and means for providing the code signal associated with said longest match so as to provide said compressed stream of code signals.

2. The compression apparatus of claim 1 in which each said stored string of data character signals comprises a prefix string of data character signals and an extension character signal, wherein said prefix string corresponds to a string stored in said storage means, and said storage means comprises memory means having a plurality of locations accessable by a plurality of address signals, respectively, said stored strings of data character signals being stored at said locations, respectively, the address signal for accessing a location providing the code signal corresponding to the string stored thereat, the string being stored at the location by storing at least the code signal corresponding to the prefix string of the stored string.

3. The compression apparatus of claim 2 in which said means comprising said compression apparatus comprises digital computer means responsive to said stream of data character signals and programmed to compress said stream of data character signals into said compressed stream of code signals.

4. The compression apparatus of claim 2 in which said locations of said storage means storing said strings store only said code signals of said prefixes of said strings respectively.

5. The compression apparatus of claim 2 in which said searching means includes hash function generation means responsive to said string code signals and to said data character signals for hashing a data character signal with a code signal to provide a hash signal, said hash signal providing a potentional address signal for accessing said memory means.

6. The compression apparatus of claim 5 in which said hash function generation means comprises means for providing a predetermined number of hash signals in response to a code signal and a character signal, said predetermined number of hash signals providing potential address signals for accessing said memory means.

7. The compression apparatus of claim 6 further including means for determining if all of said predetermined number of hash signals are unsuitable as address signals for accessing said memory means.

8. The compression apparatus of claim 6 in which said hash function generation means comprises means for providing said predetermined number of hash signals in response to a code signal and a character signal so that a code signal hashed with different character signals provides different hash signals, respectively.

9. The compression apparatus of claim 6 in which said hash function generation means comprises means for providing said predetermined number of hash signals in response to a code signal and a character signal so that any two code signal-character signal tuples providing the same first hash signal will not provide the same second hash signal.

10. The compression apparatus of claim 5 further including initializing means for storing in the locations of said memory means an empty indicia signal representing that the location storing said empty indicia signal is empty, said empty indicia signal having a value not equal to any compressed code signal.

11. The compression apparatus of claim 10 in which said searching means includes said memory means and further comprises character register means for holding a data character signal, code register means for holding a compressed code signal, said character register means and said code register means being coupled to said hash function generation means for providing the data character signal and the code signal held therein, respectively, to said hash function generation means for generating said hash signal in accordance therewith, address register means for holding an address signal, said address register means being coupled to receive said hash signal from said hash function generation means and further coupled to access said memory means at the location thereof corresponding to the address signal held in said address register means, comparator means coupled to said memory means and to said code register means for comparing the contents of a location of said memory means addressed by said address register means with the code signal held in said code register means and with said empty indicia signal to determine equality therewith, means for transferring the address signal held in said address register means to said code register means, and control means coupled to said comparator means for controlling the transfer of the current address signal held in said address register means to said code register means and the transfer of a new data character signal into said character register means when the contents of the location of said memory means accessed by said current address signal equals the code signal held in said code register means.

12. The compression apparatus of claim 11 further including means for transferring a data character signal from said character register means to said code register means to transform said data character signal into the compressed code signal corresponding thereto.

13. The compression apparatus of claim 12 in which said transfer means comprises means for transferring said data character signal from said character register means to the lower significant positions of said code register means, and means for zeroing the remaining high order positions of said code register means.

14. The compression apparatus of claim 12 in which said control means includes means for controlling the transfer of the data character signal held in said character register means to said code register means when said comparator means determines that the location of said memory means addressed by the address signal held in said address register means contains said empty indicia signal, thereby to provide the first code signal in a search for a longest match.

15. The compression apparatus of claim 8 in which said initializing means comprises means for providing said empty indicia signal to said memory means for entry therein, and an initializing counter coupled to said address register means for providing sequential address signals thereto so as to enter said empty indicia signal into sequential locations of said memory means.

16. The compression apparatus of claim 11 in which said inserting means comprises means for transferring said code signal held in said code register means to said memory means, and said control means includes means for controlling the insertion of said code signal held in said code register means into the location of said memory means addressed by said address signal held in said address register means when said comparator means determines that the location of said memory means addressed by said address signal held in said address register means contains said empty indicia signal.

17. The compression apparatus of claim 16 in which said means comprising said compression apparatus comprises digital computer means responsive to said stream of data character signals and programmed to compress said stream of data character signals into said compressed stream of code signals.

18. The compression apparatus of claim 16 in which said assigning means comprises said address register means providing said address signal held therein to said memory means when said comparator means determines that said location of said memory means addressed by said address signal contains the empty indicia signal, said address signal held in said address register means when said comparing means detects said empty indicia signal providing the compressed code signal corresponding to said stored extended string.

19. The compression apparatus of claim 11 in which said means for providing the code signal associated with said longest match comprises output means coupled to said code register means for providing the code signal held in said code register means when said comparator means determines that the addressed location in said memory means contains the empty indicia signal.

20. The compression apparatus of claim 19 in which said output means comprises an output bus.

21. The compression apparatus of claim 19 in which said hash function generation means includes means for providing a further hash signal up to a predetermined number of hash signals when said comparator means determines that the location of said memory means addressed by the address signal in said address register means contains a value neither equal to the code signal held in said code register means nor to the empty indicia signal.

22. The compression apparatus of claim 21 in which said means comprising said compression apparatus comprises digital computer means responsive to said stream of data character signals and programmed to compress said stream of data character signals into said compressed stream of code signals.

23. The compression apparatus of claim 21 further including further comparator means coupled to receive said hash signals from said hash function generation means for comparing said hash signals to said empty indicia signal and in which said control means includes means for controlling said hash function generation means to provide said further hash signal, up to said predetermined number of hash signals, when said further comparator means determines that a provided hash signal is equal to said empty indicia signal.

24. The compression apparatus of claim 21 in which said control means including means for controlling the transmission by said output means, of the code signal held in said code register means when none of the locations of said memory means addressed by said predetermined number of hash signals contains a code signal equal to the code signal held in said code register means or the empty indicia signal.

25. The compression apparatus of claim 24 further including means for transferring a data character signal from said character register means to said code register means to transform said data character signal into the compressed code signal corresponding thereto, and in which said control means includes means for controlling the transfer of the data character signal in said character register means to said code transfer means after transmission of said code signal on said output bus means.

26. The compression apparatus of claim 21 in which each data character signal comprises a B-bit byte signal and each compressed code signal comprises a C-bit signal whereby B is less than C.

27. The compression apparatus of claim 26 in which said empty indicia signal comprises a signal not greater than $2^B$ and not equal to any data character signal.

28. The compression apparatus of claim 27 in which said empty indicia signal comprises a signal equal to $2^B$.

29. The compression apparatus of claim 27 further including further comparator means coupled to receive said hash signals from said hash function generation means for comparing said hash signals to $2^B$, and in which said control means includes means for controlling said hash function generation means to provide said further hash signal, up to said predetermined number of hash signals, when said further comparator means determines that a provided hash signal is not greater than $2^B$.

30. The compression apparatus of claim 29 in which said character register means comprises a B-bit register, and said code register means comprises a C-bit register.

31. The compression apparatus of claim 30 further included means for transferring a data character signal from said character register means to said code register means to transform said data character signal into the compressed code signal corresponding thereto, said means for transferring a data character signal held in said character register means to said code register means comprising means for transferring the B-bits held in said character register means to the B lower significant positions of said code register means, means for zeroing the C-B most significant positions of said code register means.

32. The compression apparatus of claim 1 in which each said stored string of data character signals comprises, a prefix string of character signals and an extension character signal wherein said prefix string corresponds to a string stored in said storage means, and said storage means comprises memory means having a plurality of locations accessable by a plurality of address signals, respectively, said stored strings of data character signals being stored at said locations, respectively, a string being stored at a location by storing thereat the code signal corresponding to the string stored thereat and the code signal corresponding to the prefix string of the stored string.

33. The compression apparatus of claim 32 in which said means comprising said compression apparatus comprises digital computer means responsive to said stream of data character signals and programmed to compress said stream of data character signals into said compressed stream of code signals.

34. The compression apparatus of claim 32 in which each said location of said memory means comprises
   a prefix code field for storing the code signal corresponding to the prefix string of the string stored thereat, and
   a string code field for storing the code signal of the string stored thereat.

35. The compression apparatus of claim 34 in which said searching means includes hash function generation means responsive to said string code signals and to said data character signals for hashing a data character signal with a code signal to provide a hash signal, said hash signal providing a potential address signal for accessing said memory means.

36. The compression apparatus of claim 35 in which said hash function generation means comprises
   means for providing a predetermined number of hash signals in response to a code signal and a character signal, said predetermined number of hash signals providing potential address signals for accessing said memory means.

37. The compression apparatus of claim 36 further including means for determining if all of said predetermined number of hash signals are unsuitable as address signals for accessing said memory means.

38. The compression of claim 35 further including initializing means for storing in said string code fields of said locations of said memory means an empty indicia signal representing that the location storing said empty indicia signal is empty, said empty indicia signal having a value not equal to any compressed code signal.

39. The compression apparatus of claim 38 in which said searching means includes said memory means and further comprises
   character register means for holding a data character signal,
   code register means for holding a compressed code signal,
   said character register means and said code register means being coupled to said hash function generation means for providing the data character signal and the code signal held therein, respectively, to said hash function generation means for generating said hash signal in accordance therewith,
   address register means for holding an address signal,
   said address register means being coupled to receive said hash signal from said hash function generation means and further coupled to access said memory means at the location thereof corresponding to the address signal held in said address register means,
   comparator means coupled to said memory means and to said code register means for comparing the contents of the prefix code field of a location of said memory means addressed by said address register means with the code signal held in said code register means to determine equality therewith,
   detector means coupled to said memory means for detecting when the contents of the string code field of a location of said memory means addressed by said address register means is equal to said empty indicia signal,
   means for transferring the contents of the string code field of a location of said memory means addressed by said address register means to said code register means, and
   control means coupled to said comparator means for controlling the transfer of the contents of the string code field of the location of said memory means accessed by the current address signal held in said address register means to said code register means and the transfer of a new data character signal into said character register means when the contents of the prefix code field of the location of said memory means accessed by said current address signal equals the code signal held in said code register means.

40. The compression apparatus of claim 39 in which said means comprising said compression apparatus comprises digital computer means responsive to said stream of data character signals and programmed to compress said stream of data character signals into said compressed stream of code signals.

41. The compression apparatus of claim 39 further including means for entering a null string code signal into said code register means for initiating a search for a longest match.

42. The compression apparatus of claim 39 further including means for transferring a data character signal from said character register means to said code register means to transform said data character signal into the compressed code signal corresponding thereto.

43. The apparatus of claim 39 in which said initializing means comprises,
   means for providing said empty indicia signal to said memory means for entry into the string code fields of the locations of said memory means, and
   an initializing counter coupled to said address register means for providing sequential address signals thereto so as to enter said empty indicia signal into the string code fields of sequential locations of said memory means.

44. The compression apparatus of claim 39 in which said inserting means comprises
   code counter means for generating numerically increasing code signals,
   means for transferring a code signal from said code counter means to said memory means for insertion into the string code field of an addressed location, and
   means for transferring said code signal held in said code register means to said memory means for insertion into the prefix code field of said addressed location and in which
   said control means includes means for controlling the insertion of said code signal provided by said code counter means and said code signal held in said code register means into the string code field and prefix code field, respectively, of the location of said memory means addressed by the address signal held in said address register means when said detector means determines that the location of said memory means addressed by said address signal held in said address register means contains said empty indicia signal.

45. The compression apparatus of claim 44 in which said means comprising said compression apparatus comprises digital computer means responsive to said stream of data character signals and programmed to compress said stream of data character signals into said compressed stream of code signals.

46. The compression apparatus of claim 44 in which said control means includes means for controlling the entering of said null string code signal into said code register means when said detector means determines that the string code field of the location of said memory means addressed by the address signal held in said address register means contains said empty indicia signal,
thereby initiating said code register means so as to begin a new search into said stream of data character signals with the character signal held in said character register means.

47. The compression apparatus of claim 42 in which said control means includes means for controlling the transfer of the data character signal held in said character register means to said code register means when said detector means determines that the string code field of the location of said memory means addressed by the address signal held in said address register means contains said empty indicia signal, thereby to provide the first code signal in a search for a longest match.

48. The compression apparatus of claim 44 in which said assigning means comprises said code counter means providing the code signal held therein to the string code field of the location of said memory means addressed by said address register means when said detector means determines that said string code field of said addressed location contains said empty indicia signal.

49. The compression apparatus of claim 39 in which said means for providing the code signal associated with said longest match comprises output means coupled to said code register means for providing the code signal held in said code register means when said detector means determines that the string code field of the addressed location in said memory means contains the empty indicia signal.

50. The compression apparatus of claim 44 in which said means for providing the code signal associated with said longest match comprises output means coupled to said code register means for providing the code signal held in said code register means when said detector means determines that the string code field of the addressed location in said memoy means contains the empty indicia signal.

51. The compression apparatus of claim 50 in which said output means comprises shift network means coupled to said code register means for providing the code signal held in said code register means in bit serial fashion.

52. The compression apparatus of claim 51 in which said output means further includes a code size circuit coupled to said code counter means for providing a code size signal to said shift network means to control the number of bits provided by said shift network means in accordance with the code signal provided by said code counter means.

53. The compression apparatus of claim 51 further including means for entering a null string code signal into said code register means for initiating a search for a longest match.

54. The compression apparatus of claim 53 further including means for transferring the data character signal held in said character register means to said output means and in which
said comparator means includes means for comparing the code signal held in said code register means with said null string code signal to determine equality therebetween, and
said control means including means for controlling said output means to provide said data character signal provided by said character register means after providing said null string code signal provided by said code register means when said detector determines that the string code field of the location addressed by the address signal held in said address register means contains said empty indicia signal.

55. The compression apparatus of claim 49 in which said hash function generation means includes means for providing a further hash signal up to a predetermined number of hash signals when said detector means determines that the string code field of the location of said memory means addressed by the address signal in said address register means does not contain the empty indicia signal and said comparator means determines that the prefix code field of the location of said memory means addressed by the address signal in said address register means contains a value not equal to the code signal held in said code register means.

56. The compression apparatus of claim 55 in which said means comprising said compression apparatus comprises digital computer means responsive to said stream of data character signals and programmed to compress said stream of data character signals into said compressed stream of code signals.

57. The compression apparatus of claim 55 in which said control means includes means for controlling the transmission, by said output means, of the code signal held in said code register means when the prefix code field and the string code field of none of the locations of said memory means addressed by said predetermined number of hash signals contain a code signal equal to the code signal held in said code register means and the empty indicia signal, respectively.

58. The compression apparatus of claim 44 in which said initializing means comprises,
means for providing said empty indicia signal to said memory means for entry into the string code field of the location of said memory means addressed by the address signal held in said address register means, and
an initializing counter coupled to said address register means for providing sequential address signals thereto so as to enter said empty indicia signal into the string code fields of sequential locations of said memory means.

59. The compression apparatus of claim 58 in which said empty indicia signal comprises all zeros and said initializing means includes means for zeroing said code counter means thereby providing all zeros to the string code fields of the locations of said memory means for initialization thereof.

60. The compression apparatus of claim 41 in which said null string code signal comprises all zeros and said means for entering said null string code signal into said code register means comprises means for zeroing said code register means.

61. The compression apparatus of claim 36 in which said hash function generation means comprises means for providing said predetermined number of hash signals in response to a code signal and a character signal so that a code signal hashed with different character signals provides different hash signals, respectively.

62. The compression apparatus of claim 36 in which said hash function generation means comprises means for providing said predetermined number of hash signals in response to a code signal and a character signal so that any two code signalcharacter signal tuples providing the same first hash signal will not provide the same second hash signal.

63. in the data compression and data decompression system of claim 1, decompression apparatus for recovering said stream of data character signals from said compressed stream of code signals.

64. The decompression apparatus of claim 63 in which said decompression apparatus comprises
- means for receiving said stream of code signals,
- memory means for storing strings of data character signals corresponding to said received code signals, respectively,
- said memory means having a plurality of locations accessable by a plurality of address signals, respectively,
- said strings of data character signals being stored at said locations, respectively,
- said received code signals providing address signals for accessing the locations of said memory means storing the strings corresponding to said received code signals, respectively,
- each said stored string of data character signals comprising a prefix string of data character signals and an extension character signal wherein said prefix string corresponds to a string stored in said memory means,
- a string being stored at a location by storing thereat the code signal corresponding to the prefix string of the stored string and the extension character of the stored string,
- means for extracting the data character signals from a string strored at a location of said memory means addressed by a received code signal,
- further inserting means for inserting in said memory means an extended string comprising the code signal received prior to the last received code signal and an extension character signal comprising the last extracted data character signal in the string of data character signals extracted in response to said last received code signal,
- further assigning means for assigning a code signal corresponding to said extended string, said assigned code signal providing an address signal for accessing a location of said memory means at which to store said extended string, and
- means for reversing said extracted string of data character signals,
- thereby providing said recovered stream of data character signals.

65. The decompression apparatus of claim 64 in which each said location of said memory means comprises
- a prefix code field for storing the code signal corresponding to the prefix string of the string stored thereat, and
- a character field for storing the extension character signal of the string stored thereat.

66. The decompression apparatus of claim 65 in which said means comprising said decompression apparatus comprises digital computer means responsive to said compressed stream of code signals and programmed to recover said stream of data character signals from said compressed stream of code signals.

67. The decompression apparatus of claim 65 in which said receiving means comprises code register means for holding a received code signal.

68. The decompression apparatus of claim 67 in which said extracting means includes said memory means and further comprises
- address register means for holding an address signal, said address register means being coupled to receive said code signal held in said code register means and further coupled to access said memory means at the location thereof corresponding to the address signal held in said address register means,
- means for transferring the contents of the prefix code field of a location of said memory means addressed by said address register means to said address register means,
- providing means for providing the contents of the character field of said location of said memory means addressed by said address register means,
- comparator means responsive to said contents of said prefix code field transferred to said address register means for determining when said contents of said prefix code field indicates the initial character of the string stored at the location addressed by the received code signal, and
- control means coupled to said comparator means for controlling the transfer, to said address register means, of the contents of the prefix code field of the location of said memory means accessed by the current address signal held in said address register means and the providing by said providing means of the contents of the character field of the location of said memory means accessed by the current address signal held in said address register means until the contents of the prefix code field transferred to said address register means indicates the initial character of the string stored at the location of said memory means addressed by said received code signal.

69. The decompression apparatus of claim 67 in which said means comprising said decompression apparatus comprises digital computer means responsive to said compressed stream of code signals and programmed to recover said stream of data character signals from said compressed stream of code signals.

70. The decompression apparatus of claim 68 in which
- said comparator means comprises means for determining when the contents of said prefix code field transferred to said address register means contains a single character string code signal, and
- said control means comprises means coupled to said comparator means for controlling said transfer of said contents of said prefix code field to said address register means and said providing of said contents of said character field by said providing means until said comparator means determines that the contents of said prefix code field transferred to said address register means is said single character string code signal.

71. The decompression apparatus of claim 70 in which said means comprising said decompression apparatus comprises digital computer means responsive to said compressed stream of code signals and programmed to recover said stream of data character signals from said compressed stream of code signals.

72. The decompression apparatus of claim 70 in which
each said data character signal comprises a B-bit byte signal,
each said single character string code signal is less than $2^B$, and
said comparator means comprises means for determining when the contents of said prefix code field transferred to said address register means is less than $2^B$.

73. The decompression apparatus of claim 68 in which
said comparator means comprises means for determining when the contents of said prefix code field transferred to said address register means is a null string code signal, and
said control means comprises means coupled to said comparator means for controlling said transfer of said contents of said prefix code field to said address register means and said providing of said contents of said character field by said providing means until said comparator means determines that the contents of said prefix code field transferred to said address register means is said null string code signal.

74. The decompression apparatus of claim 73 in which said means comprising said decompression apparatus comprises digital computer means responsive to said compressed stream of code signals and programmed to recover said stream of data character signals from said compressed stream of code signals.

75. The decompression apparatus of claim 68 in which said further inserting means comprises
further code register means coupled to said code register means for holding said prior received code signal,
means for transferring the code signal held in said further code register means to said memory means for insertion into the prefix code field of an addressed location,
last character holding means for holding said last extracted character signal,
means for transferring the character signal held in said last character holding means to said memory means for insertion into the character field of said addressed location, and
means for transferring said assigned code signal to said address register means and in which,
said control means includes means for controlling the insertion of the code signal held in said further code register means and the character signal held in said last character holding means into the prefix code field and character field, respectively, of the location of said memory means addressed by said assigned code signal held in said address register means.

76. The decompression apparatus of claim 75 in which said means comprising said decompression apparatus comprises digital computer means responsive to said compressed stream of code signals and programmed to recover said stream of data character signals from said compressed stream of code signals.

77. The decompression apparatus of claim 72 in which said further inserting means comprises p1 further code register means coupled to said code register means for holding said prior received code signal,
means for transferring the code signal held in said further code register means to said memory means for insertion into the prefix code field of an addressed location,
last character holding means coupled to receive the contents of said prefix code field transferred to said address register means when said comparator means determines that said contents of said prefix code field transferred to said address register means is less than $2^B$,
means for transferring the character signal held in said last character holding means to said memory means for insertion into the character field of said addressed location, and
means for transferring said assigned code signal to said address register means and in which
said control means includes means for controlling the insertion of the code signal held in said further code register means and the character signal held in said last character holding means into the prefix code field and the character field, respectively, of the location of said memory means addressed by said assigned code signal.

78. The decompression apparatus of claim 73 in which said further inserting means comprises
further code register means coupled to said code register means for holding said prior receive code signal,
means for transferring the code signal held in said further code register means to said memory means for insertion into the prefix code field of an addressed location,
last character holding means coupled to receive the character signal provided by said providing means when said comparator means determines that the contents of said prefix code field transferred to said address register means is said null string code signal,
means for transferring the character signal held in said last character holding means to said memory means for insertion into the character field of said addressed location, and
means for transferring said assigned code signal to said address register means and in which
said control means includes means for controlling the insertion of the code signal held in said further code register means and the character signal held in said last character holding means into the prefix code field and the character field, respectively, of the location of said memory means addressed by said assigned code signal.

79. The decompression apparatus of claim 78 in which said means comprising said decompression apparatus comprises digital computer means responsive to said compressed stream of code signals and programmed to recover said stream of data character signals from said compressed stream of code signals.

80. The decompression apparatus of claim 75 in which said further assigning means comprises hash function generation means responsive to the code signal held in said further code register means and the character signal held in said last character holding means for hashing said character signal with said code signal to provide a hash signal,
said hash signal providing a potential address signal for accessing said memory means,
said assigned code signal being provided by a hash signal suitable for accessing said memory means.

81. The decompression apparatus of claim 80 in which said hash function generation means comprises means for providing a predetermined number of hash signals in response to said code signal held in said further code register and said character signal held in said last character holding means,
  said predetermined number of hash signals providing potential address signals for accessing said memory means,
  said assigned code signal being provided by one of said predetermined number of hash signals suitable for accessing said memory means.

82. The decompression apparatus of claim 81 further including initializing means for storing in the prefix code fields of said locations of said memory means an empty indicia signal representing that the location storing said empty indicia signal is empty, said empty indicia signal having a value not equal to any compressed code signal.

83. The decompression apparatus of claim 82 in which said initializing means comprises
  means for providing said empty indicia signal to said memory means for entry into the prefix code fields of the locations of said memory means, and
  an initializing counter coupled to said address register means for providing sequential address signals thereto so as to enter said empty indicia signal into the prefix code fields of sequential locations of said memory means.

84. The decompression apparatus of claim 83 in which
  each said data character signal comprises a B-bit byte signal, and
  said empty indicia signal comprises a signal not greater than $2^B$ and not equal to any data character signal.

85. The decompression apparatus of claim 84 in which
  said comparator means includes further comparator means for comparing said hash signals provided to said address register means to said empty indicia signal, and
  said control means includes means for controlling said hash function generation means to provide said further hash signal, up to said predetermined number of hash signals, when said further comparator means determines that a provided hash signal is equal to said empty indicia signal.

86. The decompression apparatus of claim 84 in which
  said comparator means includes further comparator means for comparing said hash signals provided to said address register means to $2^B$, and
  said control means includes means for controlling said hash function generation means to provide said further hash signal, up to said predetermined number of hash signals, when said further comparator means determines that a provided hash signal is not greater than $2^B$.

87. The decompression apparatus of claim 81 in which said hash function generation means comprises means for providing said predetermined number of hash signals in response to a code signal and a character signal so that a code signal hashed with different character signals provides different hash signals, respectively.

88. The decompression apparatus of claim 81 in which said hash function generation means comprises means for providing said predetermined number of hash signals in response to a code signal and a character signal so that any two code signal-character signal tuples providing the same first hash signal will not provide the same second hash signal.

89. The decompression apparatus of claim 82 further including detector means coupled to said memory means for detecting when the prefix code field of a location of said memory means addressed by the address signal in said address register means contains the empty indicia signal.

90. The decompression apparatus of claim 89 in which said hash function generation means includes means for providing a further hash signal, up to said predetermined number of hash signals, when said detector means determines that the prefix code field of the location of said memory means addressed by a hash signal in said address register means does not contain the empty indicia signal.

91. The decompression apparatus of claim 89 in which said extracting means further includes abnormal case extracting means operative in response to said detector means detecting the empty indicia signal in the prefix code field of a location of said memory means addressed by the address signal in said address register means provided by a received code signal in said code register means, said abnormal case extracting means comprising
  means for providing the data character signal held in said last character holding means as the first data character signal extracted by said extracting means from the string corresponding to said received code signal, and
  means for applying said prior received code signal held in said further code register means to said address register means and in which,
  said control means includes means for controlling the providing of said first data character signal by said last character holding means and the applying of said prior received code signal from said further code register means to said address register means,
  said extracting means extracting the data character signals remaining after said first data character signal in response to said prior received code signal.

92. The decompression apparatus of claim 75 in which said further assigning means comprises code counter means for generating numerically increasing code signals,
  said assigned code signal being provided by a code signal from said counter means.

93. The decompression apparatus of claim 92 in which said extraction means further includes abnormal case extracting means comprising
  comparator means coupled to said code counter means and said code register means for determining when a received code signal in said code register means is greater than a code signal provided by said code counter means,
  means for providing the data character signal held in said last character holding means as the first data character signal extracted by said extracting means from the string corresponding to said received code signal, and
  means for applying said prior received code signal held in said further code register means to said address register means and in which said control means includes means for controlling the providing of said first data character signal by said last character holding means and the applying of said prior received code signal from said further code register means to said address register means, said extracting means extracting the data character signals remaining after said first data character signal in response to said prior received code signal.

94. The decompression apparatus of claim 92 in which said receiving means comprises shift network means coupled to receive said code signals in bit serial fashion and coupled to provide said code signals to said code register means.

95. The decompression apparatus of claim 94 in which said receiving means further includes a code size circuit coupled to said code counter means for providing a code size signal to said shift network means to control the number of bits received by said shift network means in accordance with the code signal provided by said code counter means.

96. The decompression apparatus of claim 77 further including single character string providing means comprising
further comparator means coupled to said code register means for determining when a received code signal in said code register means is not greater than $2^B$,
means for transferring a received code signal from said code register means to said last character holding means and in which
said control means includes means for controlling the transferring a received code signal from said code register means to said last character holding means when said further comparator means determines that said received code signal in said code register means is not greater than $2^B$.

97. The decompression apparatus of claim 78 in which each said data character signal comprises a B-bit byte signal and in which said decompression apparatus further includes new character providing means comprising
further comparator means coupled to said code register means for determining when a received code signal in said code register means is said null string code signal, and
means for transferring the B-bit byte signal received by said receiving means following said received null string code signal to said last character holding means and in which
said control means comprises means for controlling transferring said received B-bit byte signal from said receiving means to said last character holding means when said further comparator means determines that said received code signal in said code register means is said null string code signal.

98. The decompression apparatus of claim 75 in which each location of said memory means further includes a level field for storing a level signal representative of the number of data character signals comprising the prefix string of the string stored at the location and in which said reversing means comprises
character register means coupled to receive the data character signal from the character field of a location of said memory means accessed by said extracting means in response to the current address signal held in said address register means, and
location address generation means responsive to the level signal in the level field of said location accessed by said extracting means for providing a location address signal associated with said data character signal provided to said character register means for positioning said data character signal in an output buffer so as to arrange said data character signals provided by said extracting means in an order reversed from that in which said data character signals are extracted from said memory means.

99. The decompression apparatus of claim 98 in which said means comprising said decompression apparatus comprises digital computer means responsive to said compressed stream of code signals and programmed to recover said stream of data character signals from said compressed stream of code signals.

100. The decompression apparatus of claim 98 in which said location address generation means comprises
pointer register means for holding a base address signal,
address adder means for adding the level signal from the level field of the location of said memory means accessed by the current address signal in said address register means to said base address signal in said pointer register means to provide the location address signal for the data character signal provided from the character field of said location,
first level register means for holding the level signal from the level field of the currently accessed location of said memory means,
second level register means for saving a level signal for a subsequent insertion of an extended string into said memory means, and
means for incrementing the level signal in said first level register by unity and storing the incremented level signal in said second level register means.

101. The decompression apparatus of claim 100 in which said location address generation means further includes means for coupling said second level register means and said pointer register means to said address adder means so as to increment said base address signal in said pointer register means by said level signal in said second level register means.

102. The decompression apparatus of claim 100 in which
said further inserting means further includes means for transferring the level signal in said second level register means to said memory means, and
said control means further includes means for controlling the insertion of the level signal in said second level register means into the level field of the location of said memory means addressed by said assigned code signal held in said address register means.

103. The decompression apparatus of claim 98 in which said character register means comprises said last character holding means.

104. The decompression apparatus of claim 75 in which said reversing means comprises push-down stack means coupled to receive and hold said data character signals extracted by said extracting means for providing said data character signals received from said extracting means in a reverse order from that in which said data character signals were received from said extracting means.

105. The decompression apparatus of claim 104 in which said push-down stack means comprises a stack of registers having a top-of-stack register through which said data character signals enter and leave said stack, and said top-of-stack register comprises said last character holding means.

106. The compression apparatus of claim 11 in which said means comprising said compression apparatus comprises digital computer means responsive to said stream of data character signals and programmed to compress said stream of data character signals into said compressed stream of code signals.

107. In a data compression and data decompression method, a compression method for compressing a stream of data character signals into a compressed stream of code signals, said compression method comprising the steps of storing, in the locations of a memory, strings of data character signals encountered in said stream of data character signals, respectively, said stored strings having code signals associated therewith, respectively, said locations of said memory being accessable by a plurality of address signals, respectively, each said string of data character signals comprising a prefix string of data character signals and an extension character signal, said prefix string corresponding to a string stored in said memory, searching said stream of data character signals by comparaing said stream to said stored strings to determine the longest match therewith, inserting into said memory, for storage therein, an extended string comprising said longest match with said stream of data character signals extended by the next data character signal following said longest match, assigning a code signal corresponding to said stored extended string, and providing the code signal associated with said longest match so as to provide said compressed stream of code signals.

108. The compression method of claim 107 in which said storing step comprises storing a string at a location of said memory by storing, at the location, the code signal corresponding to the prefix string of the stored string, the address signal for accessing a location of said memory providing the code signal corresponding to the string stored at the location.

109. The compression method of claim 108 in which said searching step includes the step of hashing a data character signal with a code signal to provide a hash signal, said hash signal providing a potential address signal for accessing said memory.

110. The compression method of claim 109 in which said hashing step comprises hashing a data character signal with a code signal to provide a predetermined number of hash signals, said predetermined number of hash signals providing potential address signals for accessing said memory.

111. The compression method of claim 110 further including the step of determining if all of said predetermined number of hash signals are unsuitable as address signals for accessing said memory.

112. The compression method of claim 109 further including the step of initializing said memory by storing in the locations thereof an empty indicia signal representing that the location storing said empty indicia signal is empty, said empty indicia signal having a value not equal to any compressed code signal.

113. The compression method of claim 112 in which said searching step comprises holding a data character signal in a character register, holding a compressed code signal in a code register, hashing the data character signal held in said character register and the code signal held in said code register to provide a hash signal in accordance therewith, holding an address signal in an address register, said address register being coupled to receive said hash signal and further coupled to access said memory at the location thereof corresponding to the address signal held in said address register, comparing the contents of a location of said memory addressed by the address signal held in said address register with the code signal held in said code register and with said empty indicia signal to determine equality therewith, and transferring the current address signal held in said address register to said code register and transferring a new data character signal into said character register when the contents of the location of said memory accessed by said current address signal equals the code signal held in said code register.

114. The compression method of claim 113 further including the step of transferring a data character signal from said character register to said code register to transform said data character signal into the compressed code signal corresponding thereto.

115. The compression method of claim 114 in which said step of transferring said data character signal from said character register to said code register comprises transferring said data character signal from said character register to the lower significant positions of said code register, and zeroing the remaining high order positions of said code register.

116. The compression method of claim 113 in which said initializing step comprises providing said empty indicia signal to said memory for entry therein, and providing sequential address signals to said address register so as to enter said empty indicia signal into sequential locations of said memory.

117. The method of claim 113 in which said inserting step comprises inserting the code signal held in said code register into the location of said memory addressed by the address signal held in said address register when said comparing step determines that the location of said memory addressed by said address signal held in said address register contains said empty indicia signal.

118. The compression method of claim 114 further including the step of transferring the data character signal held in said character register to said code register when said comparing step determines that the location of said memory addressed by the address signal held in said address register contains the empty indicia signal, thereby to provide the first code signal for the execution of the next searching step for a longest match.

119. The compression method of claim 117 in which said assigning step comprises providing the address signal held in said address register to said memory when said comparing step determines that the location of said memory addressed by said address signal contains the empty indicia signal, said address signal held in said address register when said comparing step detects said empty indicia signal providing the compressed code signal corresponding to said stored extended string.

120. The compression method of claim 113 in which said step of providing the code signal associated with said longest match comprises providing the code signal held in said code register when said comparing step determines that the addressed location in said memory contains the empty indicia signal.

121. The compression method of claim 120 in which said hashing step includes providing a further hash signal up to a predetermined number of hash signals when said comparing step determines that the location of said memory addressed by the address signal in said address register contains a value neither equal to the code signal held in said code register nor to the empty indicia signal.

122. The compression method of claim 121 further including the step of comparing said hash signals to said empty indicia signal, and in which said hashing step includes providing said further hash signal, up to said predetermined number of hash signals, when said hash signal comparing step determines that a provided hash signal is equal to said empty indicia signal.

123. The compression method of claim 121 in which said step of providing the code signal associated with said longest match includes providing the code signal held in said code register when none of the locations of said memory addressed by said predetermined number of hash signals contains a code signal equal to the code signal held in said code register or the empty indicia signal.

124. The compression method of claim 123 further including the step of transferring a data character signal from said character register to said code register, after execution of said providing step, to transform said data character signal into the compressed code signal corresponding thereto.

125. The compression method of claim 121 which
each data character signal comprises a B-bit byte signal,
each compressed code signal comprises a C-bit signal where B is less than C,
said empty indicia signal comprises a signal not greater than $2^B$ and not equal to any data character signal,
said compression method further including
comparing said hash signals to $2^B$, and in which
said hashing step includes providing said further hash signal, up to said predetermined number of hash signals, when said hash signal comparing step determines that a provided hash signal is not greater than $2^B$.

126. The compression method of claim 125 in which said character register comprises a B-bit register and said code register comprises a C-bit register, said method further including
transferring a data character signal from said character register to said code register to transform said data character signal into the compressed code signal corresponding thereto.

127. The compression method of claim 126 in which said step of transferring a data character signal from said character register to said code register comprises
transferring the B-bits held in said character register to the B-lower significant positions of said code register, and
zeroing the C-B most significant positions of said code register.

128. The compression method of claim 110 in which said hashing step includes providing said predetermined number of hash signals so that a code signal hashed with different character signals provides different hash signals, respectively, and, so that any two code signal-character signal tuples providing the same first hash signal will not provide the same second hash signal.

129. The compression method of claim 108 in which each location of said memory comprises a prefix code field and a string code field, and in which said step of storing a string of data character signals at a location in said memory comprises,
storing the code signal corresponding to the prefix string of the string stored at the location in the prefix code field of the location, and
storing the code signal of the string stored at the location in the string code field of the location.

130. The compression method of claim 129 in which said searching step includes hashing a data character signal with a code signal to provide a hash signal, said hash signal providing a potential address signal for accessing said memory.

131. The compression method of claim 130 in which said hashing step includes providing a predetermined number of hash signals in response to a code signal and a character signal, said predetermined number of hash signals providing potential address signals for accessing said memory.

132. The compression method of claim 131 further including the step of determining if all of said predetermined number of hash signals are unsuitable as address signals for accessing said memory.

133. The compression method of claim 130 further including the step of initializing said memory by storing in the string code fields of the locations of said memory an empty indicia signal representing that the location storing said empty indicia signal is empty, said empty indicia signal having a value not equal to any compressed code signal.

134. The compression method of claim 133 in which said searching step comprises
holding a data character signal in a character register,
holding a compressed code signal in a code register,
hashing the data character signal held in said character register and the compressed code signal held in said code register to provide a hash signal in accordance therewith,
holding an address signal in an address register, said address register being coupled to receive said hash signal and further coupled to access said memory at the location thereof corresponding to the address signal held in said address register,
comparing the contents of the prefix code field of a location of said memory addressed by said address register with the code signal held in said code register to determine equality therewith,
detecting when the contents of the string code field of a location of said memory addressed by said address register is equal to said empty indicia signal, and
transferring the contents of the string code field of a location of said memory addressed by the current address signal held in said address register to said code register and transferring a new data character signal into said character register when the contents of the prefix code field of the location of said memory accessed by said current address signal equals the code signal held in said code register.

135. The compression method of claim 134 further including entering a null string code signal into said code register for initiating a search for a longest match.

136. The compression method of claim 134 further including the step of transferring a data character signal from said character register to said code register to transform said data character signal into the compressed code signal corresponding thereto.

137. The compression method of claim 134 in which said initializing step comprises providing said empty indicia signal to said memory for entry into the string code field of the locations of said memory, and providing sequential address signals to said address register so as to enter said empty indicia signal into the string code fields of sequential locations of said memory.

138. The compression method of claim 134 in which said inserting step comprises generating numerically increasing code signals, inserting a code signal from said numerically increasing code signals and the code signal held in said code register into the string code field and prefix code field, respectively, of the location of said memory addressed by the address signal held in said address register when said detecting step determines, during execution of said searching step, that the location of said memory addressed by said address signal held in said address register contains said empty indicia signal.

139. The compression method of claim 135 further including the step of entering said null string code signal into said code register when said detecting step determines, during said searching step, that the string code field of the location of said memory addressed by the address signal held in said address register contains said empty indicia signal, thereby initiating said code register so as to begin a new search into said stream of data character signals with the character signal held in said character register.

140. The compression method of claim 138 in which said assigning step comprises said step of generating numerically increasing code signals for insertion into the string code field of the location of said memory addressed by said address register when said detecting step determines that said string code field of said addressed location contains said empty indicia signal.

141. The compression method of claim 134 in which said step of providing the code signal associated with said longest match comprises providing the code signal held in said code register when said detecting step determines, during execution of said searching step, that the string code field of the addressed location in said memory contains the empty indicia signal.

142. The compression method of claim 138 in which said step of providing the code signal associated with said longest match comprises providing the code signal held in said code register when said detecting step determines, during execution of said searching step, that the string code field of the addressed location in said memory contains the empty indicia signal.

143. The compression method of claim 142 in which said step of providing the code signal held in said code register comprises providing the code signal in bit serial fashion.

144. The compression method of claim 143 in which said step of providing the code signal in bit serial fashion includes the step of controlling the number of bits provided in accordance with a code signal from said numerically increasing code signals.

145. The compression method of claim 143 further including the step of entering a null string code signal into said code register for initiating a search for a longest match.

146. The compression method of claim 145 further including the step of comparing the code signal held in said code register with said null string code signal to determine equality therebetween and in which said step of providing the code signal associated with said longest match includes the step of providing the null string code signal followed by the data character signal in said character register when said detecting step determines that the string code field of the location addressed by the address register, during execution of said searching step, contains the empty indicia signal and said step of comparing the code signal in said code register with the null string code signal determines equality therebetween.

147. The compression method of claim 141 in which said hashing step includes providing a further hash signal up to a predetermined number of hash signals when, during execution of said searching step, said detecting step determines that the string code field of the location of said memory addressed by the address signal in said address register does not contain the empty indicia signal and said comparing step determines that the prefix code field of the location of said memory addressed by the address signal in said address register contains a value not equal to the code signal held in said code register.

148. The compression method of claim 147 in which said step of providing the code signal held in said code register includes providing the code signal held in said code register when the prefix code field and the string code field of none of the locations of said memory addressed by said predetermined number of hash signals contain a code signal equal to the code signal held in said code register and the empty indicia signal, respectively.

149. The compression method of claim 138 in which said initializing step comprises providing said empty indicia signal to said memory for entry into the string code field of the location of said memory addressed by the address signal held in said address register, and providing sequential address signals to said address register so as to enter said empty indicia signal into the string code fields of sequential locations of said memory.

150. The compression method of claim 149 in which said empty indicia signal comprises all zeros and said initializing step includes providing all zeros to the string code fields of the locations of said memory for initialization thereof.

151. The compression method of claim 135 in which said null string code signal comprises all zeros and said step of entering said null string code signal into said code register comprises zeroing said code register.

152. The compression method of claim 131 in which said hashing step includes providing said predetermined number of hash signals so that a code signal hashed with different character signals provides different hash signals, respectively, and, so that any two code signal-character signal tuples providing the same first hash signal will not provide the same second hash signal.

153. In the data compression and data decompression method of claim 107, a decompression method for recovering said stream of data character signals from said compressed stream of code signals, said decompression method comprising the steps of
receiving said stream of code signals
storing, in the locations of a memory strings of data character signals corresponding to said received code signals, respectively,
said locations being accessable by a plurality of address signals, respectively,
said received code signals providing address signals for accessing the locations of said memory storing the strings corresponding to said received code signals, respectively,
each said stored string of data character signals comprising a prefix string of data character signals and an extension character signal wherein said prefix string corresponds to a string stored in said memory,
each said location of said memory comprising a prefix code field and a character field,
a string being stored at a location by storing, in the prefix code field of the location, the code signal corresponding to the prefix string of the stored string and by storing, in the character field of the location, the extension character of the stored string,
extracting the data character signals from a string stored at a location of said memory addressed by a received code signal,
inserting in said memory an extended string comprising the code signal received prior to the last received code signal and an extension character signal comprising the last extracted data character signal in the string of data character signals extracted in response to said last received code signal,
assigning a code signal corresponding to said extended string, said assigned code signal providing an address signal for accessing a location of said memory at which to store said extended string, and
reversing said extracted string of data character signals,
thereby providing said recovered stream of data character signals.

154. The decompression method of claim 153 in which said receiving step includes holding a received code signal in a code register.

155. The decompression method of claim 154 in which said extracting step comprises
holding an address signal in an address register, said address register being coupled to receive the code signal held in said code register and further coupled to access said memory at the location thereof corresponding to the address signal held in said address register,
transferring, to said address register, the contents of the prefix code field of a location of said memory addressed by the current address signal held in said address register,
providing the contents of the character field of said location of said memory addressed by said current address signal held in said address register,
comparing the contents of the prefix code field transferred to said address register to determine when said contents of said prefix code field indicates the initial character of the string stored at the location addressed by the received code signal, and
performing said transferring and providing steps until the contents of prefix code field transferred to said address register indicates the initial character of the string stored at the location of said memory addressed by said received code signal.

156. The decompression method of claim 155 in which
said comparing step comprises determining when the contents of said prefix code field transferred to said address register contains a single character string code signal, and
said performing step comprises performing said transferring and providing steps until said comparing step determines that the contents of said prefix code field transferred to said address register is said single character string code signal.

157. The decompression method of claim 156 in which each said data character signal comprises a B-bit byte signal and each said single character string code signal is less than $2^B$, and in which
said comparing step comprising determining when the contents of said prefix code field transferred to said address register is less than $2^B$.

158. The decompression method of claim 155 in which
said comparing step comprises determining when the contents of said prefix code field transferred to said address register is a null string code signal, and
said performing step comprises performing said transferring and providing steps until said comparing step determines that the contents of said prefix code field transferred to said address register is said null string code signal.

159. The decompression method of claim 155 in which said inserting step comprises
holding said prior received code signal in a further code register,
holding said last extracted character signal in a last character holding means,
transferring said assigned code signal to said address register, and
inserting the code signal held in said further code register and the character signal held in said last character holding means into the prefix code field and character field, respectively, of the location of said memory addressed by said assigned code signal held in said address register.

160. The decompression method of claim 157 in which said inserting step comprises
holding said prior received code signal in a further code register,
holding, in a last character holding means, the contents of said prefix code field transferred to said address register when said comparing step determines that said contents of said prefix code field transferred to said address register is less than $2^B$,
transferring said assigned code signal to said address register, and
inserting the code signal held in said further code register and the character signal held in said last character holding means into the prefix code field and the character field, respectively, of the location of said memory addressed by said assigned code signal.

161. The decompression method of claim 158 in which said inserting step comprises
holding said prior received code signal in a further code register, holding in a last character holding means, the character signal provided during execution of said extracting step when said comparing step determines that the contents of said prefix code field transferred to said address register is said null string code signal, transferring said assigned code signal to said address register, and inserting the code signal held in said further code register and the character signal held in said last character holding means into the prefix code field and the character field, respectively, of the location of said memory addressed by said assigned code signal.

162. The decompression method of claim 159 in which said assigning step comprises hashing the character signal held in said last character holding means with the code signal held in said further code register to provide a hash signal, said hash signal providing a potential address signal for accessing said memory, said assigned code signal being provided by a hash signal suitable for accessing said memory.

163. The decompression method of claim 162 in which said hashing step includes providing a predetermined number of hash signals in response to said code signal held in said further code register and said character signal held in said last character holding means, said predetermined number of hash signals providing potential address signals for accessing said memory, said assigned code signal being provided by one of said predetermined number of hash signals suitable for accessing said memory.

164. The decompression method of claim 163 further including the step of initializing said memory by storing in the prefix code fields of the locations of said memory an empty indicia signal representing that the location storing said empty indicia signal is empty, said empty indicia signal having a value not equal to any compressed code signal.

165. The decompression method of claim 164 in which said initializing step comprises providing said empty indicia signal to said memory for entry into the prefix code fields of the locations of said memory, and providing sequential address signals to said address register so as to enter said empty indicia signal into the prefix code fields of sequential locations of said memory.

166. The method of claim 165 in which each data character signal comprises a B-bit byte signal, said empty indicia signal comprises a signal not greater than $2^B$ and not equal to any data character signal, said decompression method further including comparing said hash signals provided to said address register to $2^B$, and in which said hashing step includes providing said further hash signal, up to said predetermined number of hash signals, when said hash signal comparing step determines that a provided hash signal is not greater than $2^B$.

167. The decompression method of claim 163 in which said hashing step includes providing said predetermined number of hash signals so that a code signal hashed with different character signals provides different hash signals, respectively, and, so that any two code signal-character signal tuples providing the same first hash signal will not provide the same second hash signal.

168. The decompression method of claim 164 further including the step of detecting when the pefix code field of a location of said memory addressed by the address signal in said address register contains the empty indicia signal.

169. The decompression method of claim 168 in which said hashing step includes providing a further hash signal, up to said predetermined number of hash signals, when said detecting step determines that the prefix code field of the location of said memory addressed by a hash signal in said address register does not contain an empty indicia signal.

170. The decompression method of claim 168 in which said extracting step includes an abnormal case extracting step operative in response to said detecting step detecting the empty indicia signal in the prefix code field of a location of said memory addressed by the address signal in said address register provided by a received code signal in said code register, said abnormal case extracting step comprising providing the data character signal held in said last character holding means as the first data character signal extracted from the string corresponding to said received code signal, applying said prior received code signal held in said further code register to said address register, and extracting the data character signals remaining after said first data character signal in response to said prior received code signal.

171. The decompression method of claim 159 in which said assign step comprises generating numerically increasing code signals, said assigned code signal being provided by the current code signal from said numerically increasing code signals.

172. The decompression method of claim 171 in which said extracting step includes an abnormal case extracting step comprising comparing a received code signal in said code register with said current code signal from said numerically increasing code signals to determine when said received code signal is greater than said current code signal, providing the data character signal held in said last character holding means as the first data character signal extracted from the string corresponding to said received code signal, applying said prior received code signal held in said further code register to said address register, extracting the data character signals remaining after said first data character signal in response to said prior received code signal, and activating said abnormal case extracting step when said current code signal comparing step determines that said received code signal in said code register is greater than said current code signal from said numerically increasing code signals.

173. The decompression method of claim 171 in which said receiving step comprises receiving said code signals in bit serial fashion, and providing said bit serial received code signals to said code register.

174. The method of claim 173 which said receiving step further includes controlling the number of bits provided to said code register in accordance with said current code signal from said numerically increasing code signals.

175. The decompression method of claim 160 further including a single character string providing step comprising
  comparing a received code signal in said code register to $2^B$,
  transferring said received code signal from said code register to said last character holding means when said received code signal in said code register is not greater than $2^B$.

176. The decompression method of claim 161 in which each said data character signal comprises a B-bit byte signal and in which said decompression method further includes a new character providing step comprising
  comparing a received code signal in said code register to said null string code signal, and
  transferring the B-bit byte signal received during said receiving step following said received null string code signal to said last character holding means when said received code signal in said code register is said null string code signal.

177. The decompression method of claim 159 in which each location of said memory further includes a level field for storing a level signal representative of the number of data character signals comprising the prefix string of the string stored at the location and in which said reversing step comprises
  providing, to a character register, the data character signal from the character field of a location of said memory accessed during said extracting step in response to the current address signal held in said address register, and
  generating, in response to the level signal in the level field of said location accessed by said current address signal, a location address signal associated with said data character signal provided to said character register for positioning said data character signal in an output buffer so as to arrange said data character signals provided during said extracting step in an order reversed from that in which said data character signals are extracted from said memory.

178. The decompression method of claim 177 in which said location address generating step comprises
  holding a base address signal in a pointer register,
  adding the level signal from the level field of the location of said memory accessed by the current address signal in said address register to said base address signal in said pointer register to provide the location address signal for the data character signal provided from the character field of said location,
  holding the level signal from the level field of the currently accessed location of said memory in a first level register,
  incrementing the level signal in said first level register by unity, and
  saving the incremented level signal in a second level register for a subsequent insertion of an extended string into said memory.

179. The decompression method of claim 178 in which said location address generating step further includes the step of incrementing said base address signal in said pointer register by said level signal in said second level register.

180. The decompression method of claim 178 in which said inserting step further includes the step of inserting the level signal in said second level register into the level field of the location of said memory addressed by said assigned code signal held in said address register.

181. The method of claim 159 in which said reversing step comprises
  pushing said data character signals extracted during said extracting step into a push-down stack, and
  popping said data character signals from said stack to provide said data character signals in a reverse order from that in which said data character signals were extracted during said extracting step.

* * * * *

UNITED STATES PATENT AND TRADEMARK OFFICE
CERTIFICATE OF CORRECTION

PATENT : B1 4,558,302
DATED : January 4, 1994
INVENTOR(S) : Terry a. Welch

It is certified that error appears in the above-identified patent and that said Letters Patent is hereby corrected as shown below:

On the title page, the Assignee should read as follows:
--[73] Assignee: Unisys Corporation, Blue Bell, PA--.

Signed and Sealed this

Fifteenth Day of June, 1999

*Attest:*

Q. TODD DICKINSON

*Attesting Officer*   *Acting Commissioner of Patents and Trademarks*

REEXAMINATION CERTIFICATE (2177th)

United States Patent [19]

Welch

[11] B1 4,558,302
[45] Certificate Issued  Jan. 4, 1994

[54] HIGH SPEED DATA COMPRESSION AND DECOMPRESSION APPARATUS AND METHOD

[75] Inventor: Terry A. Welch, Concord, Mass.

[73] Assignee: Sperry Corporation; Great Neck, N.Y.

Reexamination Request:
No. 90/002,907, Dec. 14, 1992

Reexamination Certificate for:
Patent No.: 4,558,302
Issued: Dec. 10, 1985
Appl. No.: 505,638
Filed: Jun. 20, 1983

[51] Int. Cl.$^5$ .................... H03M 7/30; G06F 5/00
[52] U.S. Cl. ........................................ 341/51; 341/95
[58] Field of Search ................. 341/51, 65, 67, 95, 341/106

[56] References Cited

U.S. PATENT DOCUMENTS

| | | | |
|---|---|---|---|
| 3,914,747 | 10/1975 | Barnes et al. | 340/172.5 |
| 3,976,844 | 8/1976 | Betz | 179/15.55 R |
| 4,021,782 | 5/1977 | Hoerning | 341/51 |
| 4,038,652 | 7/1977 | Schippers | 341/67 |
| 4,054,951 | 10/1977 | Jackson et al. | 364/900 |
| 4,152,582 | 5/1979 | Schippers | 341/67 |
| 4,366,551 | 12/1982 | Holtz | 364/419 |
| 4,412,306 | 10/1983 | Moll | 364/900 |
| 4,463,422 | 7/1984 | Storer et al. | 364/300 |
| 4,491,934 | 1/1985 | Heinz | 364/900 |
| 4,814,746 | 3/1989 | Miller | 341/95 |

FOREIGN PATENT DOCUMENTS

| | | |
|---|---|---|
| 065665 | 4/1982 | European Pat. Off. |
| 0127815 | 6/1983 | European Pat. Off. |
| 101937/82 | 6/1982 | Japan |
| 19857/82 | 2/1992 | Japan |

OTHER PUBLICATIONS

IEEE Transactions on Information Theory, vol. IT-24, No. 5, Sep. 1978, New York, J. Ziv et al.: "Compression of Individual Sequences via Variable-Rate Coding", pp. 530–536.

IEEE Transactions On Information Theory, vol. IT-24, No. 4, Jul, 1978, NY, N.Y., J. Ziv et al. "Coding Theorems for Individual Sequences", 405–416.

J. B. Seery and J. Ziv, "A Universal Data Compression Algorithm-Description and Preliminary Results" Technical Memorandum; Mar. 23, 1977.

J. B. Seery and J. Ziv; "Further Results on Universal Data Compression"; Technical Memorandum; Jun. 20, 1978.

E. U. Cohler and J. E. Storer, "Functionally Parallel Architecture For Array Processors," pp. 28–36, IEEE Computer, vol. 14, No. 9, Sep. 1981.

J. Rissanen, "A Universal Data Compression System," IEEE Transactions on Information Theory, vol. IT-29, No. 5, Sep. 1983, pp. 656–664.

D. I. Dance et al., "An Adaptive on Line Data compression System," IEEE The Computer Journal; vol. 19, pp. 216–224 (Aug. 1976).

Ralston and Meek, Encyclopedia of Computer Sciences, pp. 604–606 (1976).

J. Ziv, "On Universal Quantization," IEEE Transactions on Information Theory, vol. IT-31, No. 3, May, 1985, pp. 344–347.

S. Even and M. Rodeh, "Economical Encoding of Commas Between Strings," Communications of the ACM, vol. 21, No. 4, Apr. 1978, pp. 315–317.

J. K. Gallant, "String Compression Algorithms," Ph.D. Dissertation, Dept. of Elec. Eng. and Computer Science, Princeton Univ. 1982.

D. A. Huffman, "A Method for the Construction of Minimum-Redundancy Codes," Proceedings of the I.R.E., Sep. 1952, pp. 1098–1101.

G. Pastrick, "Double-No-Triple Your Hard Disk Space With On-the Fly Data Compression", PC Magazine, Jan. 28, 1992, pp. 261–283.

"How compressed data travel faster-and cheaper", Bus. Week, Nov. 29, 1982, pp. 94D, 94H.

Knuth, Sorting and Searching: The Art of Computer Programming, pp. 506–549, vol. 3 (1973).

G. G. Langdon, Jr., "A Note on the Ziv–Lempel Model for Compressing Individual Sequences," IEEE Transactions on Information Theory, vol. IT-29, No. 2, Mar. 1983, pp. 284-287.

A. Lempel, G. Seroussi and J. Ziv, "On the Power of Straight-Line Computations in Finite Fields," IEEE Transactions on Information Theory, vol. IT-28, No. 6, pp. 875-880, (Nov. 1982).

A. Lempel and J. Ziv, "On the complexity of Finite Sequences," IEEE Transactions on Information Theory, vol. IT-22, No. 1, Jan. 1976, pp. 75-81.

A. Lempel and J. Ziv, "Compression of Two-Dimensional Data," IEEE Transactions on Information Theory, vol. IT-32, No. 1, Jan. 1986, pp. 2-8.

A. Lempel and J. Ziv, "Compression of Two-Dimensional Images," Combinatorial Algorithms on Words (ed. by A. Apostolico and Z. Galil). pp. 141-154 (1985).

Y. S. Miller and M. N. Wegman, "Variations on a Theme by Ziv and Lempel," Combinatorial Algorithms on words, (ed. by A. Apostolico and Z. Galil) pp. 131-140 (1985).

M. Rodeh, V. R. Pratt and S. Even, "Linear Algorithms for Data Compression via String Matching," Journal of the Association for Computing Machinery, vol. 28, No. 1, Jan. 1981, pp. 16-24.

J. A. Storer, Data Compression: Methods and Theory pp. 1-413 (1988).

J. A. Storer, "Data Compression: Methods and Complexity Issues", Ph.D. Dissertation, Dept. of Elec. Eng. and Computer Science, Princeton Univ. 1979.

J. A. Storer and T. G. Szymanski, "Data Compression via Textural Substitution" Journal of the Association for Computing Machinery, vol. 29, No. 4, Oct. 1982, pp. 928-951.

J. A. Storer and T. G. Szymanski, "The Macro Model for Data Compression/Extended Abstract", Tenth Annual ACM Symposium on Theory of Computing, pp. 30-39 (1978).

T. A. Welch, "A Technique for High-Performance Data Compression," IEEE Computer, Jun. 1984, pp. 8-19.

J. Ziv, "Coding Theorems for Individual Sequences," IEEE Transactions on Information Theory, vol. IT-24, No. 4, Jul. 1978, pp. 405-412.

M. Cohn, "Performance of Lempel-Ziv Compressors with Deferred Innovation," Technical Report TR-8-8-132, Apr., 1988, pp. 1-6.

M. Wells, "File Compression Using variable Length Encodings," The Computer Journal, vol. 15, No. 4, Nov. 1972, pp. 308-313.

M. J. Bianchi, J. J. Kato and D. J. Van Maren, "Data Compression in a Half-Inch Reel-to-Reel Tape Drive" Hewlett-Packard Journal, Jun. 1989.

G. Held and T. Marshall, Data Compression, "Techniques and Applications of Hardware and Software Considerations" (2d Ed) pp. 1-206 (1983, 1987).

*Primary Examiner*—Marc S. Roff

[57] ABSTRACT

A data compressor compresses an input stream of data character signals by storing in a string table strings of data character signals encountered in the input stream. The compressor searches the input stream to determine the longest match to a stored string. Each stored string comprises a prefix string and an extension character where the extension character is the last character in the string and the prefix string comprises all but the extension character. Each string has a code signal associated therewith and a string is stored in the string table by, at least implicitly, storing the code signal for the string, the code signal for the string prefix and the extension character. When the longest match between the input data character stream and the stored strings is determined, the code signal for the longest match is transmitted as the compressed code signal for the encountered string of characters and an extension string is stored in the string table. The prefix of the extended string is the longest match and the extension character of the extended string is the next input data character signal following the longest match. Searching through the string table and entering extended strings therein is effected by a limited search hashing procedure. Decompression is effected by a decompressor that receives the compressed code signals and generates a string table similar to that constructed by the compressor to effect lookup of received code signals so as to recover the data character signals comprising a stored string. The decompressor string table is updated by storing a string having a prefix in accordance with a prior received code signal and an extension character in accordance with the first character of the currently recovered string.

REEXAMINATION CERTIFICATE ISSUED UNDER 35 U.S.C. 307

THE PATENT IS HEREBY AMENDED AS INDICATED BELOW.

Matter enclosed in heavy brackets [ ] appeared in the patent, but has been deleted and is no longer a part of the patent; matter printed in italics indicates additions made to the patent.

AS A RESULT OF REEXAMINATION, IT HAS BEEN DETERMINED THAT:

The patentability of claims 1–181 is confirmed.

New claims 182–236 are added and determined to be patentable.

182. *The compression apparatus of claim 1, further including means for storing said strings of data character signals implicitly in said storage means.*

183. *The compression apparatus of claim 1, wherein said searching means includes means for accessing said strings of data character signals from said storage means using said associated code signals.*

184. *The compression apparatus of claim 2, wherein said stored strings of data character each signals identifies one of the prefix strings of data character signals which corresponds to another stored string of data character signals in said storage means.*

185. *The compression apparatus of claim 1, further including means for storing each of said stored strings of data character signals in said storage means at an address corresponding to the associated code signal for the data character signal.*

186. *The compression apparatus of claim 1, wherein said means for searching includes means for searching for a next longest match beginning with said next data character signal following the determination of said longest match.*

187. *The compression apparatus of claim 1, further including means for storing in said storage means, prior to the provision of a compressed data stream, a plurality of predetermined strings with respective assigned code signals.*

188. *The compression apparatus of claim 187, wherein said predetermined strings include single data characters.*

189. *The compression apparatus of claim 188, wherein said strings of single data characters correspond to individual characters in an alphabet of data characters each having a predetermined character value.*

190. *The compression apparatus of claim 189, wherein said preassigned code signals for said single data character strings are based on their respective character values in said alphabet.*

191. *The compression apparatus of claim 190, wherein said character values are chosen based on ASCII coding.*

192. *The compression apparatus of claims 1, 182, 183, 184, 185 or 190, wherein each said code signal has a fixed predetermined length.*

193. *The compression apparatus of claims 1, 182, 183, 184, 185 or 190, wherein said compression apparatus includes means for varying the operation of said compression apparatus.*

194. *The compression apparatus of claim 193, wherein said varying means includes rate means for controlling the rate of compression of said compression apparatus.*

195. *The compression apparatus of claim 194, wherein said rate means includes*

*means for delaying input of said data character signals in said input stream, thereby slowing down said compression apparatus.*

196. *The compression apparatus of claim 193, wherein said varying means includes means for limiting the maximum length allowed for said longest match.*

197. *The compression apparatus of claim 1, wherein said compression apparatus only executes a single pass through said stream of data character signals.*

198. *The compression apparatus of claims 1, 182, 183, 184, 185 or 190, wherein said extended string is inserted into said storage means before searching for the next longest match.*

199. *The compression apparatus of claims 1, 182, 183, 184, 185 or 190, wherein said means for assigning said code signals includes*

*ordering means for assigning said code signals in ascending order.*

200. *The compression apparatus of claim 2, wherein said searching means includes means responsive to said string code signals and to said data character signals for combining a data character signal with a code signal to provide an address signal for accessing said memory means.*

201. *The compression apparatus of claim 1 wherein said means for searching includes*

*means for performing consecutive parsing on said stream of data character signals and said strings of data character signals stored in said storage means, and*

*means for terminating said parsing means in response to the determination of said longest match.*

202. *The compression apparatus of claim 1, further comprising means for including uncompressed data character signals in said compressed stream of code signals.*

203. *The decompression apparatus of claim 65, wherein said means for extracting includes*

*control means for iteratively accessing strings stored in said memory means in accordance with the code signals stored in said prefix code field on the accessed strings, beginning with the string stored at the location of said memory means addressed by said received code signal, and*

*means for extracting the data character signals said memory means until the contents of said prefix code field indicates the initial character of the string stored at the location of said memory means addressed by said received code signal.*

204. *The compression apparatus of claim 1 wherein said means for assigning includes means for generating code signals of increasing length as the number of strings stored in said storage means increases.*

205. *The decompression apparatus of claim 64, wherein each data character signal of said stream of data character signals represents a data character from an alphabet of data characters, said alphabet comprising a plurality of distinct data characters, said decompression apparatus further including*

*initializing means for storing in said memory means, prior to receipt of a stream of code signals, distinct data characters of said alphabet.*

206. *The decompression apparatus of claim 63, wherein said decompression apparatus includes*

*means for obtaining lossless recovery of said stream of data character signals solely in response to said compressed stream of code signals.*

207. *In the data compression and data decompression system of claims 1, 182, 183, 184, 185 or 190, decompression apparatus for recovering said stream of data character* signals from said compressed stream of code signals, wherein said decompression apparatus includes decompression storage means, responsive to said compressed stream of code signals, for storing strings in said decompression storage means in a manner similar to the storage of strings in said storage means of said compression apparatus during compression, and recovery means for accessing strings from said decompression storage means in response to code signals in said compressed stream for providing a recovered stream of data character signals.

208. The decompression apparatus of claim 207, further including means for creating a new string for storing in said decompression storage means for appending the first character of the string corresponding to the most recently received code signal to the previous code signal.

209. The decompression apparatus of claim 208, further including means for accessing said stored strings using code signals from said compressed stream of received code signals.

210. The decompression apparatus of claim 209, wherein a stored string in said decompression storage means identifies a prefix string, and wherein said prefix string identifies another string stored in said decompression storage means.

211. The decompression apparatus of claim 210, wherein said recovery means includes means for interatively accessing strings from said decompression storage means using the identified prefix in a stored string to indicate the next stored string to be accessed.

212. The decompression apparatus of claim 210, wherein a stored string in said decompression storage means additionally identifies an extension character which when added to the identified prefix string represents the stored string.

213. The decompression apparatus of claim 211, wherein said means for iteratively accessing uses said extension characters in the accessed strings for providing said recovered stream of data character signals.

214. In the data compression and data decompression system of claim 208, decompression apparatus for recovering said stream of data character signals from said compressed stream of code signals, wherein said apparatus includes decompression storage means, responsive to said compressed stream, for storing strings in said decompression storage means in a manner corresponding to the storage of strings in the storage means of said compression apparatus during compression, and recovery means for accessing strings from said decompression storage means in response to code signals, in said compressed stream for providing a recovered stream of data character signals, wherein said decompression apparatus includes means for providing, prior to decompression, a plurality of predetermined strings with respective preassigned codes corresponding to those provided by said compression apparatus.

215. The method of claim 107 wherein the searching step includes the substep of combining a data character signal with a code signal to provide an address signal for accessing said memory.

216. The method of claim 107, including the step of addressing a string stored in said memory using its assigned code signal.

217. The method of claim 107, further including the step of providing a plurality of predetermined strings having respective preassigned code signals prior to compression of said stream of data character signals.

218. The method of claim 217, wherein said predetermined strings include single data characters corresponding to data character signals which may appear in said stream of data character signals.

219. The method of claim 218, wherein said single data characters correspond to individual data characters in an alaphabet of data characters, wherein each data character in the alaphabet has a predetermined character value.

220. The method of claim 219, wherein said character values are chosen based on ASCII coding.

221. The method of claims 107, 216, 217 or 218, wherein said code signals have a fixed predetermined length.

222. The method of claim 107, 216, 217 or 218 further including the step of varying the compression operation.

223. The method of claim 222, wherein the step of varying the compression operation includes the step of controlling the rate of compression.

224. The method of claim 222, wherein the step of varying the compression operation includes the step of limiting the maximum length allowed for said longest match.

225. The method of claim 222, wherein the step of varying the compression operation includes the step of delaying input of said data signals in said data shown to slow down compression.

226. The method of claim 222, wherein the step of varying the compression operation includes the step of limiting the length of said longest match to a predetermined maximum length.

227. The method of claim 107, wherein said method compresses each string of said stream of data character signals in a single pass.

228. The method of claim 107, 216, 217, or 218, including the step of assigning said code signals in ascending order.

229. The method of claims 107, 216, 217, or 218, wherein the step of inserting the extended string into said storage means occurs before the step of searching for a next longest match.

230. The method of claims 107, 216 or 220, further including the step of recovering said stream of data character signals from said compressed stream of code signals, wherein said recovering stem includes the substeps of inserting strings in a decompression memory in response to code signals in said compressed stream in a manner corresponding to the insertion of strings into the compression memory during compression, and accessing strings from said decompression memory in response to code signals in said compressed stream of code signals.

231. The method of claim 230, wherein the step of inserting includes the substep of appending the first character of the string corresponding to the most recently received code signal to the previous code signal.

232. The method of claims 107, 217, 218, 219 or 220, further including the step of recovering said stream of data character signals from said compressed stream of code signals, wherein the recovering step includes the substeps of inserting strings in a decompression memory in response to code signals in said compressed stream in a manner corresponding to the insertion of strings into the compression memory during compression, and accessing strings from said decompression memory in response to code signals in said compressed stream of code signals, and wherein said method also includes the step of providing, prior to compression, a plurality of predetermined strings with respective preassigned codes corresponding to those provided by said compression method.

233. The method of claim 107 wherein said searching step comprises the substeps of
performing consecutively parsing said stream of data character signals and said strings of data character signals stored in said memory, and
terminating parsing in response to a determination of said longest match.

234. The method of claim 107 further comprising the step of including uncompressed data character signals in said compressed stream of code signals.

235. The method of claim 153 wherein said extracting step includes the substeps of
iteratively accessing strings stored in said memory in accordance with the code signals stored in said prefix code field of the accessed strings, beginning with the string stored at the location of said memory addressed by said received code signal, and
extracting the data character signals from the accessed strings until the contents of said prefix code field indicates the initial character of the string stored at the location of said memory addressed by said received code signal.

236. The compression method of claim 107 wherein said assigning step includes the substep of
generating code signals of increasing length as the number of strings stored in said memory increases.

* * * * *